US00RE46272E

(19) United States
(12) Reissued Patent
Nii

(10) Patent Number: US RE46,272 E
(45) Date of Reissued Patent: *Jan. 10, 2017

(54) SEMICONDUCTOR MEMORY

(71) Applicant: RENESAS ELECTRONICS CORPORATION, Kawasak-shi (JP)

(72) Inventor: Koji Nii, Tokyo (JP)

(73) Assignee: RENESAS ELECTRONICS CORPORATION, Kawasaki-shi (JP)

( * ) Notice: This patent is subject to a terminal disclaimer.

(21) Appl. No.: 13/863,011

(22) Filed: Apr. 15, 2013

Related U.S. Patent Documents

Reissue of:
(64) Patent No.: 6,643,167
Issued: Nov. 4, 2003
Appl. No.: 10/350,221
Filed: Jan. 24, 2003

U.S. Applications:
(63) Continuation of application No. 12/846,450, filed on Jul. 29, 2010, now Pat. No. Re. 44,242, which is a continuation of application No. 11/265,744, filed on Nov. 3, 2005, now Pat. No. Re. 41,638, which is an application for the reissue of Pat. No. 6,643,167,
(Continued)

(30) Foreign Application Priority Data

Dec. 6, 2000 (JP) ..... 2000-371153

(51) Int. Cl.
*G11C 11/00* (2006.01)
*H01L 27/085* (2006.01)

(52) U.S. Cl.
CPC ..... *H01L 27/085* (2013.01)

(58) Field of Classification Search
USPC ..... 365/154, 230.05, 181, 156, 226, 51
See application file for complete search history.

(56) References Cited

U.S. PATENT DOCUMENTS 5,072,286 A 12/1991 Minami et al.
5,287,323 A * 2/1994 Takahashi et al. ..... 365/230.05
(Continued)

FOREIGN PATENT DOCUMENTS

EP 0 578 915 A2 1/1994
JP 2-150062 6/1990
(Continued)

OTHER PUBLICATIONS

Office Action issued Dec. 7, 2010 in JP Application No. 2001-296178 (With Partial English Translation).
(Continued)

*Primary Examiner* — Angela M Lie
(74) *Attorney, Agent, or Firm* — Oblon, McClelland, Maier & Neustadt, L.L.P.

(57) ABSTRACT

A semiconductor memory having a memory cell structure capable of reducing soft error without complicating a circuit configuration. Specifically, an inverter (I1) consists of a NMOS transistor (N1) and a PMOS transistor (P1), and an inverter (I2) consists of a NMOS transistor (N2) and a PMOS transistor (P2). The inverters (I1, I2) are subjected to cross section. The NMOS transistor (N1) is formed within a P well region (PW0), and the NMOS transistor (N2) is formed within a P well region (PW1). The P well regions (PW0, PW1) are oppositely disposed with an N well region (NW) interposed therebetween.

12 Claims, 37 Drawing Sheets

Related U.S. Application Data which is a continuation of application No. 09/900,917, filed on Jul. 10, 2001, now Pat. No. 6,529,401.

(56) References Cited

U.S. PATENT DOCUMENTS

| | | | | |
|---|---|---|---|---|
| 5,338,963 | A | 8/1994 | Klaasen et al. | |
| 5,744,844 | A | 4/1998 | Higuchi | |
| 5,905,290 | A | 5/1999 | Houston | |
| 5,930,163 | A | 7/1999 | Hara et al. | |
| 5,966,317 | A | 10/1999 | O'Connor | |
| 6,005,797 | A | 12/1999 | Porter et al. | |
| 6,111,780 | A | 8/2000 | Bertin | |
| 6,271,568 | B1 | 8/2001 | Woodruff et al. | |
| 6,288,969 | B1 | 9/2001 | Gibbins et al. | |
| 6,529,401 | B2 * | 3/2003 | Nii | 365/154 |
| 6,677,649 | B2 | 1/2004 | Osada et al. | |
| RE41,638 | E * | 9/2010 | Nii | 365/154 |
| RE44,242 | E * | 5/2013 | Nii | 365/154 |

FOREIGN PATENT DOCUMENTS

| | | |
|---|---|---|
| JP | 6-97393 | 4/1994 |
| JP | 7-7089 | 1/1995 |
| JP | 07-130877 | 5/1995 |
| JP | 8-273360 | 10/1996 |
| JP | 2589949 | 12/1996 |
| JP | 9-7373 | 1/1997 |
| JP | 9-270468 | 10/1997 |
| JP | 10-178110 | 6/1998 |
| JP | 2000-150651 | 5/2000 |
| JP | 2000-236029 | 8/2000 |
| JP | 2000-243858 | 9/2000 |

OTHER PUBLICATIONS

Japan Office Action issued Apr. 1, 2014, in Japan Patent Application No. 2013-093581 (with English translation).

* cited by examiner

F I G . 3 7 PRIOR ART
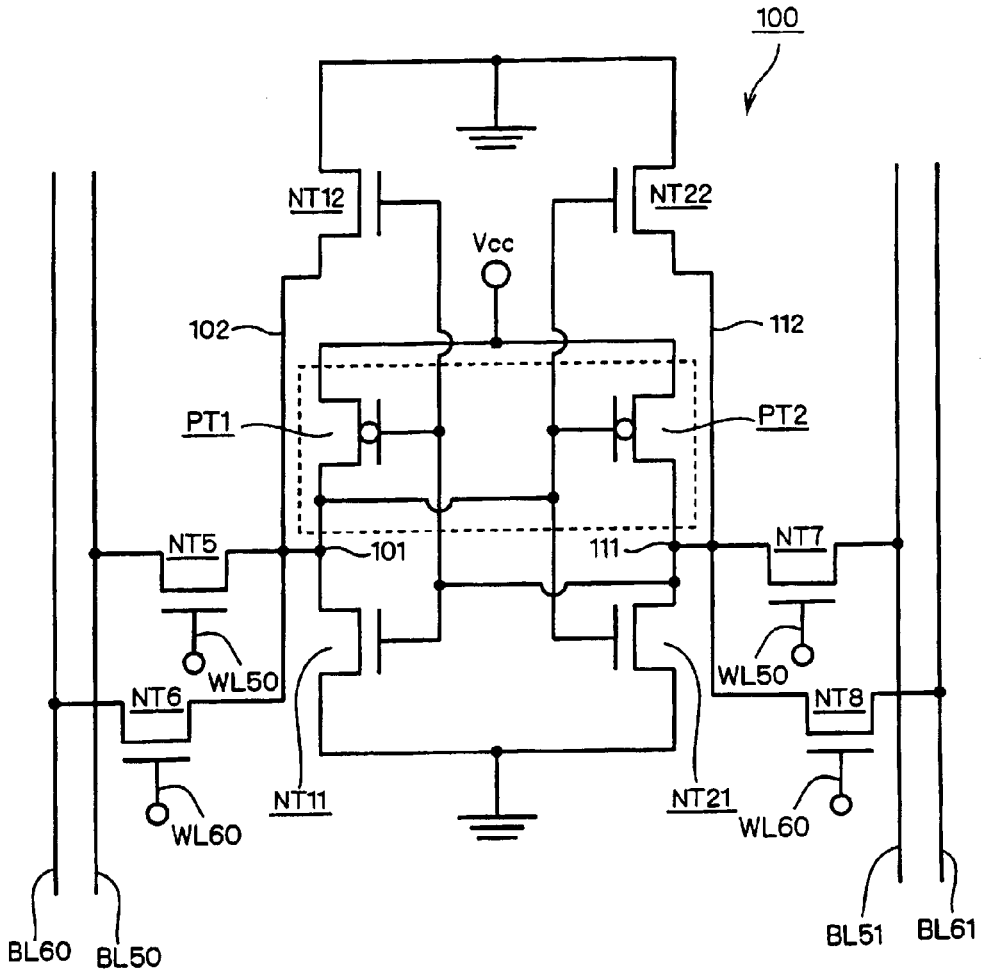

SEMICONDUCTOR MEMORY

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

*Notice: More than one reissue application has been filed for the reissue of U.S. Pat. No. 6,643,167. The reissue applications that have been filed for the reissue of U.S. Pat. No. 6,643,167 include parent reissue application Ser. No. 11/265,744 filed on Nov. 3, 2005, and reissue application Ser. No. 12/846,450 filed Jul. 29, 2010, and the present reissue application Ser. No. 13/863,011 filed Apr. 15, 2013 which is a continuation of the parent reissue application.*

BACKGROUND OF THE INVENTION

1. Field of the Invention

The present invention relates to a semiconductor memory and, in particular, to a memory cell structure having improvements in resistance to soft error of a MOS static RAM.

2. Description of the Background Art

As the miniaturization of memory cells proceeds, the following soft error problem becomes noticeable. Specifically, the data stored in a storage node is inverted due to electrons generated from alpha rays released from a package and neutron beams from outer space. Particularly, as power supply voltage is lowered, malfunction becomes more significant. Attempts to reduce soft error are being pursued.

FIG. 37 is a circuit diagram illustrating a structure equivalent to a SRAM memory cell disclosed in, for example, Japanese Patent No. 2589949. As shown in FIG. 37, a memory cell 100 is made up of PMOS transistors PT1 and PT2, and NMOS transistors NT5 to NT8, NT11, NT12, NT21 and NT22.

The sources of the PMOS transistors PT1 and PT2 are both connected to a power supply voltage $V_{cc}$. The drain of the PMOS transistor PT1 is connected through a node 101 to the gate of the PMOS transistor PT2 and to the gates of the NMOS transistors NT21 and NT22. The drain of the PMOS transistor PT2 is connected through a node 111 to the gate of the PMOS transistor PT1 and to the gates of the NMOS transistors NT11 and NT12.

The sources of the NMOS transistors NT11 and NT12 are both grounded. The drain of the NMOS transistor NT11 is connected through the node 101 to the drain of the PMOS transistor PT1. The drain of the NMOS transistor NT12 is connected through the nodes 101 and 102 to the drain of the PMOS transistor PT1.

The sources of the NMOS transistors NT21 and NT22 are both grounded. The drain of the NMOS transistor NT21 is connected through the node 111 to the drain of the PMOS transistor PT2. The drain of the NMOS transistor NT22 is connected through the nodes 111 and 112 to the drain of the PMOS transistor PT2.

The NMOS transistor NT5 is interposed between a bit line BL50 and the node 101, and its gate is connected to a word line WL50. The NMOS transistor NT6 is interposed between a bit line BL60 and the node 101, and its gate is connected to a word line WL60. The NMOS transistor NT7 is interposed between a bit line BL51 and the node 111, and its gate is connected to the word line WL50. The NMOS transistor NT8 is interposed between a bit line BL61 and the node 111, and its gate is connected to the word line WL60.

In such a configuration, the word line WL50 or WL60 is brought into the active state and the NMOS transistors NT5 and NT6, or the NMOS transistors NT6 and NT8 are brought into the on state, thereby to provide access to the nodes 101 and 111, each being a storage node. This enables to obtain the data from the paired bit lines BL50 and BL51 or the paired bit lines BL60 and BL61.

In this configuration, a NMOS driver transistor that is usually made up of a single NMOS transistor is divided into two NMOS transistors (which is divided into the NMOS transistors NT11 and NT12, and NT21 and NT22).

In order to divide the storage node serving as the drain of the PMOS transistor PT1 (PT2) into the node 101 (111) and the node 102 (112), the NMOS transistor NT11 (NT21) and the NMOS transistor NT12 (NT22) are oppositely disposed so as to interpose therebetween an N well region where the PMOS transistor PT1 is to be formed.

Therefore, the N well region prevents that a depletion region on the opposite side of the N well region is adversely affected by electrons or holes generated from energy particles colliding with one side of the N well region. This enables to lower incidence of soft error.

However, even with the foregoing SRAM memory cell, a reduction in soft error is insufficient. Further, there is the problem that the circuit configuration is complicated by using two driver transistors, although it can be generally configured by using one.

SUMMARY OF THE INVENTION

According to a first aspect of the invention, a semiconductor memory having a memory cell containing first and second inverters subjected to cross connection, a first conductivity type being defined by first kind, and a second conductivity type being defined by second kind, is characterized in that: the first inverter consists of a first field effect transistor of the first kind and a first field effect transistor of the second kind; that the second inverter consists of a second field effect transistor of the first kind and a second field effect transistor of the second kind; and that the first and second field effect transistors of the first kind are disposed in separate first and second well regions of the second kind, respectively.

According to a second aspect of the invention, the semiconductor memory of the first aspect is characterized in that: an output part of the first inverter includes a connecting part between one electrode of the first field effect transistor of the first kind and one electrode of the first field effect transistor of the second kind, an input part thereof includes a connecting part between a control electrode of the first field effect transistor of the first kind and a control electrode of the first field effect transistor of the second kind; an output part of the second inverter includes a connecting part between one electrode of the second field effect transistor of the first kind and one electrode of the second field effect transistor of the second kind, and an input part thereof includes a connecting part between a control electrode of the second field effect transistor of the first kind and a control electrode of the second field effect transistor of the second kind; that the memory cell further includes: (i) a third field effect transistor of the first kind, one electrode of which is connected to a first storage terminal electrically connected to the output part of the first inverter and the input part of the second inverter, and the other electrode of which is connected to a first bit line, and a control electrode of which is connected to a word line; and (ii) a fourth field effect transistor of the first kind, one electrode of which is connected to a second storage terminal electrically connected to the output part of the second inverter and the input part of the first inverter, and the other electrode of which is connected to a second bit line, and a control electrode of which is connected to a word line; and that the third and fourth field effect transistors of the first kind are disposed in second and first well regions of the second kind, respectively.

According to a third aspect of the invention, the semiconductor memory of the second aspect is characterized in that the respective one electrodes in the first to fourth field effect transistors of the first kind are disposed separately.

According to a fourth aspect of the invention, the semiconductor memory of the second aspect is characterized in that: the first and third field effect transistors of the first kind and the first field effect transistor of the second kind are arranged in an approximately straight line along the direction of formation of the word line; and that the second and fourth field effect transistors of the first kind and the second field effect transistor of the second kind are arranged in an approximately straight line along the direction of formation of the word line.

According to a fifth aspect of the invention, the semiconductor memory of the first aspect is characterized in that the first and second field effect transistors of the first kind are arranged so as to be point symmetry with respect to the central point of the memory cell.

According to a sixth aspect of the invention, the semiconductor memory of the second aspect is characterized in that the third and fourth field effect transistors of the first kind are arranged so as to be point symmetry with respect to the central point of the memory cell.

According to a seventh aspect of the invention, the semiconductor memory of the second aspect is characterized in that the width of the control electrode of the first and second field effect transistors of the first kind is set so as to be larger than the width of the control electrode of the third and fourth field effect transistors of the first kind.

According to an eighth aspect of the invention, the semiconductor memory of one of the foregoing aspects is characterized in that the memory cell further includes (i) a first resistance component interposed between the input part of the first inverter and the second storage terminal, and (ii) a second resistance component interposed between the input part of the second inverter and the first storage terminal.

According to a ninth aspect of the invention, the semiconductor memory of the eighth aspect is characterized in that the first and second resistance components include a high resistance metal wiring formed from a metal material having a higher resistivity than CoSi.

According to a tenth aspect of the invention, the semiconductor memory of the eighth aspect is characterized in that the first and second resistance components include a high resistance polysilicon wiring formed from polysilicon having a higher resistivity than CoSi.

According to an eleventh aspect of the invention, the semiconductor memory of the second aspect is characterized in that the control electrodes of the third and fourth field effect transistors of the first kind and the word line are formed by using a single polysilicon.

According to a twelfth aspect of the invention, the semiconductor memory of the second aspect is characterized in that: the word line includes separate first and second word lines; that the control electrode of the third field effect transistor of the first kind is connected to the first word line; and that the control electrode of the fourth field effect transistor of the first kind is connected to the second word line.

According to a thirteenth aspect of the invention, the semiconductor memory of the twelfth aspect is characterized in that: the first bit line includes first and second partial bit lines forming a pair of bit lines; that the second bit line includes third and fourth partial bit lines forming a pair of bit lines; that the third field effect transistor of the first kind includes fifth and sixth field effect transistors of the first kind, the fifth field effect transistor of the first kind being interposed between the first partial bit line and the second storage terminal, the sixth field effect transistor of the first kind being interposed between the second partial bit line and the first storage terminal; and that the fourth field effect transistor of the first kind includes seventh and eighth field effect transistors of the first kind, the seventh field effect transistor of the first kind being interposed between the third partial bit line and the first storage terminal, the eighth field effect transistor of the first kind being interposed between the fourth partial bit line and the second storage terminal.

According to a fourteenth aspect of the invention, the semiconductor memory of the thirteenth aspect is characterized in that the width of the control electrode of the first and second field effect transistors of the first kind is set so as to be larger than the width of the control electrode of the fifth to eighth field effect transistors of the first kind.

According to a fifteenth aspect of the invention, the semiconductor memory of the second, twelfth or thirteenth aspect is characterized in that a region for forming the control electrode of the first and second field effect transistors of the first kind is disposed so as to form a portion of the second and first storage terminals, respectively.

According to a sixteenth aspect of the invention, the semiconductor memory of one of the foregoing aspects is characterized in that: the first and second field effect transistors of the second kind are disposed in a well region of the first kind; and that the well region of the first kind is disposed between the first and second well regions of the second kind.

In the semiconductor memory of the first aspect, the first and second field effect transistors of the first kind are disposed in the separate first and second well region of the second kind, respectively. Therefore, if carriers generated from alpha rays, etc. are collected into one or the other electrode region of one of the first and second field effect transistor of the first kind, such carriers are cancelled by being released from one or the other electrode region of the other of the first and second field effect transistor of the first kind on which no influence of the carriers is exerted. This enables to increase resistance to soft error.

In addition, since the first and second inverters each consists of a combination of a field effect transistor of the first kind and that of the second kind, a complementary type can be realized by at least sufficient circuit configuration.

In the semiconductor memory of the second aspect, the third and fourth field effect transistors of the first kind are disposed in the second and first well regions of the second kind, respectively. Thereby, the memory cell selecting operation by means of the word line, and the write/read operation to the memory cell via the first and second bit lines, are executable while improving resistance to soft error.

In the semiconductor memory of the third aspect, resistance to soft error can be increased by separately forming one electrode to be connected to the first or second storage terminal in the first to fourth field effect transistors of the first kind.

In the semiconductor memory of the fourth aspect, the degree of integration can be increased by virtue of the layout of the first to fourth field effect transistors of the first kind and the first and second field effect transistors of the second kind.

In the semiconductor memory of the fifth aspect, by disposing the first and second MOS transistors so as to be point symmetry with respect to the central portion of the memory cell, arrangement between adjacent memory cells can be facilitated to increase the degree of integration.

In the semiconductor memory of the sixth aspect, by disposing the third and fourth MOS transistors so as to be point symmetry with respect to the central portion of the memory cell, arrangement between adjacent memory cells can be facilitated to increase the degree of integration.

In the semiconductor memory of the seventh aspect, the stability of the memory cell can be increased by setting such that the control electrode width of the first and second field effect transistors of the first kind is larger than that of the third and fourth field effect transistors of the first kind.

In the semiconductor memory of the eighth aspect, by signal propagation delay due to the first and second resistance components, the response characteristic for inverting the data held in the first and second storage terminals of the memory cell can be elongated, thereby soft error is hard to occur.

The semiconductor memory of the ninth aspect realizes the first and second resistance components by using the high resistance polysilicon wiring.

The semiconductor memory of the tenth aspect realizes the first and second resistance components by using the high resistance polysilicon wiring.

In the semiconductor memory of the eleventh aspect, by using a single polysilicon common to the control electrodes and word lines of the third and fourth MOS transistors, the number of layers to be formed can be reduced, thereby allowing for a reduction in the cost of the semiconductor memory.

In the semiconductor memory of the twelfth aspect, by the presence of two memory cell selecting means composed of the first and second word lines, the memory cell can be used for FIFO memory.

The semiconductor memory of the thirteenth aspect realizes a two-port memory cell composed of the first to fourth partial bit lines and the first and second word lines.

In the semiconductor memory of the fourteenth aspect, the stability of the memory cell can be increased by setting such that the control electrode width of the first and second field effect transistors of the first kind is larger than that of the fifth to eighth field effect transistors of the first kind.

In the semiconductor memory of the fifteenth aspect, with the arrangement such that the region for forming the control electrode of the first and second field effect transistors of the first kind forms a portion of the second and first storage terminals, respectively, the region for forming memory cell can be narrowed to increase the degree of integration.

In the semiconductor memory of the sixteenth aspect, by the well region of the first kind disposed between the first and second well regions of the second kind, it is avoided that carriers generated in the first or second well region of the second kind exert influence on the other well region of the second kind.

It is an object of the present invention to overcome the foregoing problem by providing a semiconductor memory having a memory cell structure capable of reducing soft error without complicating a circuit configuration.

These and other objects, features, aspects and advantages of the present invention will become more apparent from the following detailed description of the present invention when taken in conjunction with the accompanying drawings.

BRIEF DESCRIPTION OF THE DRAWINGS

FIG. 37 is a circuit diagram illustrating a conventional SRAM memory cell.

DESCRIPTION OF THE PREFERRED EMBODIMENTS

First Preferred Embodiment

Figure 1:
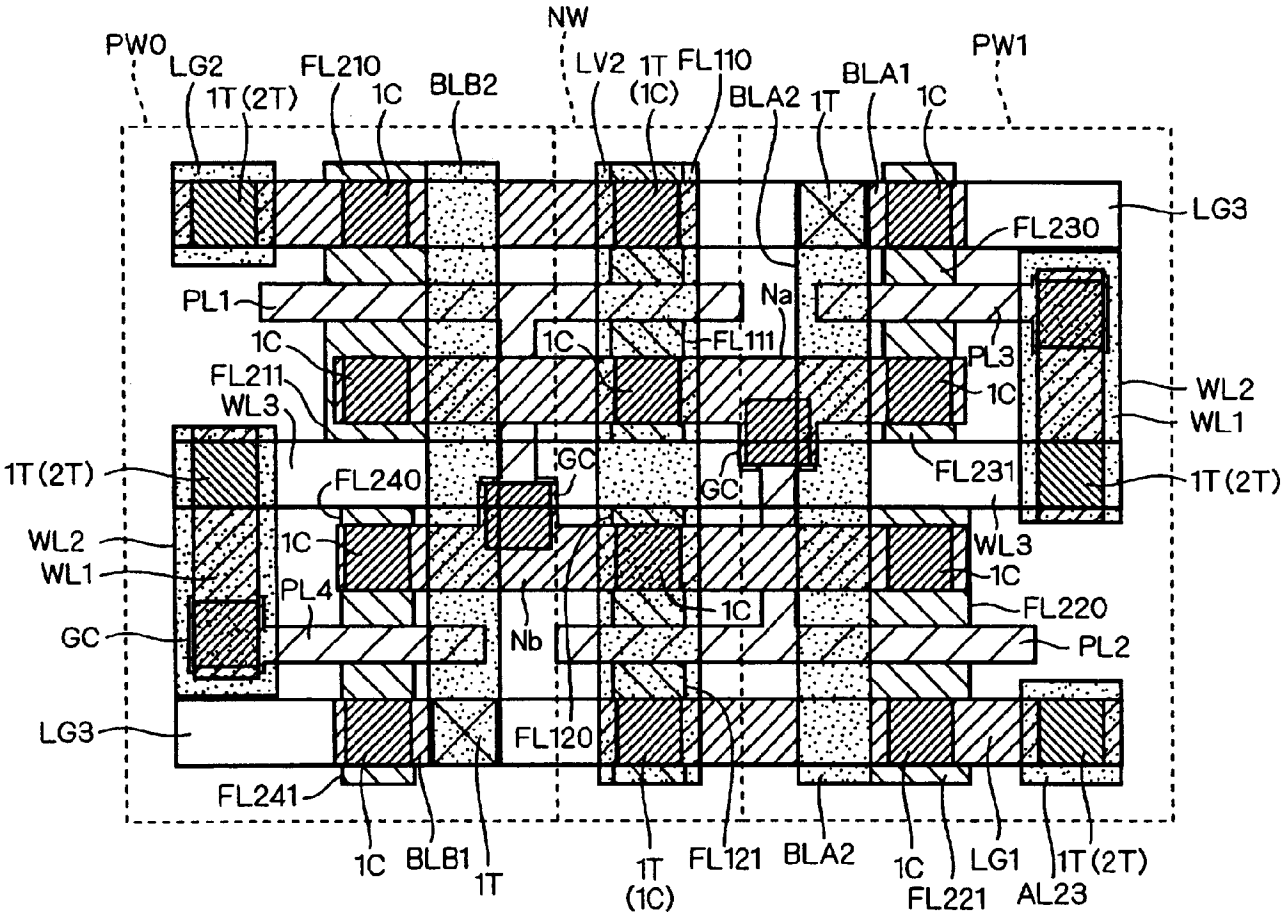
FIG. 1 is an explanatory diagram viewed from above the layout configuration in all layers of a SRAM memory cell according to a first preferred embodiment of the invention.
Figure 2:
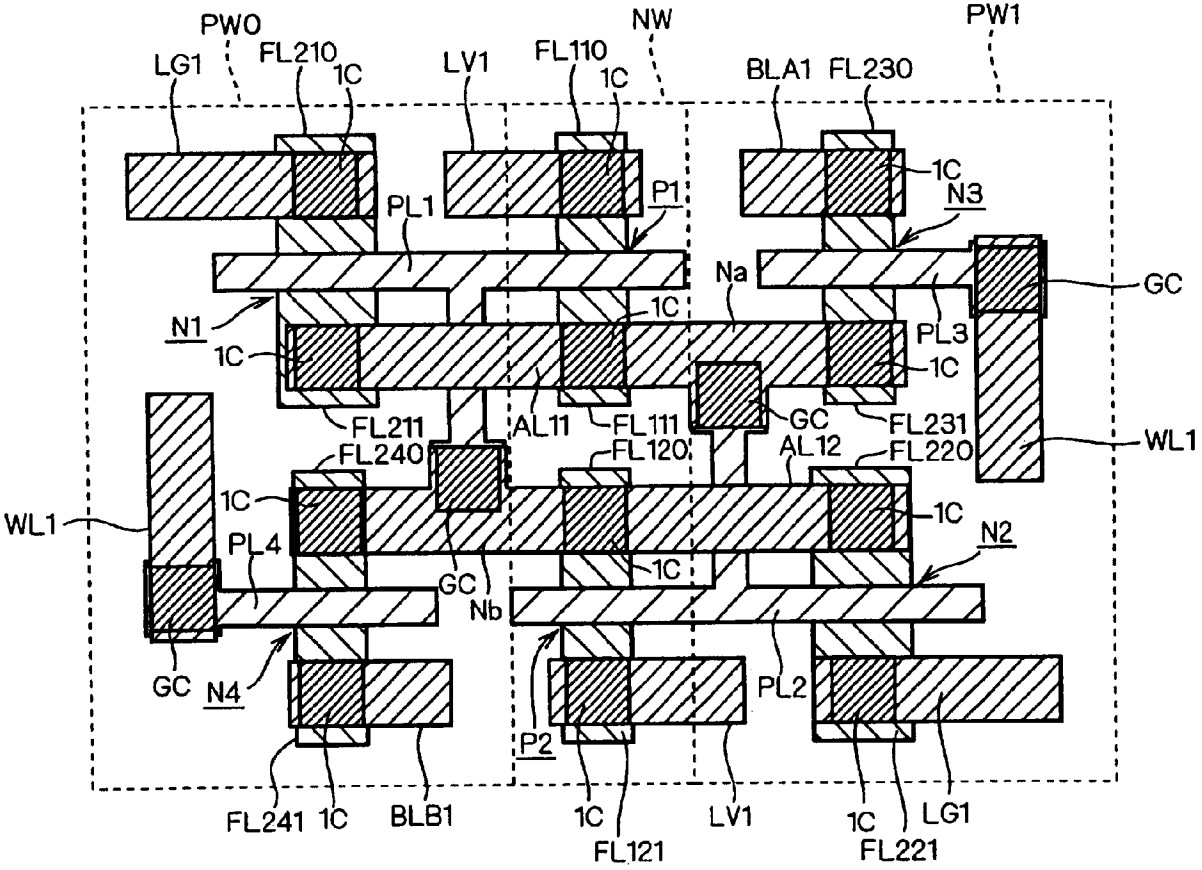
FIG. 2 is an explanatory diagram viewed from above mainly the layout configuration beneath a first aluminum wiring layer in FIG. 1.
Figure 3:
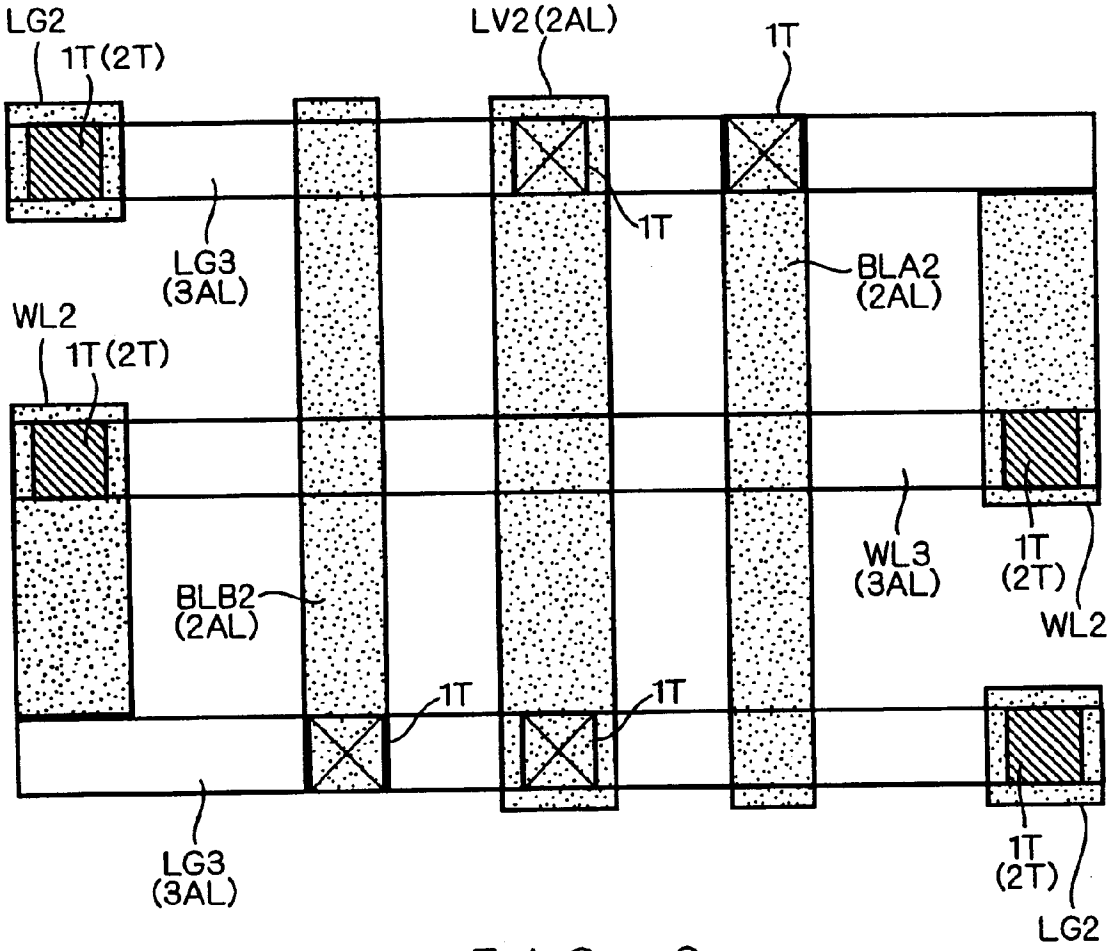
FIG. 3 is an explanatory diagram viewed from above mainly the layout configuration over a second aluminum wiring layer in FIG. 1.

FIGS. 1 to 4 are diagrams illustrating a memory cell structure of a SRAM according to a first preferred embodiment of the invention. FIG. 1 is an explanatory diagram viewed from above the layout configuration in all layers. FIG. 2 is an explanatory diagram viewed from above mainly the layout configuration beneath a first aluminum wiring layer in FIG. 1. FIG. 3 is an explanatory diagram viewed from above mainly the layout configuration over a second aluminum wiring layer in FIG. 1. Some reference numerals used in FIG. 2 or 3 are omitted in FIG. 1.

Figure 4:
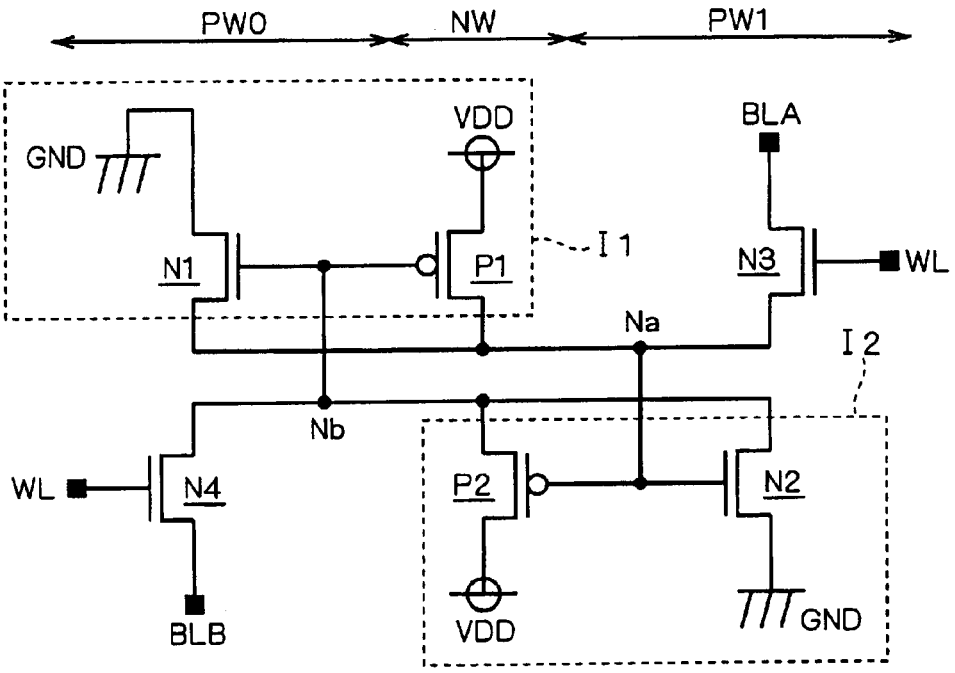
FIG. 4 is a circuit diagram illustrating an equivalent circuit of the memory cell in the first preferred embodiment.

FIG. 4 is a circuit diagram illustrating an equivalent circuit of the SRAM memory cell of the layout configuration shown in FIGS. 1 to 3. As seen from FIG. 4, the SRAM memory cell of the first preferred embodiment is made up of NMOS transistors N1 to N4 and PMOS transistors P1 and P2.

The PMOS transistors P1 and P2, each being a driver transistor, are disposed within an N well region NW. The NMOS transistor N1 that is a driver transistor and the NMOS transistor N4 that is an access transistor are disposed within a P well region PW0. The NMOS transistor N2 that is a driver transistor and the NMOS transistor N3 that is an access transistor are disposed within a P well region PW1. The P well regions PW0 and PW1 are oppositely disposed with the N well region NW interposed therebetween.

A first CMOS inverter I1 is made up of the NMOS transistor N1 and PMOS transistor P1. That is, the gates of the PMOS transistor P1 and NMOS transistor N1 are both connected to a storage terminal Nb, and their drains are both connected to a storage terminal Na. The source of the PMOS transistor P1 is connected to a power supply voltage $V_{dd}$, and the source of the NMOS transistor N1 is grounded.

A second CMOS inverter I2 is made up of the NMOS transistor N2 and PMOS transistor P2. That is, the gates of the PMOS transistor P2 and NMOS transistor N2 are both connected to the storage terminal Na, and their drains are both connected to the storage terminal Nb. The source of the PMOS transistor P2 is connected to the power supply voltage $V_{dd}$, and the source of the NMOS transistor N2 is grounded.

Thus, an output part of the inverter I1 and an input part of the inverter I2 are electrically connected to the storage terminal Na, and an input part of the inverter I1 and an output part of the inverter I2 are electrically connected to the storage terminal Nb, so that the CMOS inverters I1 and I2 are subjected to cross section. Thereby, the storage terminals Na and Nb can store information of mutually inverted logical level.

The NMOS transistor N3 is interposed between a bit line BLA and the storage terminal Na, and its gate is connected to a word line WL. The NMOS transistor N4 is interposed between a bit line BLB and the storage terminal Nb, and its gate is connected to the word line WL.

In such a configuration, the word line WL is brought into the active state and the NMOS transistors NT3 and NT4 are brought into the on state, thereby to provide access (i.e., read or write) to the storage terminals Na and Nb. This enables to obtain the data from the bit line BLA or BLB.

Referring to FIGS. 1 to 3, description will proceed to the memory cell structure of the first preferred embodiment.

In the N well region NW, the PMOS transistor P1 is made up of $P^+$ diffusion regions FL110, FL111, and a polysilicon wiring PL1, and the PMOS transistor P2 is made up of $P^+$ diffusion regions FL120, FL121, and a polysilicon wiring PL2.

In the P well region PW0, the NMOS transistor N1 is made up of $N^+$ diffusion regions FL210, FL211, and the polysilicon wiring PL1, and the NMOS transistor N4 is made up of $N^+$ diffusion regions FL240, FL241, and a polysilicon wiring PL4. The polysilicon wiring PL1 extends from the N well region NW to the P well region PW0, so as to be used as a gate common to the NMOS transistor N1 and PMOS transistor P1.

In the P well region PW1, the NMOS transistor N2 is made up of $N^+$ diffusion regions FL220, FL221, and the polysilicon wiring PL2, and the NMOS transistor N3 is made up of $N^+$ diffusion regions FL230, FL231, and a polysilicon wiring PL3. The polysilicon wiring PL2 extends from the N well region NW to the P well region PW1, so as to be used as a gate common to the NMOS transistor N2 and PMOS transistor P2.

The foregoing diffusion regions FL110, FL111, FL120, FL121, FL210, FL211, FL220, FL221, FL230, FL231, FL240 and FL241 are obtainable by implanting and diffusing impurity.

A ground wiring LG1 (first layer aluminum wiring) over the diffusion region FL210 is electrically connected through a diffusion contact hole 1C to the diffusion region FL210. An aluminum wiring AL11, which is a first layer aluminum wiring extending over the diffusion region FL211, FL111 and FL231, is electrically connected through a diffusion contact hole 1C to the diffusion regions FL211, FL111 and FL231, respectively. The aluminum wiring AL11 is also disposed over part of the polysilicon wiring PL2, and is electrically connected through a gate contact hole GC to the polysilicon wiring PL2. The aluminum wiring AL11 can be electrically connected with low impedance, and it corresponds to the storage terminal Na.

The diffusion contact hole 1C means a contact hole between a diffusion region and a first layer (aluminum) wiring. The gate contact hole GC means a contact hole between a polysilicon wiring and a first layer wiring.

The polysilicon wiring PL4 is electrically connected through a gate contact hole GC to the word line WL1 (first layer aluminum wiring). A bit line BLB1 (first layer aluminum wiring) over the diffusion region FL241 is electrically connected through a diffusion contact hole 1C to the diffusion region FL241.

An aluminum wiring AL12, which is a first layer aluminum wiring extending over the diffusion regions FL240, FL120 and FL220, is electrically connected through a diffusion contact hole 1C to the diffusion regions FL240, FL120 and FL220, respectively. The aluminum wiring AL12 is also disposed over part of the polysilicon wiring PL1, and is electrically connected through a gate contact hole GC to the polysilicon wiring PL1. The aluminum wiring AL12 can be electrically connected with low impedance, and it corresponds to the storage terminal Nb.

A power supply wiring LV1 (first layer aluminum wiring) over the diffusion region FL110 is electrically connected through a diffusion contact hole 1C to the diffusion region FL110. The power supply wiring LV1 over the diffusion region FL121 is electrically connected through a diffusion contact hole 1C to the diffusion region FL121.

A bit line BLA1 (first layer aluminum wiring) over the diffusion region FL230 is electrically connected through a diffusion contact hole 1C to the diffusion region FL230. A word line WL1 over the polysilicon wiring PL3 is electrically connected through a gate contact hole GC to the polyslicon wiring PL3. A ground wiring LG1 over the diffusion region FL221 is electrically connected through a diffusion contact hole 1C to the diffusion region FL221.

A ground wiring LG1 is electrically connected through a via hole 1T to a ground wiring LG2 (second layer aluminum wiring (2AL)), and the ground wiring LG2 is electrically connected through a via hole 2T to a ground wiring LG3 (third layer aluminum wiring (3AL)).

A word line WL1 is electrically connected through a via hole 1T to a word line WL2 (second layer aluminum wiring), and the word line WL2 is electrically connected through a via hole 2T to a word line WL3 (third layer aluminum wiring). The word line WL shown in FIG. 4 is made up of these word lines WL1 to WL3.

The via hole 1T means a via hole to make connection between a first layer wiring and a second layer (aluminum) wiring. The via hole 2T means a via hole to make connection between a second layer wiring and a third layer (aluminum) wiring.

The word line WL3 and ground wiring LG3 are disposed parallel with each other, across the P well regions PW0, PW1, and the N well region NW. Two ground wirings LG3 are disposed with the word line WL3 interposed therebetween.

A bit line BLA2 (second layer aluminum wiring) is electrically connected through a via hole 1T to a bit line BLA1 (not shown in FIG. 3). A bit line BLB2 (second layer aluminum wiring) is electrically connected through a via hole 1T to a bit line BLB1 (not shown in FIG. 3). A power supply wiring LV2 (second layer aluminum wiring) is electrically connected through a via hole 1T to a power supply wiring LV1 (not shown in FIG. 3). The bit lines BLA and BLB shown in FIG. 4 are made up of the bit lines BLA1 and BLA2, and the bit lines BLB1 and BLB2, respectively.

The bit lines BLA2, BLB2 and the power supply wiring LV2 are disposed over the P well regions PW1, PW0 and the N well region NW, respectively, so as to be parallel to each other in the longitudinal direction viewing the drawing.

Thus, in the memory cell structure of the SRAM of the first preferred embodiment, with the N well region NW interposed between the P well regions PW0 and PW1, the NMOS transistors N1 and N4 are disposed in the P well region PW0, and the NMOS transistors N2 and N3 are disposed in the P well region PW1. Thereby, the $N^+$ diffusion region FL211 and the $N^+$ diffusion region FL220 that are electrically connected to the storage terminals Na and Nb, respectively, can be separately formed in the different P well regions PW0 and PW1.

As a result, there are the following effects. Firstly, when electrons generated from alpha rays and neutron beams are collected into the $N^+$ diffusion region formed in one of the P well regions PW0 and PW1, such electrons are released from the $N^+$ diffusion region formed in the other P well region where the influence of the generated electrons can be avoided by the presence of the N well region NW. This cancels out the occurrence of electrons acting to invert the hold data of the storage terminals Na and Nb, and thus the inversion of data is hard to occur. That is, there is the effect of improving resistance to soft error (This is hereinafter referred to as the first effect.).

Secondly, since the P well regions PW0 and PW1 are separately formed in a direction vertical to the direction of formation of the bit lines BLA and BLB, the formation of the two P well regions PW0 and PW1 exerts no influence on the wiring length of the bit lines BLA and BLB. Hence, there is no possibility that the formation of the P well regions PW0 and PW1 increases the wiring length of the bit lines, thus maintaining a good access time (This is hereinafter referred to as the second effect.).

Thirdly, since the NMOS transistors N1 and N2, and the NMOS transistors N3 and N4, are respectively arranged so as to be point symmetry with respect to the central part of the memory cell (the central part of the N well region NW), the degree of integration can be increased when a plurality of the memory cells of the first preferred embodiment are disposed adjacent each other (This is hereinafter referred to as the third effect.).

Fourthly, the formation of the polysilicon wirings PL1 to PL4 in the same direction (the lateral direction viewing the drawing) facilitates the control of the gate dimension. Further, because the polysilicon wirings PL1 and PL3 (NMOS transistors N1, N3, and PMOS transistor P1), and the polysilicon wirings PL2 and PL4 (NMOS transistors N2, N4, and PMOS transistor P2) are respectively arranged in a straight line, no waste region is present and a reduction in the circuit area increases the degree of integration (This is hereinafter referred to as the fourth effect.).

Fifthly, by separately forming a region serving as a drain (i.e., a region electrically connected to the storage terminal Na or Nb) in the NMOS transistors N1 to N4, resistance to soft error can be maintained at a high level (a fifth effect).

Sixthly, with the arrangement that each of inverters I1 and I2 of a CMOS structure is made up of a combination of a NMOS transistor and a PMOS transistor, the memory cell can be realized by at least sufficient circuit configuration as a CMOS structure (a sixth effect).

Second Preferred Embodiment

Figure 5:
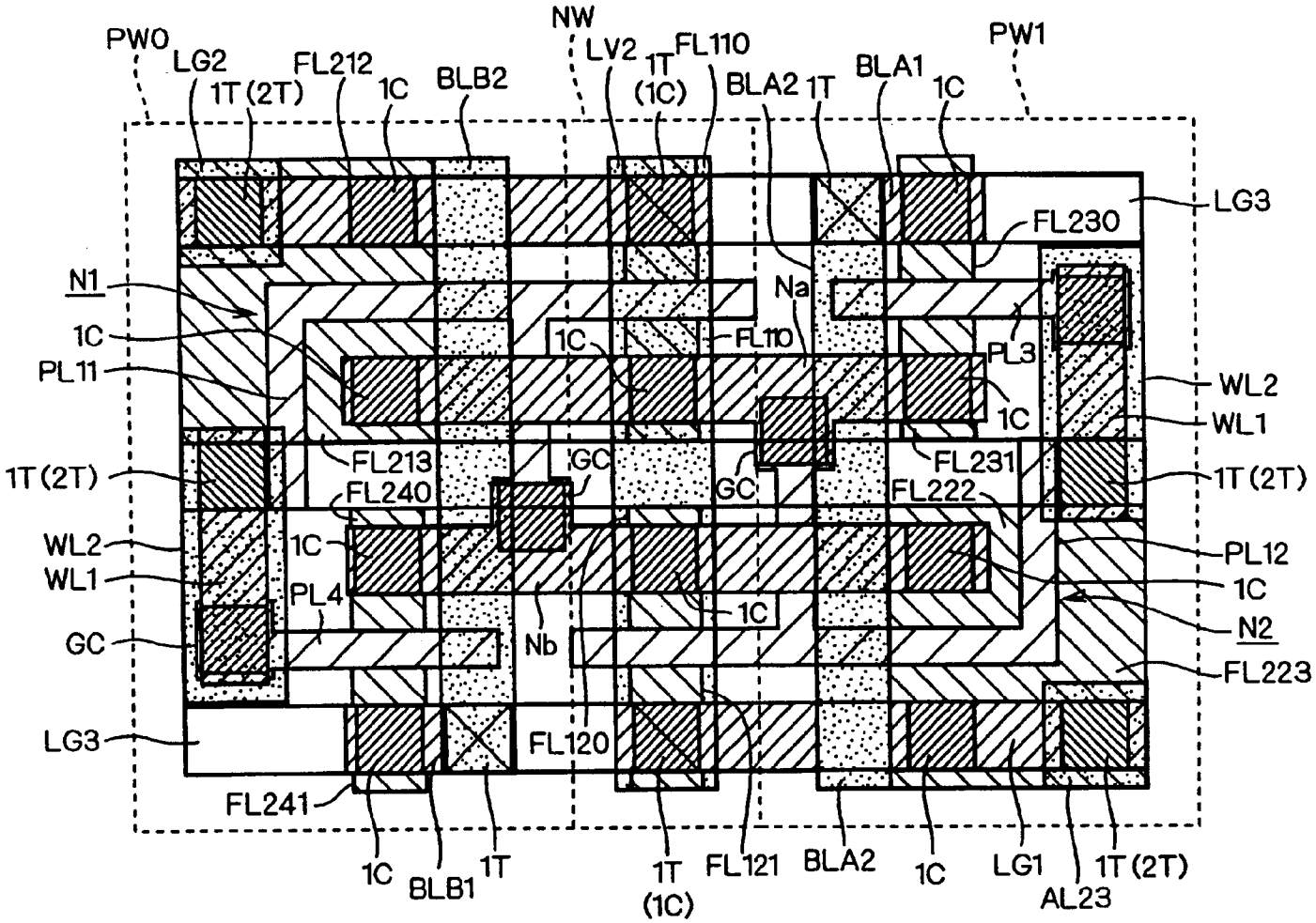
FIG. 5 is an explanatory diagram viewed from above the layout configuration in all layers of a SRAM memory cell according to a second preferred embodiment of the invention.
Figure 6:
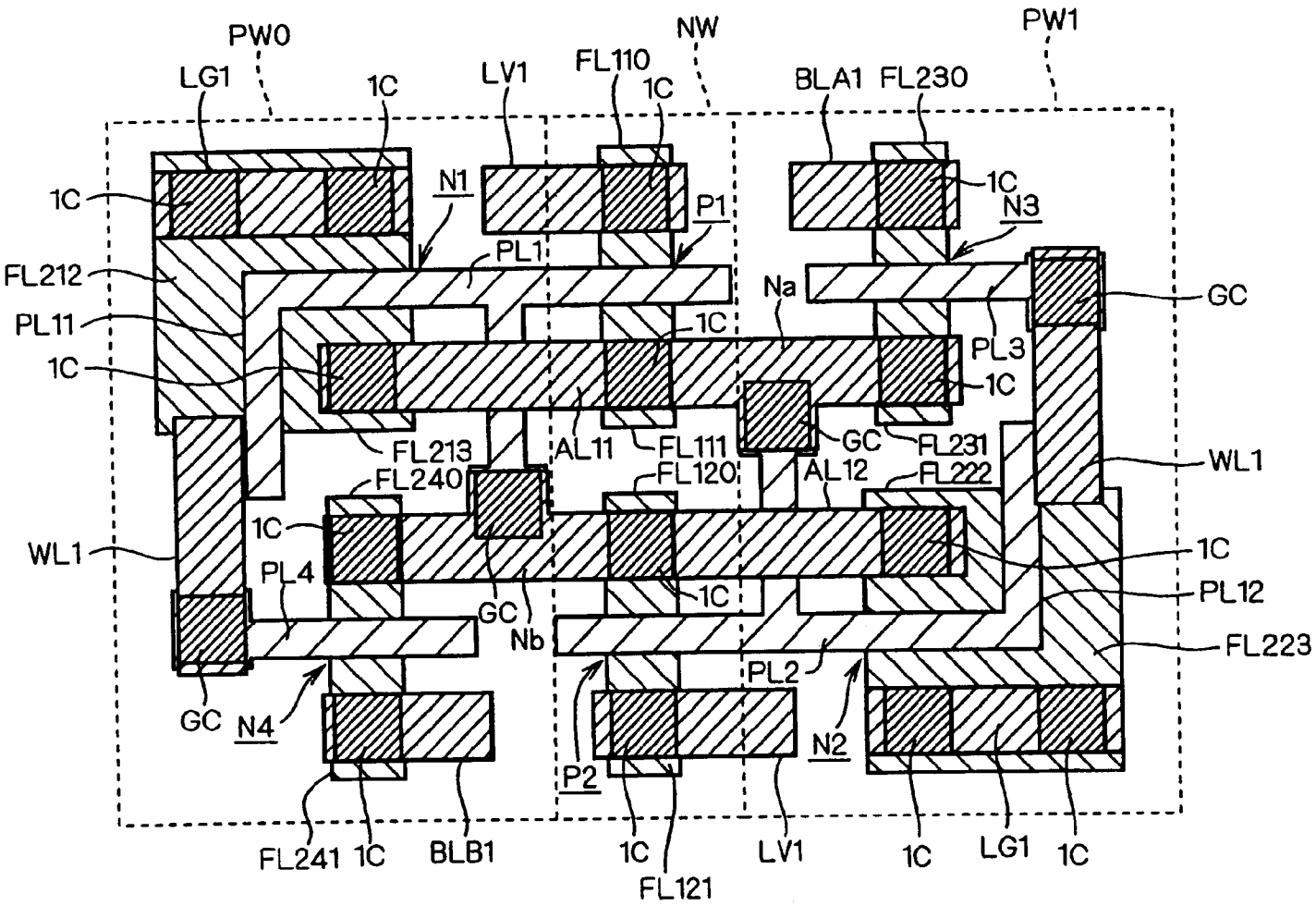
FIG. 6 is an explanatory diagram viewed from above mainly the layout configuration beneath a first aluminum wiring layer in FIG. 5.

FIGS. 5 and 6 are diagrams illustrating a memory cell structure of a SRAM according to a second preferred embodiment of the invention. FIG. 5 is an explanatory diagram viewed from above the layout configuration in all layers. FIG. 6 is an explanatory diagram viewed from above mainly the layout configuration beneath a first aluminum wiring layer in FIG. 5. An explanatory diagram viewed from above the layout configuration over a second aluminum wiring layer in FIG. 5 is similar to that of FIG. 3 in the first preferred embodiment. A circuit diagram illustrating an equivalent circuit of the second preferred embodiment is similar to that of FIG. 4. Some reference numerals used in FIG. 6 or 3 are omitted in FIG. 5.

As seen from these figures, over a rectangular $N^+$ diffusion region for a NMOS transistor N1, a polysilicon wiring PL1 is formed by bending it from the central part of the $N^+$ diffusion region, so that a relatively wide diffusion region FL212 and a relatively narrow diffusion region FL213 are formed on the outside and inside of the polysilicon wiring PL1, respectively. The NMOS transistor N1 is made up of the diffusion regions FL212, FL213, and the polysilicon wiring PL1.

Likewise, over a rectangular $N^+$ diffusion region for a NMOS transistor N2, a polysilicon wiring PL2 is formed by bending it from the central part of the $N^+$ diffusion region, so that a relatively wide diffusion region FL223 and a relatively narrow diffusion region FL222 are formed on the outside and inside of the polysilicon wiring PL2, respectively. The NMOS transistor N2 is made up of the diffusion regions FL222, FL223, and the polysilicon wiring PL2.

A ground wiring LG1 over the diffusion region FL212 is electrically connected through two diffusion contact holes 1C to the diffusion region FL212. An aluminum wiring AL11 over the diffusion region FL213 is electrically connected through a diffusion contact hole 1C to the diffusion region FL213.

Likewise, a ground wiring LG1 over the diffusion region FL223 is electrically connected through two diffusion contact holes 1C to the diffusion region FL223. An aluminum wiring AL12 over the diffusion region FL222 is electrically connected through a diffusion contact hole 1C to the diffusion region FL222. Otherwise, the layout configuration is similar to that of the first preferred embodiment, and the description thereof is thus omitted.

The second preferred embodiment having the foregoing layout configuration produces the following effects in addition to the first, second, fifth and sixth effects of the first preferred embodiment.

It is able to increase the gate width (channel width) of the NMOS transistors N1 and N2 that are driver transistors. As a result, the operation speed can be increased by quickly removing the carriers of the bit lines BLA and BLB.

Additionally, the ratio of a gate width W to the NMOS transistors N3 and N4, which are the respective access transistors of the NMOS transistors N1 and N2 that are driver transistors, can be increased to improve the stability of the memory cell.

Figure 7:
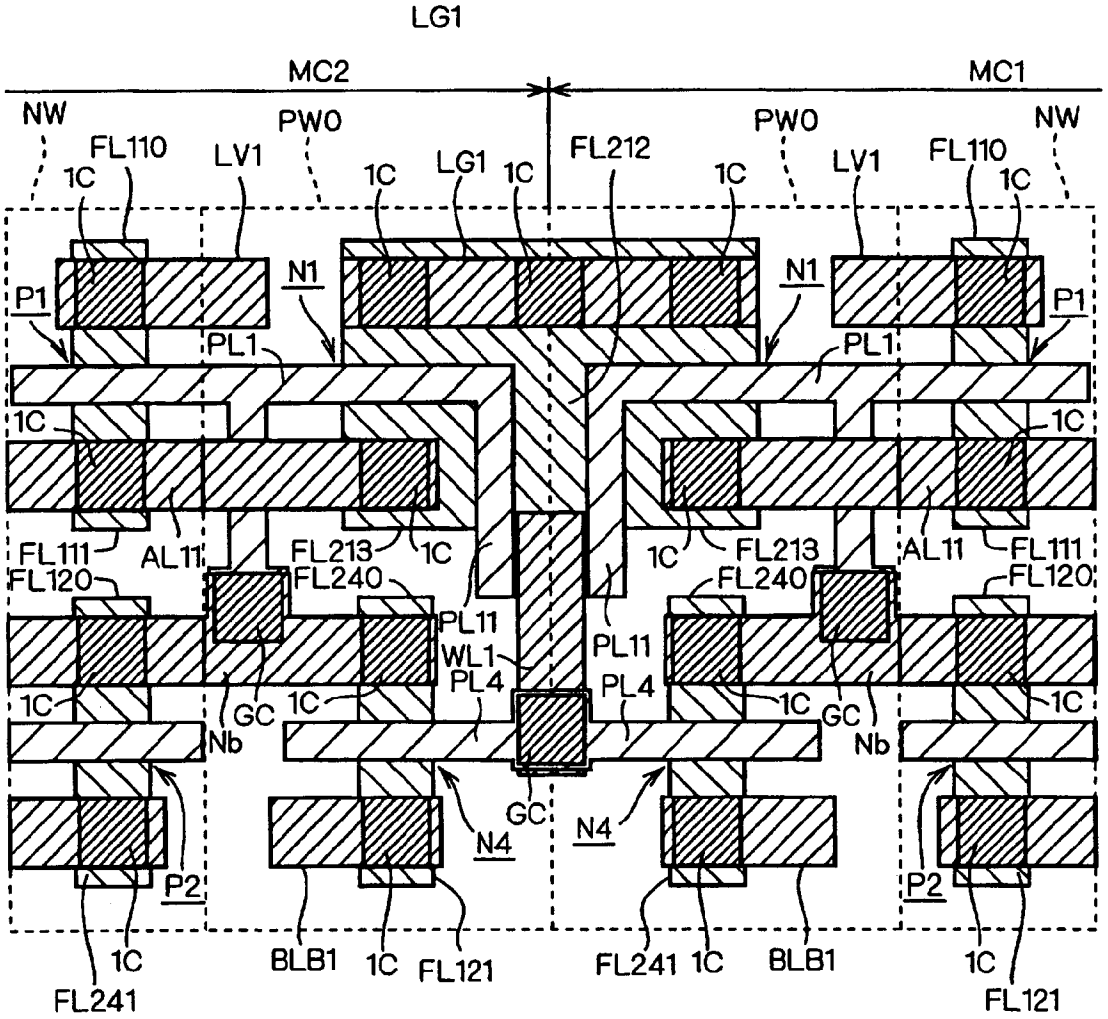
FIG. 7 is an explanatory diagram viewed from above the layout configuration beneath the first aluminum wiring layer between adjacent memory cells.

FIG. 7 is an explanatory diagram viewed from above the layout configuration between adjacent cells. Like FIG. 6, FIG. 7 illustrates mainly the layout configuration beneath a first aluminum wiring layer in FIG. 5.

In FIG. 7, there are shown an N well region NW and a P well region PW0 of a memory cell MC1, and an N well region NW and a P well region PW0 of a memory cell MC2.

The NMOS transistors N1 and N2 are respectively arranged so as to be point symmetry with respect to the central part of the memory cell (the central part of the N well region NW). This corresponds to the third effect of the first preferred embodiment. Referring to FIG. 7, between the adjacent memory cells MC1 and MC2, the NMOS transistors N1 (N2), each being a driver transistor, can be disposed adjacent each other in line symmetric relation, thereby to increase the gate width W of the NMOS transistors N1 and N2, while increasing the degree of integration by having the diffusion region FL212, word line WL1, ground wiring LG1, diffusion contact hole 1C and gate contact hole GC share at least their respective portions.

Thus, there is little or no increase of area due to the bending of the polysilicon wirings PL1 and PL2 that become the gates of the NMOS transistors N1 and N2, respectively. It is therefore able to obtain a high-density memory cell structure similar to that of the first preferred embodiment.

In addition, the degree of integration can be increased by disposing the NMOS transistors N1, N3 and PMOS transistor P1; and the NMOS transistors N2, N4 and PMOS transistor P2, in an approximately straight line, respectively. This corresponds to the fourth effect of the first preferred embodiment.

Third Preferred Embodiment

Figure 8:
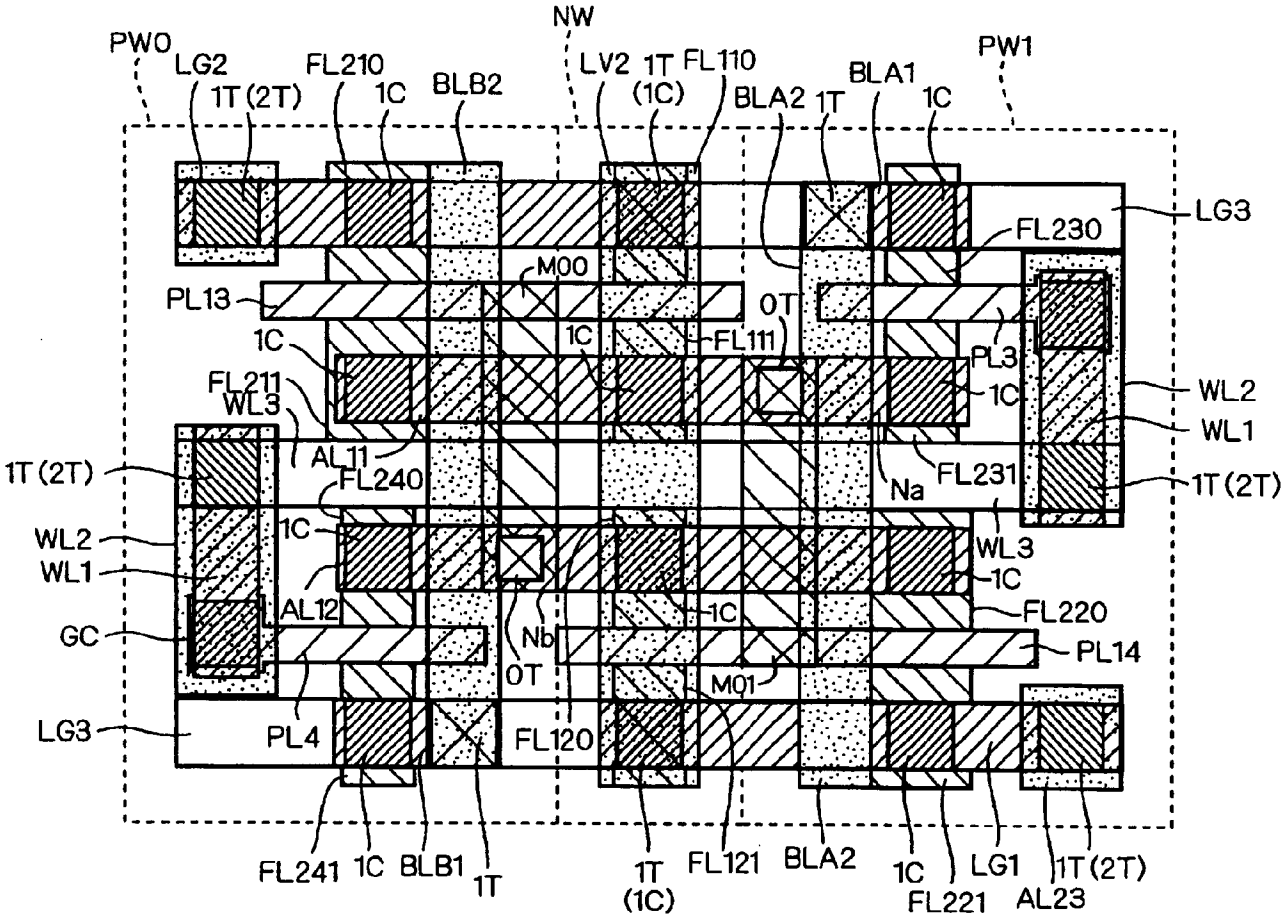
FIG. 8 is an explanatory diagram viewed from above the layout configuration in all layers of a SRAM memory cell according to a third preferred embodiment of the invention.
Figure 9:
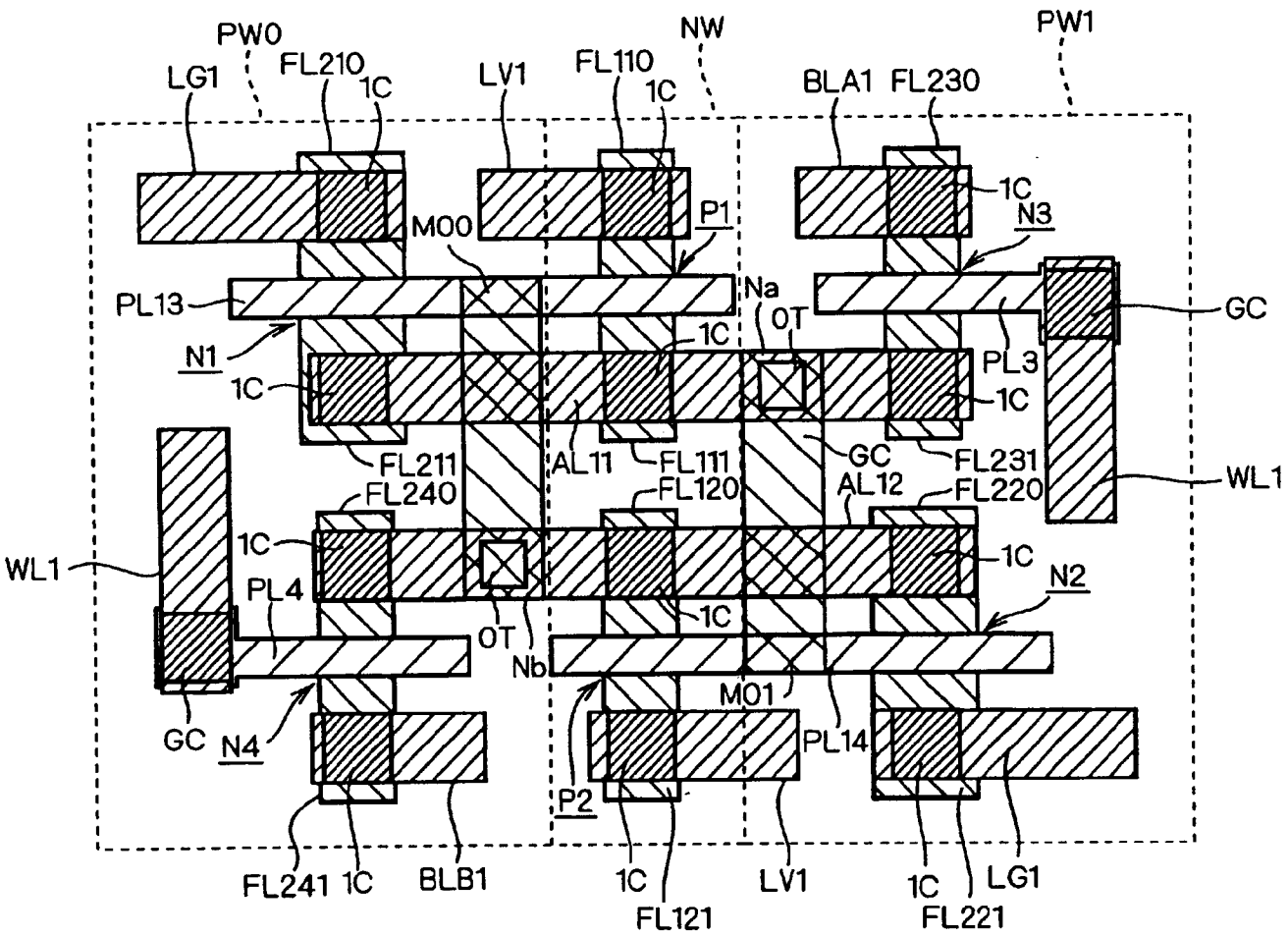
FIG. 9 is an explanatory diagram viewed from above mainly the layout configuration beneath a first aluminum wiring layer in FIG. 8.
Figure 10:
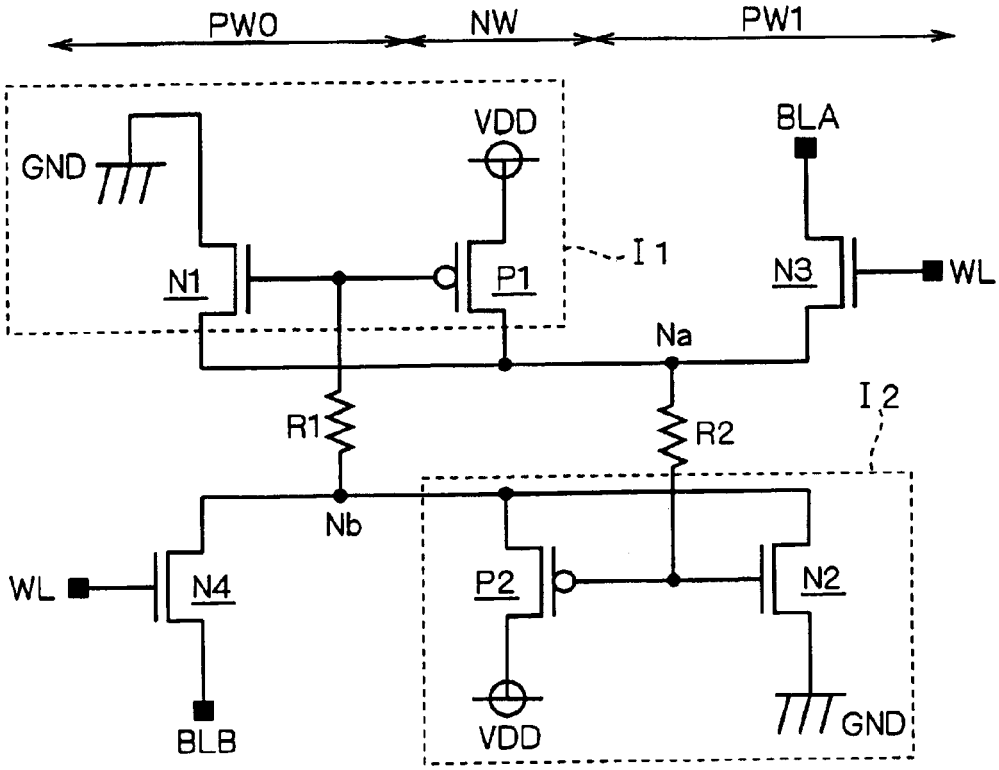
FIG. 10 is a circuit diagram illustrating an equivalent circuit of the memory cell in the third preferred embodiment.

FIGS. 8 to 10 are diagrams illustrating a memory cell structure of a SRAM according to a third preferred embodiment of the invention. FIG. 8 is an explanatory diagram viewed from above the layout configuration in all layers. FIG. 9 is an explanatory diagram viewed from above mainly the layout configuration beneath a first aluminum wiring layer in FIG. 8. An explanatory diagram viewed from above the layout configuration over a second aluminum wiring layer in FIG. 8 is similar to that of FIG. 3 in the first preferred embodiment. Some reference numerals used in FIG. 9 or 3 are omitted in FIG. 8.

FIG. 10 is a circuit diagram illustrating an equivalent circuit of the SRAM memory cell having the layout configuration shown in FIGS. 8, 9 and 3. Referring to FIG. 10, a resistance R1 is interposed between a storage terminal Nb and the gate of a NMOS transistor N1 and a PMOS transistor P1. A resistance R2 is interposed between a storage terminal Na and the gate of a NMOS transistor N2 and a PMOS transistor P2. Otherwise, the configuration is similar to that of the first preferred embodiment described with respect to FIG. 4, and the description thereof is thus omitted.

Referring to FIGS. 8, 9 and 3, description will proceed to the memory cell structure of the third preferred embodiment.

As shown in these figures, a polysilicon wiring PL13 (corresponding to the polysilicon wiring PL1 of the first preferred embodiment), which becomes the gate of the NMOS transistor N1 and PMOS transistor P1, is electrically connected to a high resistance metal wiring M00 that becomes the resistance R1. The high resistance metal wiring M00 is electrically connected through a via hole 0T to an aluminum wiring AL12 that is the storage terminal Nb. The via hole 0T means a via hole to make connection between the high resistance metal wiring M00 formed in the same layer as the polysilicon wiring, and a first layer wiring.

Likewise, a polysilicon wiring PL14 (corresponding to the polysilicon wiring PL2 of the first preferred embodiment), which becomes the gate of the NMOS transistor N2 and PMOS transistor P2, is electrically connected to a high resistance metal wiring M01 that becomes the resistance R2. The high resistance metal wiring M01 is electrically connected through a via hole 0T to the aluminum wiring AL11 that is the storage terminal Na.

Examples of material of the high resistance metal wirings M00 and M01 are tungsten, etc., having a higher resistivity than CoSi (cobalt silicon). Otherwise, the configuration is similar to that of the first preferred embodiment described with respect to FIGS. 1 to 3, and the description thereof is thus omitted.

The third preferred embodiment having the foregoing memory cell structure produces the following effect in addition to the first to sixth effects of the first preferred embodiment.

In the memory cell of the third preferred embodiment, the response characteristic for inverting the data held in the cell is elongated due to signal delay propagating the resistances R1 and R2. As a result, even if the potential of one of the storage terminals Na and Nb is inverted by electrons generated from alpha rays and neutron beams, it returns to the initial hold state before the data of the other storage terminal is inverted, thereby soft error becomes much rare.

Fourth Preferred Embodiment

Figure 11:
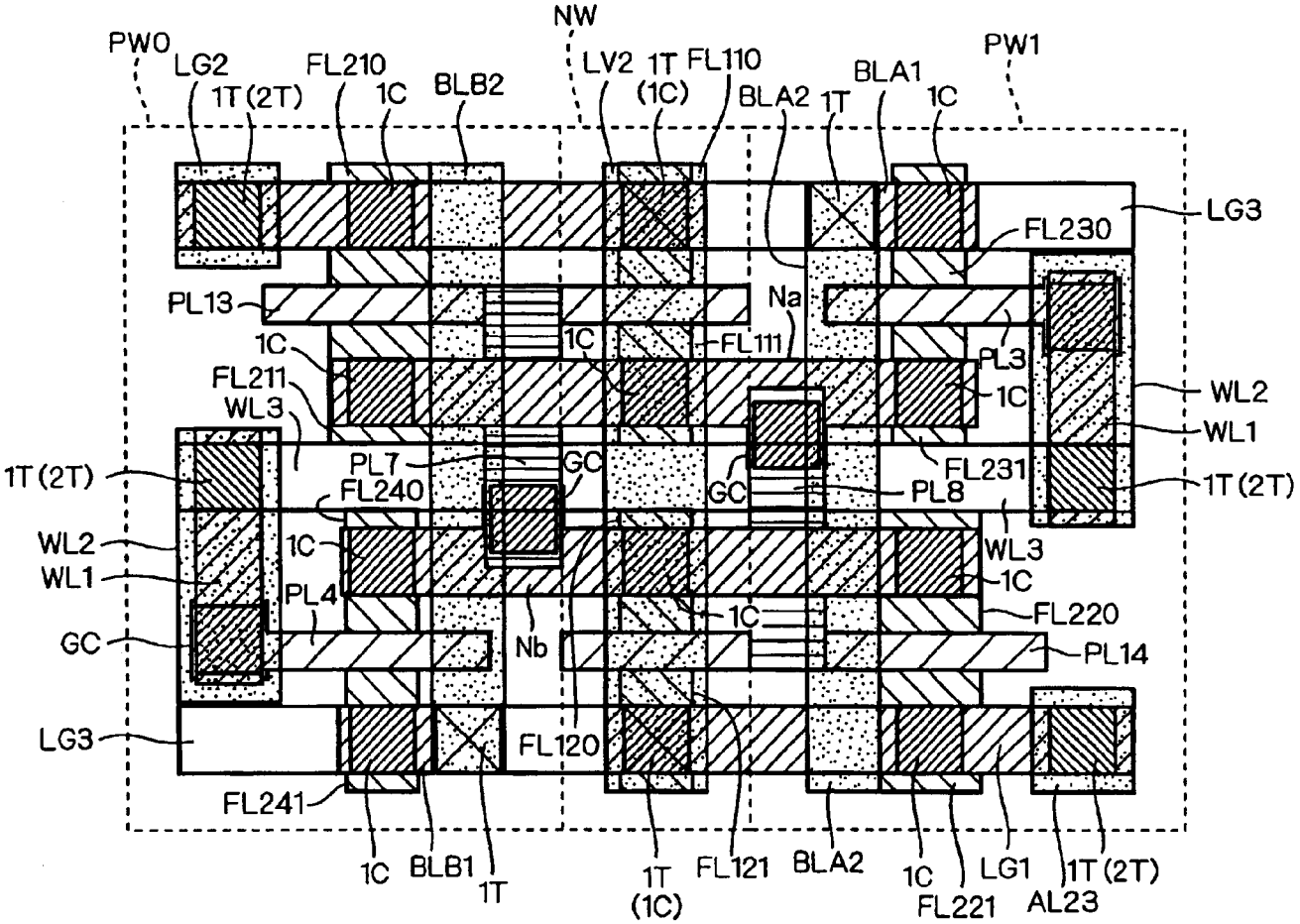
FIG. 11 is an explanatory diagram viewed from above the layout configuration in all layers of a SRAM memory cell according to a fourth preferred embodiment of the invention.
Figure 12:
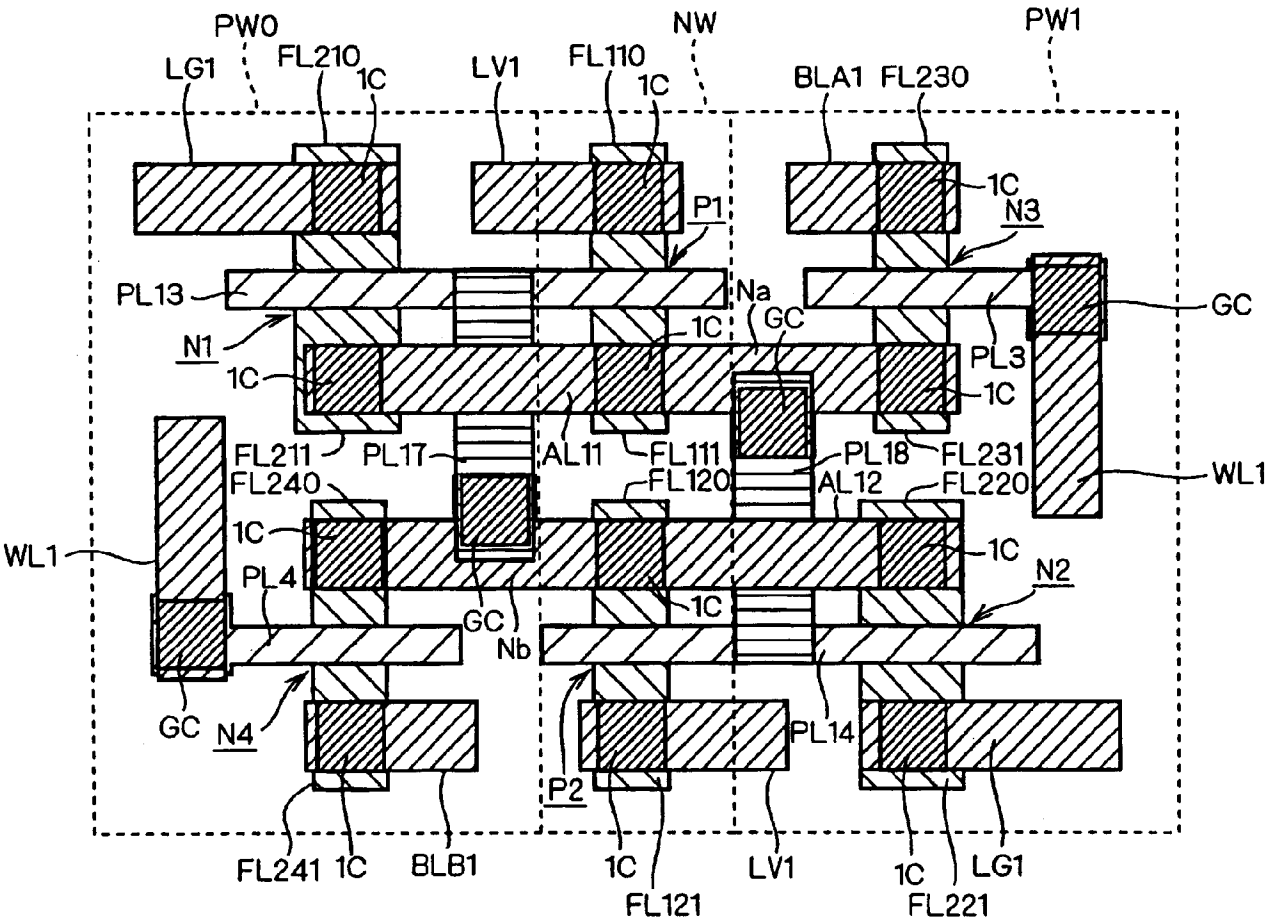
FIG. 12 is an explanatory diagram viewed from above mainly the layout configuration beneath a first aluminum wiring layer in FIG. 11.

FIGS. 11 and 12 are diagrams illustrating a memory cell structure of a SRAM according to a fourth preferred embodiment of the invention. FIG. 11 is an explanatory diagram viewed from above the layout configuration in all layers. FIG. 12 is an explanatory diagram viewed from above mainly the layout configuration beneath a first aluminum wiring layer in FIG. 11. An explanatory diagram viewed from above the layout configuration over a second aluminum wiring layer in FIG. 11 is similar to that of FIG. 3 in the first preferred embodiment. Some reference numerals used in FIG. 12 or 3 are omitted in FIG. 11. An equivalent circuit of the SRAM memory cell having the layout configuration of the fourth preferred embodiment is similar to that of the third preferred embodiment described with respect to FIG. 10.

Referring to FIGS. 11, 12 and 3, description will proceed to the memory cell structure of the fourth preferred embodiment.

Of polysilicon wirings PL13 and PL17 (corresponding to the polysilicon wiring PL1 of the first preferred embodiment), which become the gate of a NMOS transistor N1 and a PMOS transistor P1, the polysilicon wiring PL17 that becomes a resistance R1 is formed from a material having a higher resistance than the polysilicon wiring PL13. For instance, when the polysilicon wiring PL13 is formed from CoSi, the polysilicon wiring PL17 is formed from a material having a higher resistivity than CoSi.

The polysilicon wiring PL17 is electrically connected through a gate contact hole GC to an aluminum wiring AL12 that is a storage terminal Nb.

Likewise, of polysilicon wirings PL14 and PL18 (corresponding to the polysilicon wiring PL2 of the first preferred embodiment), which become the gate of a NMOS transistor N2 and a PMOS transistor P2, the polysilicon wiring PL18 that becomes a resistance R2 is formed from a material having a higher resistance than the polysilicon wiring PL14. The polysilicon wiring PL18 is electrically connected through a gate contact hole GC to an aluminum wiring AL11 that is a storage terminal Na. Otherwise, the configuration is similar to that of the first preferred embodiment described with respect to FIGS. 1 to 3, and the description thereof is thus omitted.

The fourth preferred embodiment having the foregoing memory cell structure produces the following effect in addition to the first to sixth effects of the first preferred embodiment.

In the memory cell of the fourth preferred embodiment, the response characteristic for inverting the data held in the cell is elongated due to signal delay propagating the resistances R1 and R2. As a result, even if the potential of one of the storage terminals Na and Nb is inverted by electrons generated from alpha rays and neutron beams, it returns to the initial hold state before the data of the other storage terminal is inverted, thereby soft error becomes much rare.

Fifth Preferred Embodiment

Figure 13:
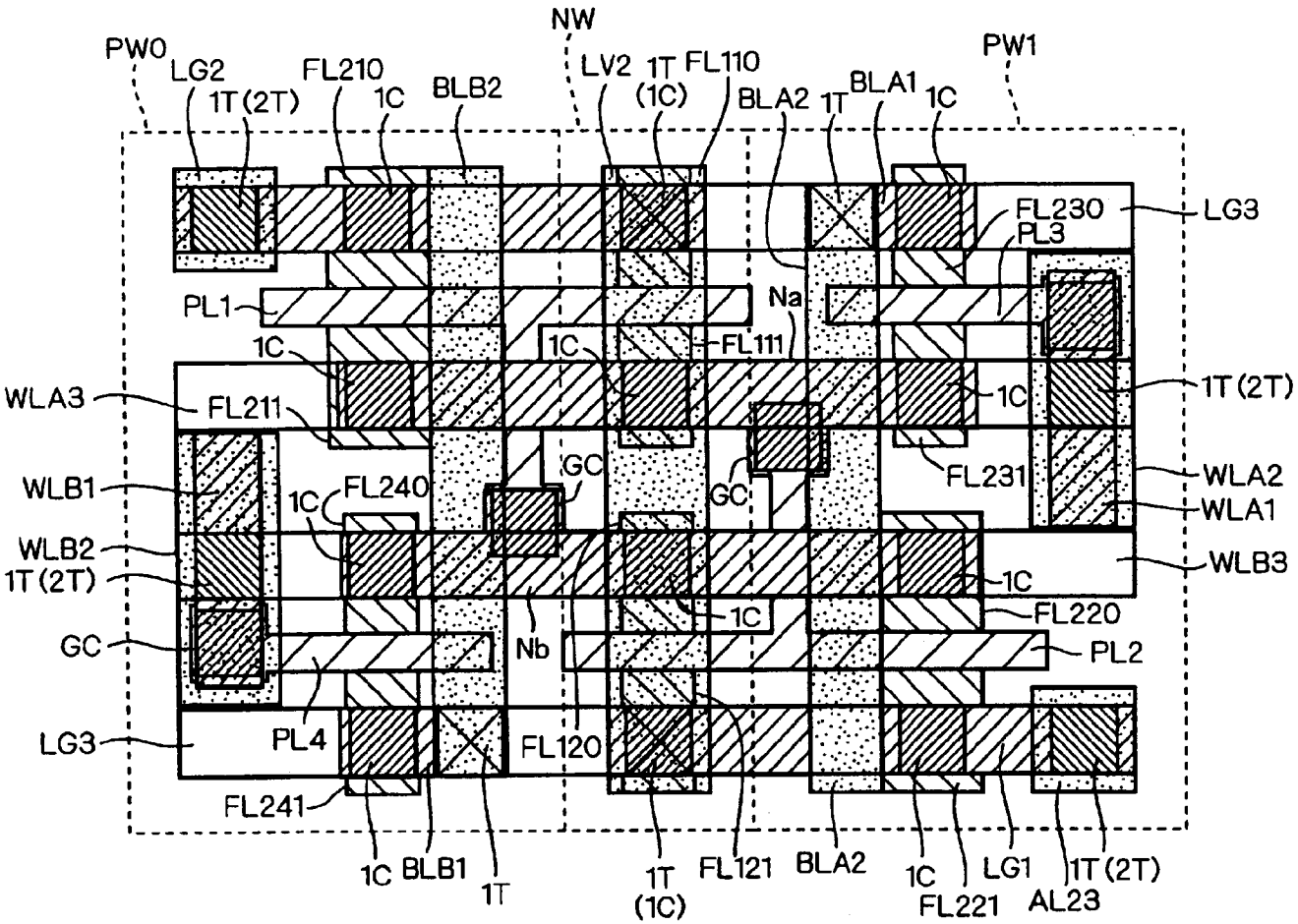
FIG. 13 is an explanatory diagram viewed from above the layout configuration in all layers of a SRAM memory cell according to a fifth preferred embodiment of the invention.
Figure 14:
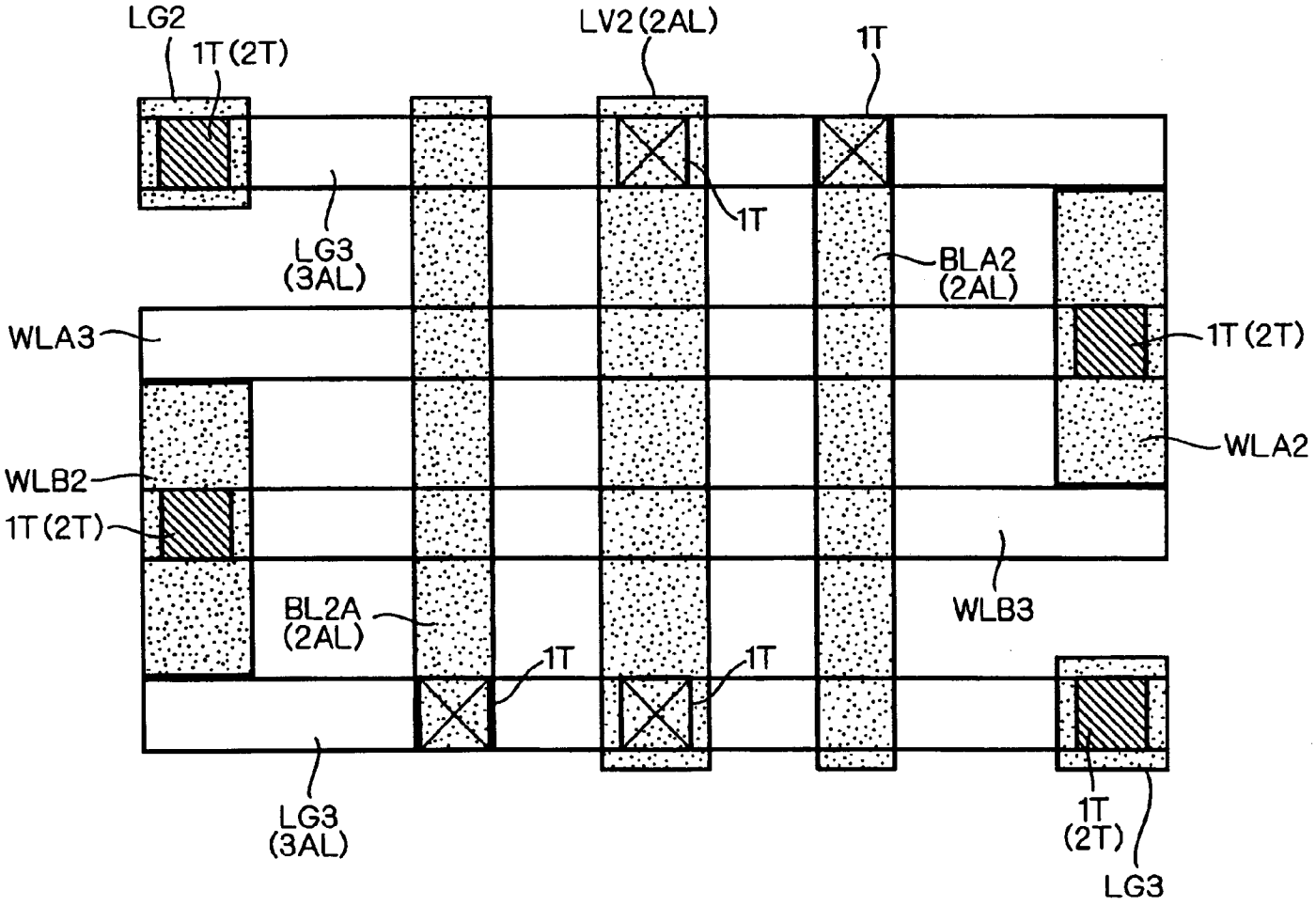
FIG. 14 is an explanatory diagram viewed from above mainly the layout configuration over a second aluminum wiring layer in FIG. 13.
Figure 15:
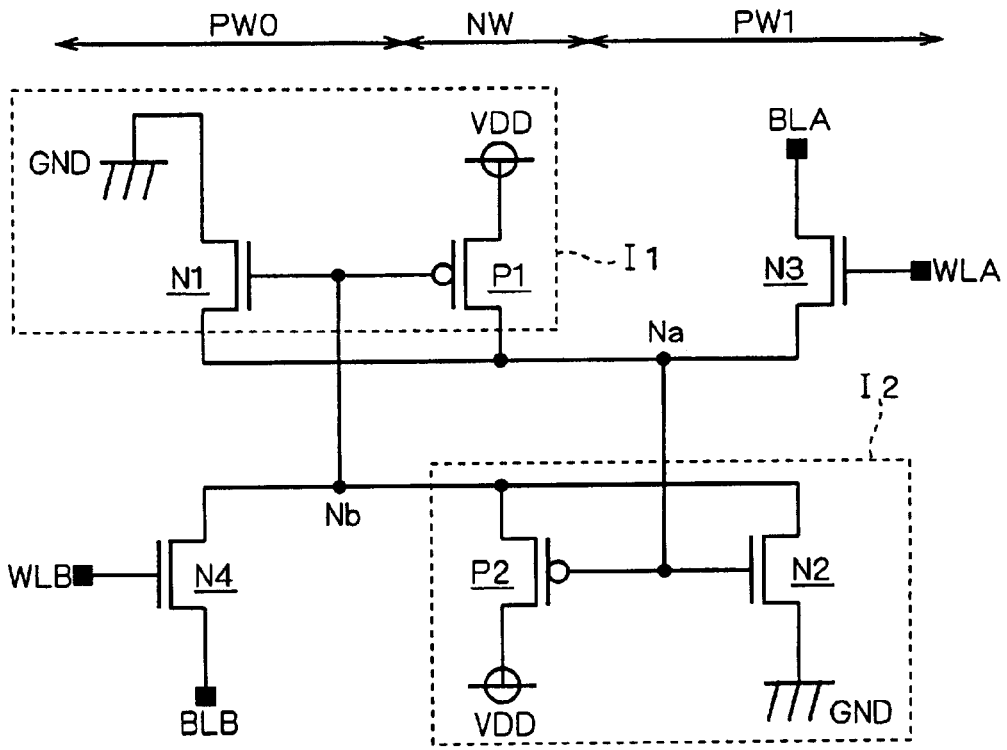
FIG. 15 is a circuit diagram illustrating an equivalent circuit of the memory cell in the fifth preferred embodiment.

FIGS. 13 to 15 are diagrams illustrating a memory cell structure of a SRAM according to a fifth preferred embodiment of the invention. FIG. 13 is an explanatory diagram viewed from above the layout configuration in all layers. FIG. 14 is an explanatory diagram viewed from above mainly the layout configuration over a second aluminum wiring layer in FIG. 13. An explanatory diagram viewed from above the layout configuration beneath a first aluminum wiring layer in FIG. 13 is similar to that of FIG. 2 in the first preferred embodiment, except that the word line WL2 is divided into word lines WLA2 and WLB2. Some reference numerals used in FIG. 14 or 2 are omitted in FIG. 13.

FIG. 15 is a circuit diagram illustrating an equivalent circuit of the SRAM memory cell having the layout configuration shown in FIGS. 13, 14 and 2. Referring to FIG. 15, a word line WLA is connected to the gate of a NMOS transistor N3, and a word line WLB that is independent of the word line WLA is connected to the gate of a NMOS transistor N4. Otherwise, the configuration is similar to that of the first preferred embodiment described with respect to FIG. 4, and the description thereof is thus omitted.

Referring to FIGS. 13, 14 and 2, description will proceed to the memory cell structure of the fifth preferred embodiment.

A polysilicon wiring PL3 is electrically connected through a gate contact hole GC to a word line WLA1 (first layer aluminum wiring). The word line WLA1 is electrically connected through a via hole 1T to a word line WLA2 (second layer aluminum wiring). The word line WLA2 is electrically connected through a via hole 2T to a word line WLA3 (third layer aluminum wiring). The word line WLA of FIG. 15 is made up of these word lines WLA1 to WLA3.

Likewise, a polysilicon wiring PL4 is electrically connected through a gate contact hole GC to a word line WLB1 (first layer aluminum wiring). The word line WLB1 is electrically connected through a via hole 1T to a word line WLB2 (second layer aluminum wiring). The word line WLB2 is electrically connected through a via hole 2T to a word line WLB3 (third layer aluminum wiring). The word line WLB of FIG. 15 is made up of these word lines WLB1 to WLB3.

The word line WLA3, WLB3 and a ground wiring LG3 are disposed parallel with each other, across P well regions PW0, PW1 and an N well region NW. Two ground wirings LG3 are disposed with the word lines WLA3 and WLB3 interposed therebetween. Otherwise, the layout configuration is similar to that of the first preferred embodiment, and the description thereof is thus omitted.

The fifth preferred embodiment having the foregoing memory cell structure produces the following effect in addition to the first to sixth effects of the first preferred embodiment.

As shown in the equivalent circuit of FIG. 15, the word line connected to the gate of the NMOS transistors N3 and N4 that are access transistors can be divided into the word lines WLA and WLB. This enables to realize a memory cell structure usable in a FIFO memory.

Sixth Preferred Embodiment

Figure 16:
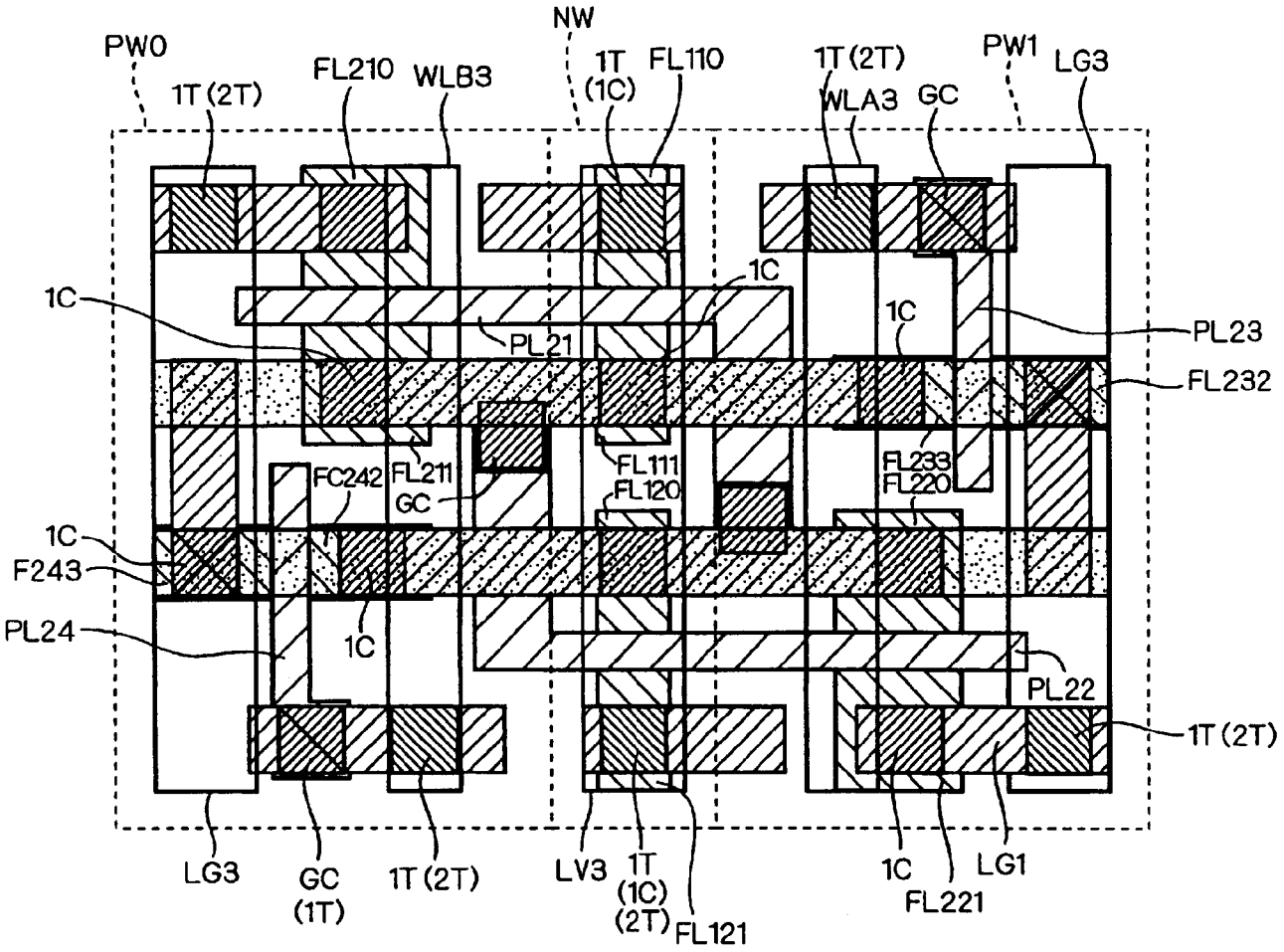
FIG. 16 is an explanatory diagram viewed from above the layout configuration in all layers of a SRAM memory cell according to a sixth preferred embodiment of the invention.
Figure 17:
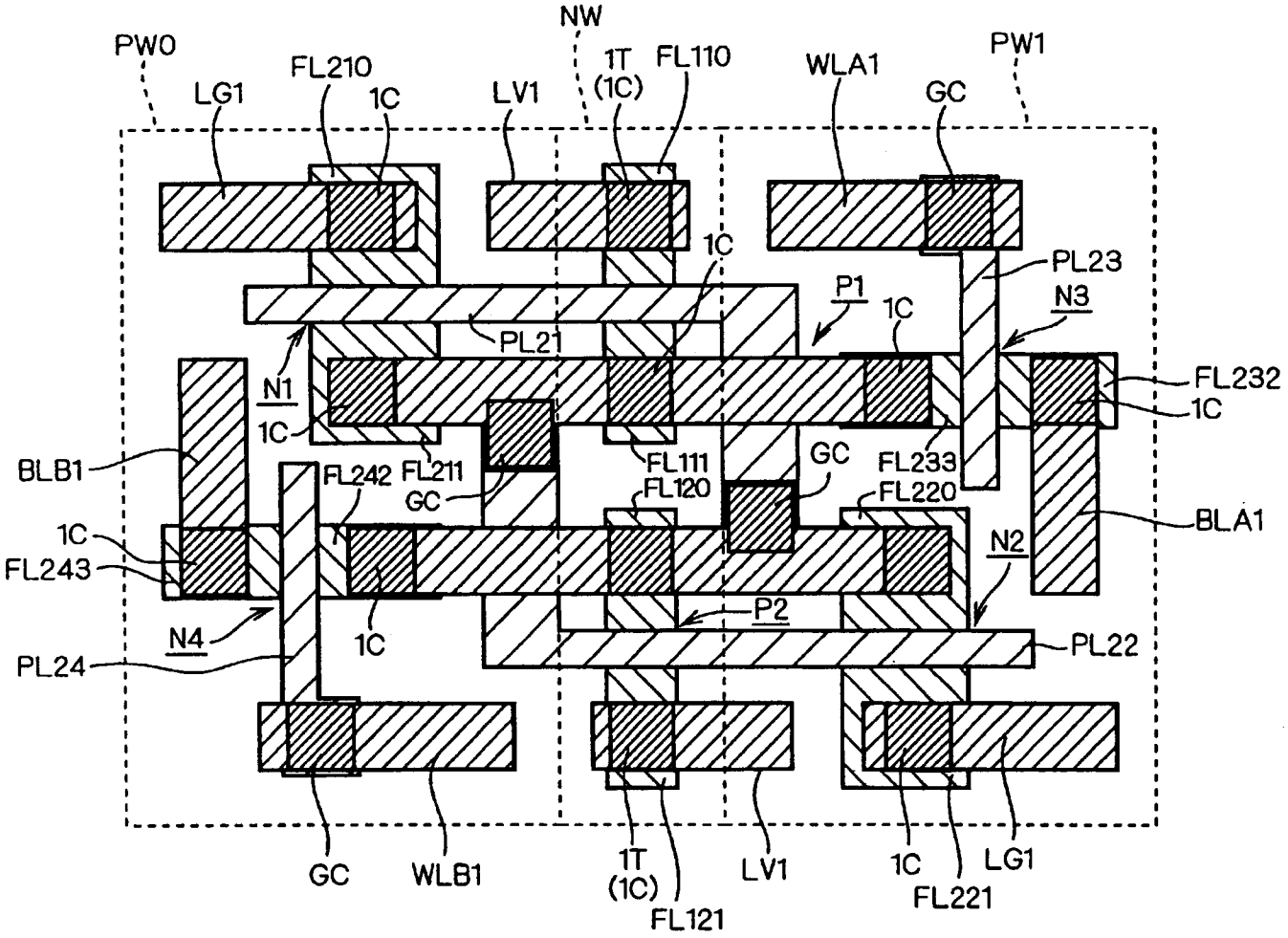
FIG. 17 is an explanatory diagram viewed from above mainly the layout configuration beneath a first aluminum wiring layer in FIG. 16.
Figure 18:
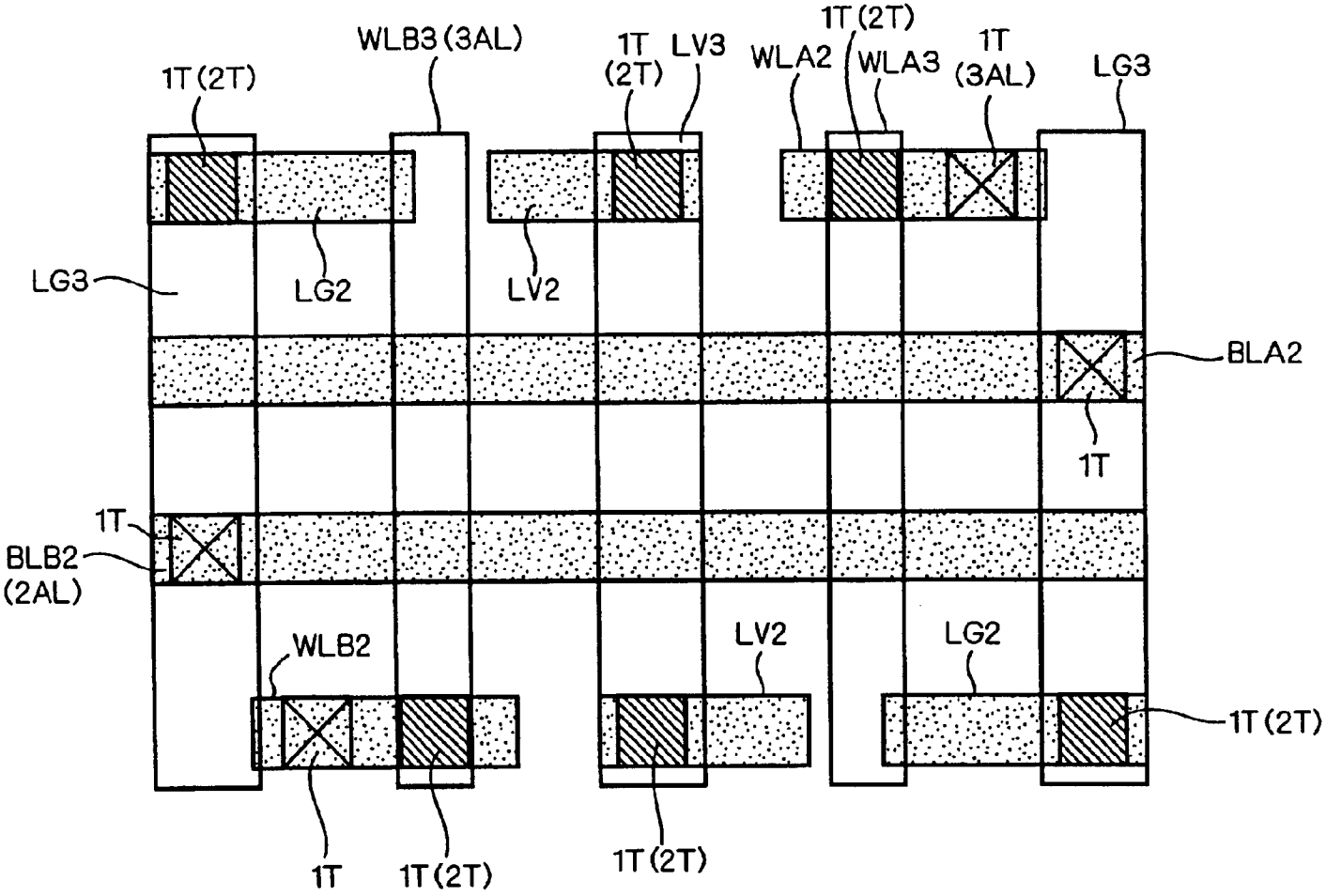
FIG. 18 is an explanatory diagram viewed from above mainly the layout configuration above a second aluminum wiring layer in FIG. 16.

FIGS. 16 to 18 are diagrams illustrating a memory cell structure of a SRAM according to a sixth preferred embodiment of the invention. FIG. 16 is an explanatory diagram viewed from above the layout configuration in all layers. FIG. 17 is an explanatory diagram viewed from above mainly the layout configuration beneath a first aluminum wiring layer in FIG. 16. FIG. 18 is an explanatory diagram viewed from above the layout configuration over a second aluminum wiring layer in FIG. 16. Some reference numerals used in FIG. 17 or 18 are omitted in FIG. 16. An equivalent circuit of the SRAM memory cell having the layout configuration of the sixth preferred embodiment is similar to that of FIG. 15 described in the fifth preferred embodiment.

Referring to FIGS. 16 to 18, description will proceed to the memory cell structure of the sixth preferred embodiment.

In an $N^+$ diffusion region for NMOS transistors N3 and N4, the direction of formation of a source/drain region is located at an angle of 90° to the direction of formation of a source/drain region of NMOS transistors N1, N2 and PMOS transistors P1, P2. That is, diffusion regions FL242 and FL243 for the NMOS transistor N3, and diffusion regions FL232 and FL233 for the NMOS transistor N4, are disposed in the lateral direction viewing the drawing.

A bit line BLB1 over the diffusion region FL243 is electrically connected through a diffusion contact hole 1C to the diffusion region FL243. A bit line BLB2 (second layer aluminum wiring) is electrically connected through a via hole 1T to the bit line BLB1 (not shown in FIG. 18).

Likewise, a bit line BLA1 over the diffusion region FL232 constituting the NMOS transistor N3 is electrically connected through a diffusion contact hole 1C to the diffusion region FL232. A bit line BLA2 (second layer aluminum wiring) is electrically connected through a via hole 1T to the bit line BLA1 (not shown in FIG. 18).

The bit lines BLA2 and BLB2 are disposed parallel with each other, across P well regions PW0, PW1 and an N well region NW.

A ground wiring LG1 is electrically connected through a diffusion contact hole 1C to diffusion regions FL210 and FL221. A ground wiring LG2 is electrically connected through a via hole 1T to the ground wiring LG1 (not shown in FIG. 18). A ground wiring LG3 is electrically connected through a via hole 2T to the ground wiring LG2.

A power supply wiring LV1 is electrically connected through a diffusion contact hole 1C to diffusion regions FL110 and FL121. A power supply wiring LV2 is electrically connected through a via hole 1T to the power supply wiring LV1 (not shown in FIG. 18). A power supply wiring LV3 is electrically connected through a via hole 2T to the power supply wiring LV2.

A word line WLA1 is electrically connected through a gate contact hole GC to a polysilicon wiring PL23. A word line WLA2 is electrically connected through a via hole 1T to the word line WLA1 (not shown in FIG. 18). A word line WLA3 (third layer aluminum wiring) is electrically connected through a via hole 2T to the word line WLA2.

Likewise, a word line WLB1 is electrically connected through a gate contact hole GC to a polysilicon wiring PL24. A word line WLB2 is electrically connected through a via hole 1T to the word line WLB1 (not shown in FIG. 18). A word line WLB3 (third layer aluminum wiring) is electrically connected through a via hole 2T to the word line WLB2.

The (first) ground wiring LG3, word line WLB3, power supply wiring LV3, word line WLA3 and (second) ground wiring LG3 are disposed parallel with each other in the longitudinal direction viewing the drawing. The (first) ground wiring LG3 and word line WLB3 are disposed over the P well region PW0. The power supply wiring LV3 is disposed over the N well region NW. The word line WLA3 and (second) ground wiring LG3 are disposed over the P well region PW1.

The sixth preferred embodiment having the foregoing memory cell structure produces the effect equivalent to that inherent in the fifth preferred embodiment, in addition to the first to third, fifth and sixth effects of the first preferred embodiment.

Seventh Preferred Embodiment

Figure 19:
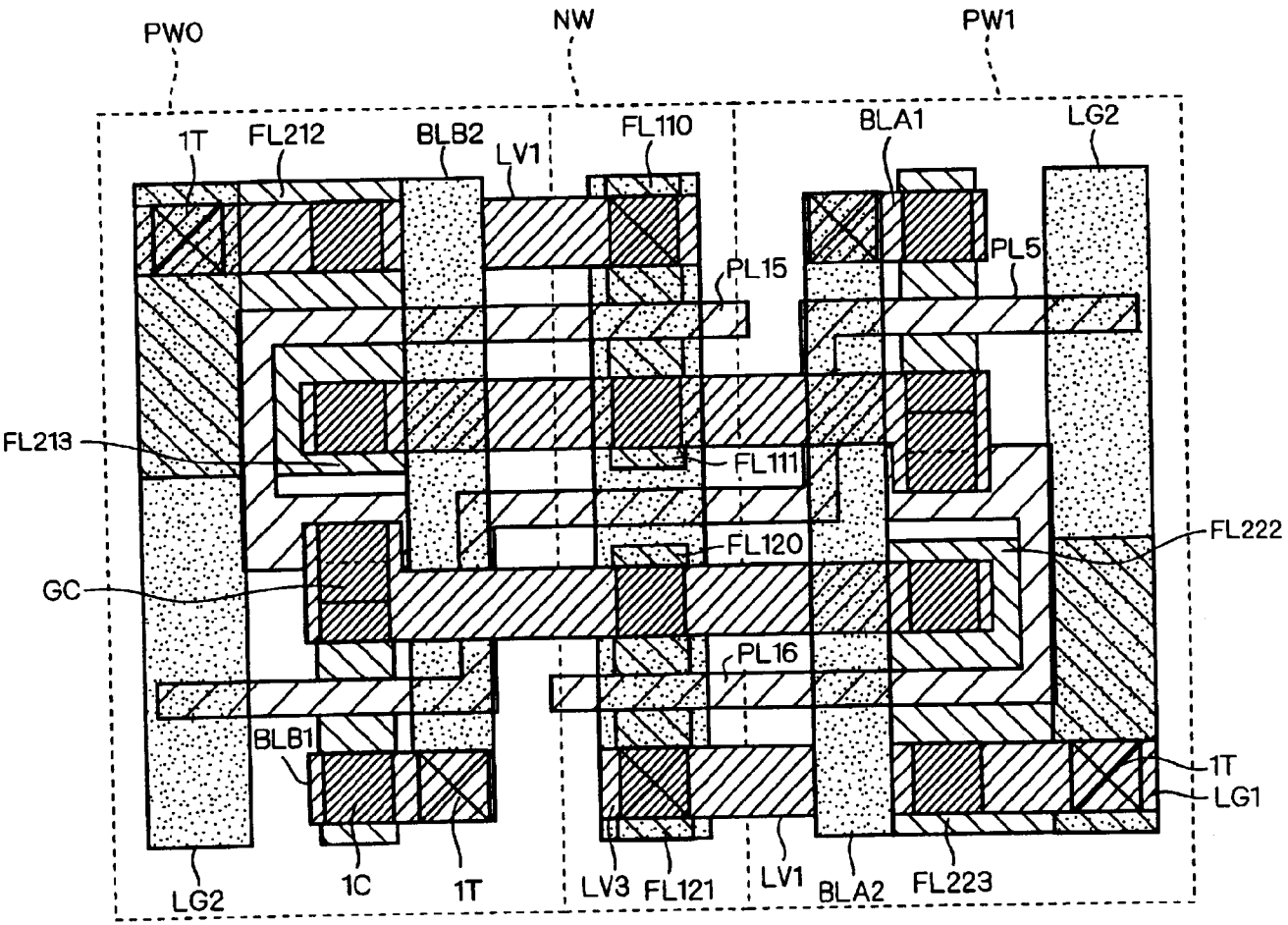
FIG. 19 is an explanatory diagram viewed from above the layout configuration in all layers of a SRAM memory cell according to a seventh preferred embodiment of the invention.
Figure 20:
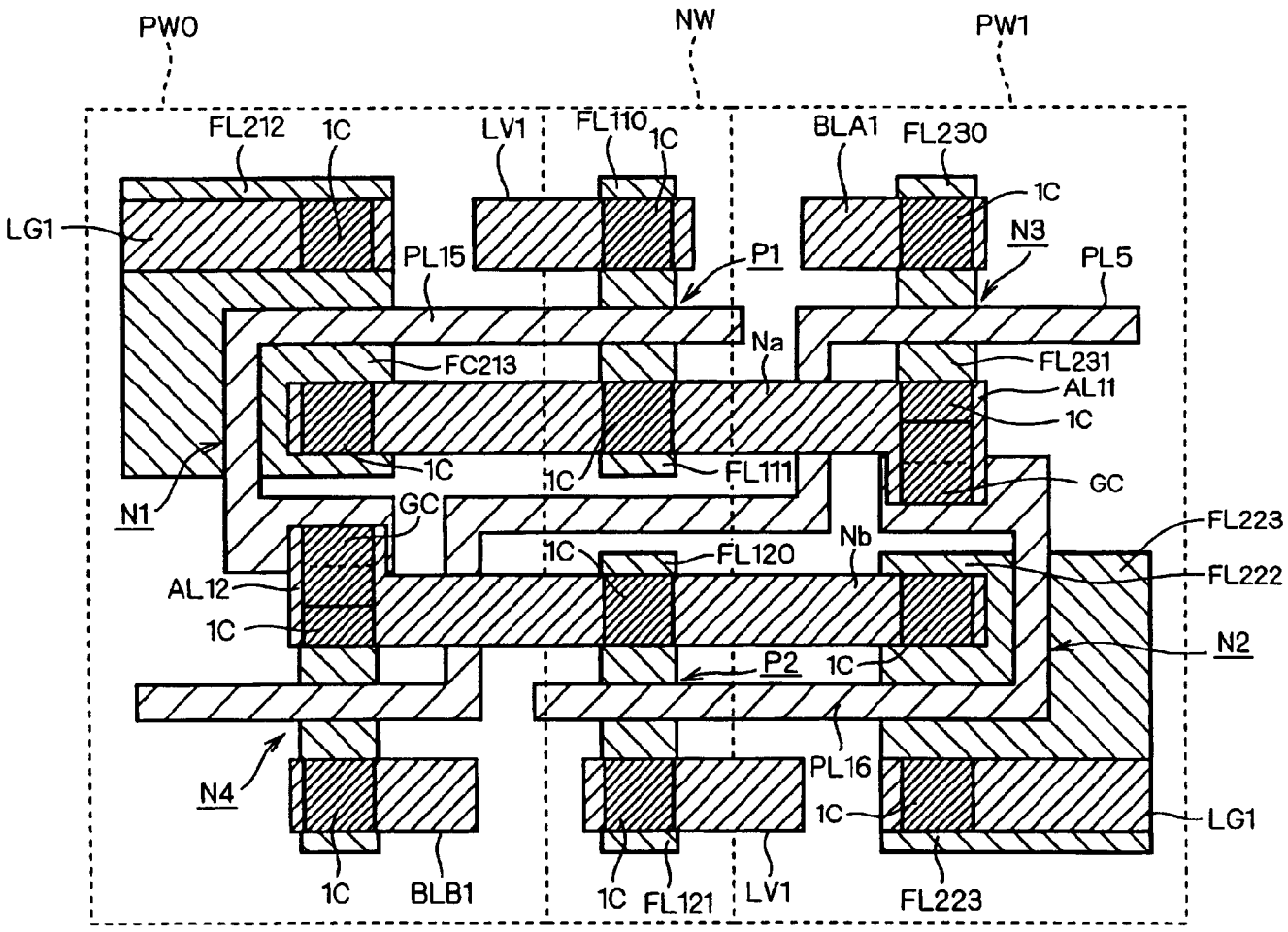
FIG. 20 is an explanatory diagram viewed from above mainly the layout configuration beneath a first aluminum wiring layer in FIG. 19.
Figure 21:
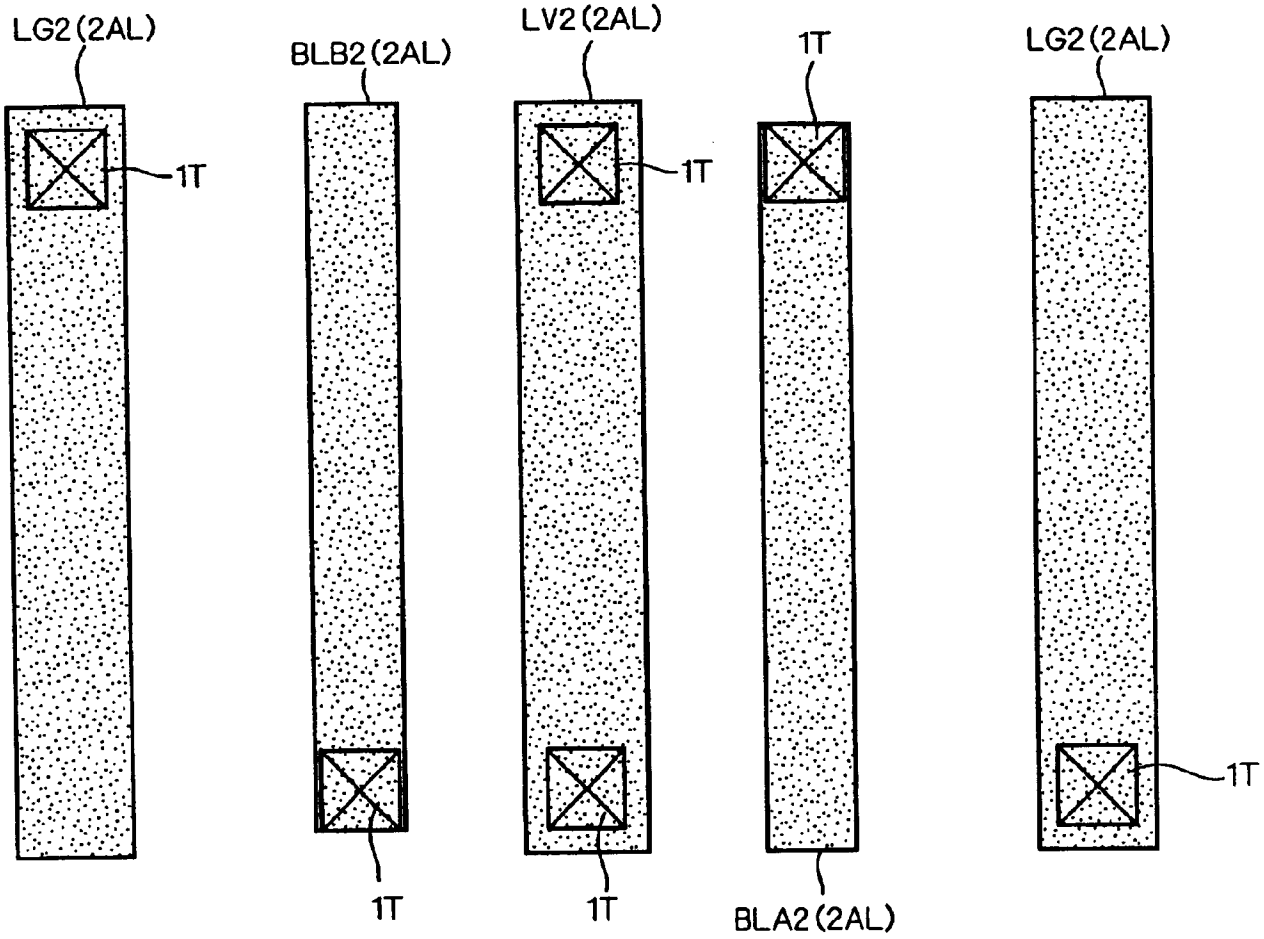
FIG. 21 is an explanatory diagram viewed from above mainly the layout configuration over a second aluminum wiring layer in FIG. 19.

FIGS. 19 to 21 are diagrams illustrating a memory cell structure of a SRAM according to a seventh preferred embodiment of the invention. FIG. 19 is an explanatory diagram viewed from above the layout configuration in all layers. FIG. 20 is an explanatory diagram viewed from above mainly the layout configuration beneath a first aluminum wiring layer in FIG. 19. FIG. 21 is an explanatory diagram viewed from above the layout configuration over a second aluminum wiring layer in FIG. 19. Some reference numerals used in FIG. 20 or 21 are omitted in FIG. 19. An equivalent circuit of the SRAM memory cell having the layout configuration of the seventh preferred embodiment is similar to that of FIG. 4 in the first preferred embodiment.

Referring to FIGS. 19 to 21, description will proceed to the memory cell structure of the seventh preferred embodiment.

A common polysilicon wiring PL5 of NMOS transistors N3 and N4 extends over a P well region PW0, N well region NW and P well region PW1. The common polysilicon wiring PL5 is used as the word line WL of FIG. 4.

Otherwise, the configuration is similar to that of the second preferred embodiment described with respect to FIGS. 5, 6 and 3, except for the pattern shape of polysilicon wirings PL1 and PL2, the position of a gate contact hole GC between a polysilicon wiring PL1 and an aluminum wiring AL12, and the position of a gate contact hole GC between a polysilicon wiring PL2 and an aluminum wiring AL11.

The seventh preferred embodiment having the foregoing memory cell structure produces the same effects as the second preferred embodiment. In addition, since the word line WL does not require any of via holes 1T, 2T and word lines WL2, WL3, the number of necessary layers is reduced to lower the cost.

Eighth Preferred Embodiment

Figure 22:
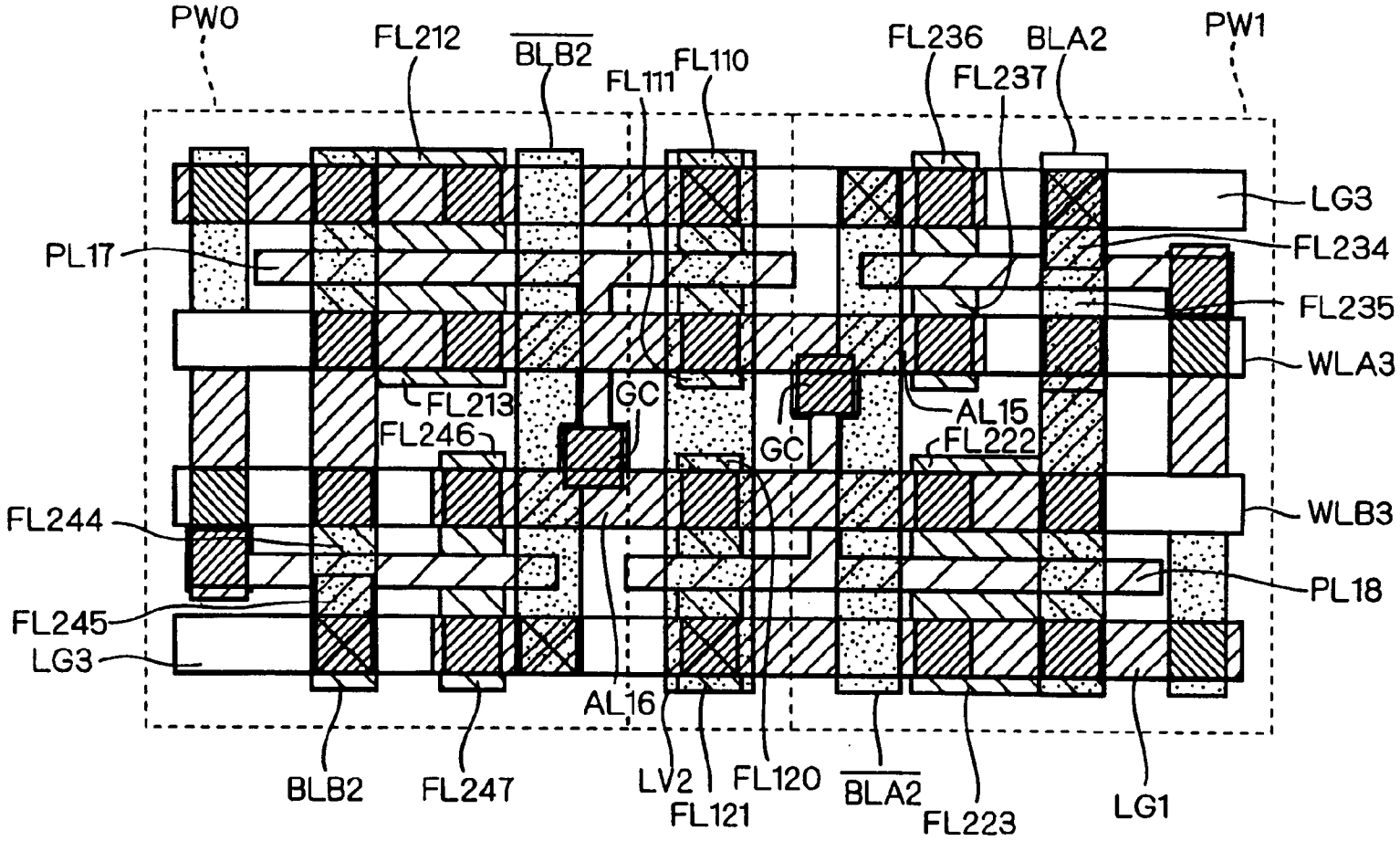
FIG. 22 is an explanatory diagram viewed from above the layout configuration in all layers of a SRAM memory cell according to an eighth preferred embodiment of the invention.
Figure 23:
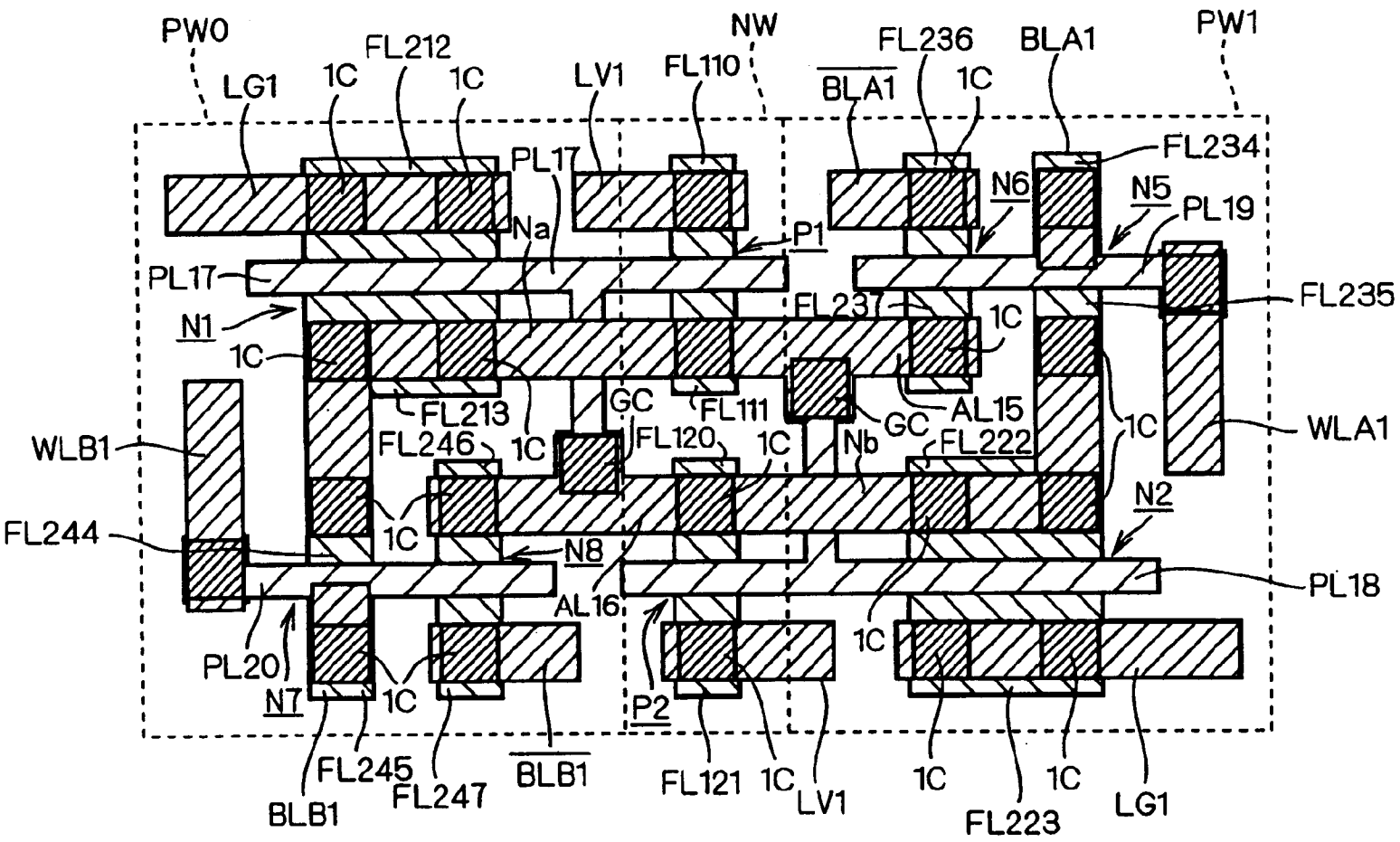
FIG. 23 is an explanatory diagram viewed from above mainly the layout configuration beneath a first aluminum wiring layer in FIG. 22.
Figure 24:
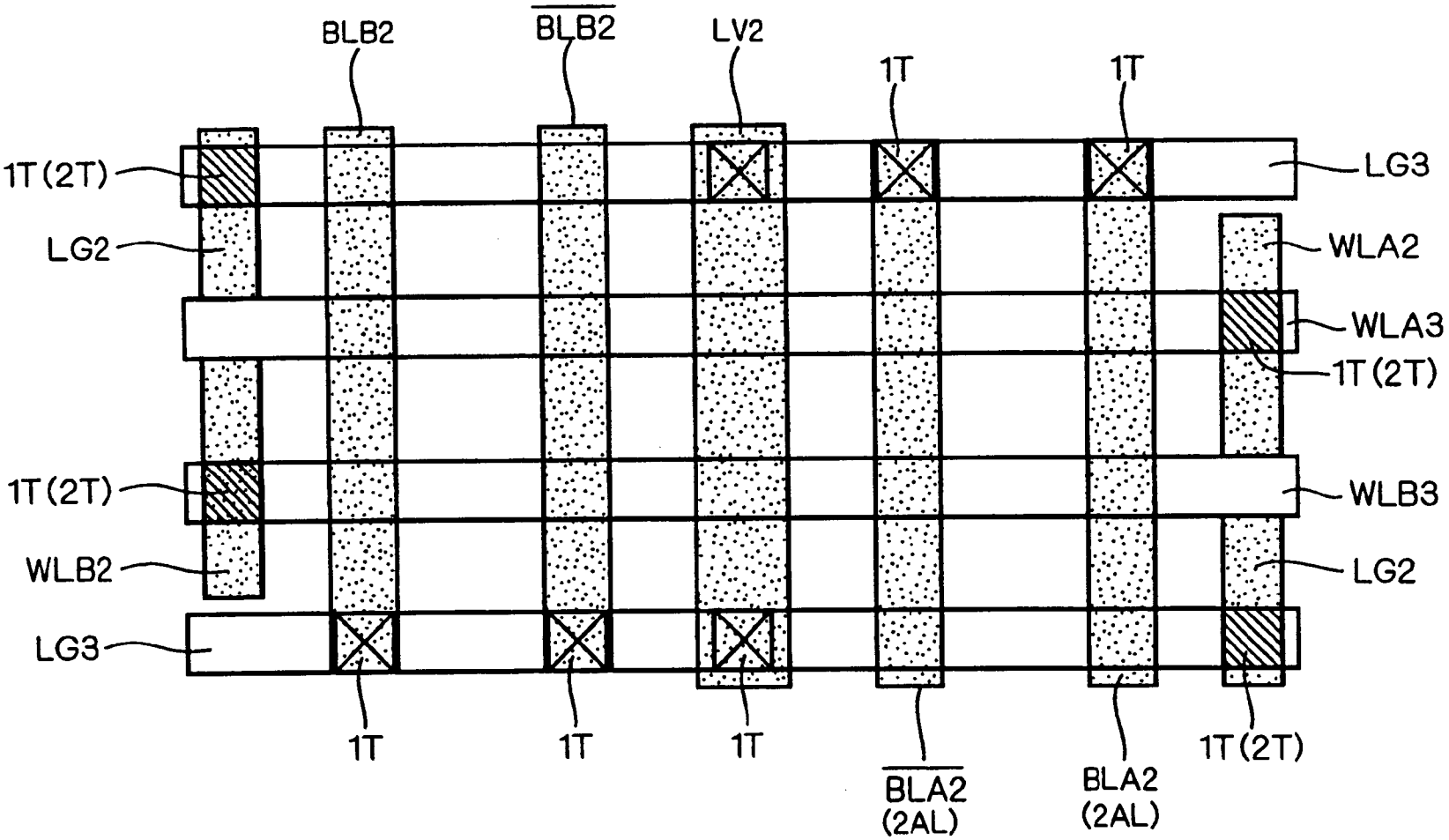
FIG. 24 is an explanatory diagram viewed from above mainly the layout configuration over a second aluminum wiring layer in FIG. 22.

FIGS. 22 to 25 are diagrams illustrating a memory cell structure of a SRAM according to an eighth preferred embodiment of the invention. FIG. 22 is an explanatory diagram viewed from above the layout configuration in all layers. FIG. 23 is an explanatory diagram viewed from above mainly the layout configuration beneath a first aluminum wiring layer in FIG. 22. FIG. 24 is an explanatory diagram viewed from above the layout configuration over a second aluminum wiring layer in FIG. 22. Some reference numerals used in FIG. 23 or 24 are omitted in FIG. 22.

Figure 25:
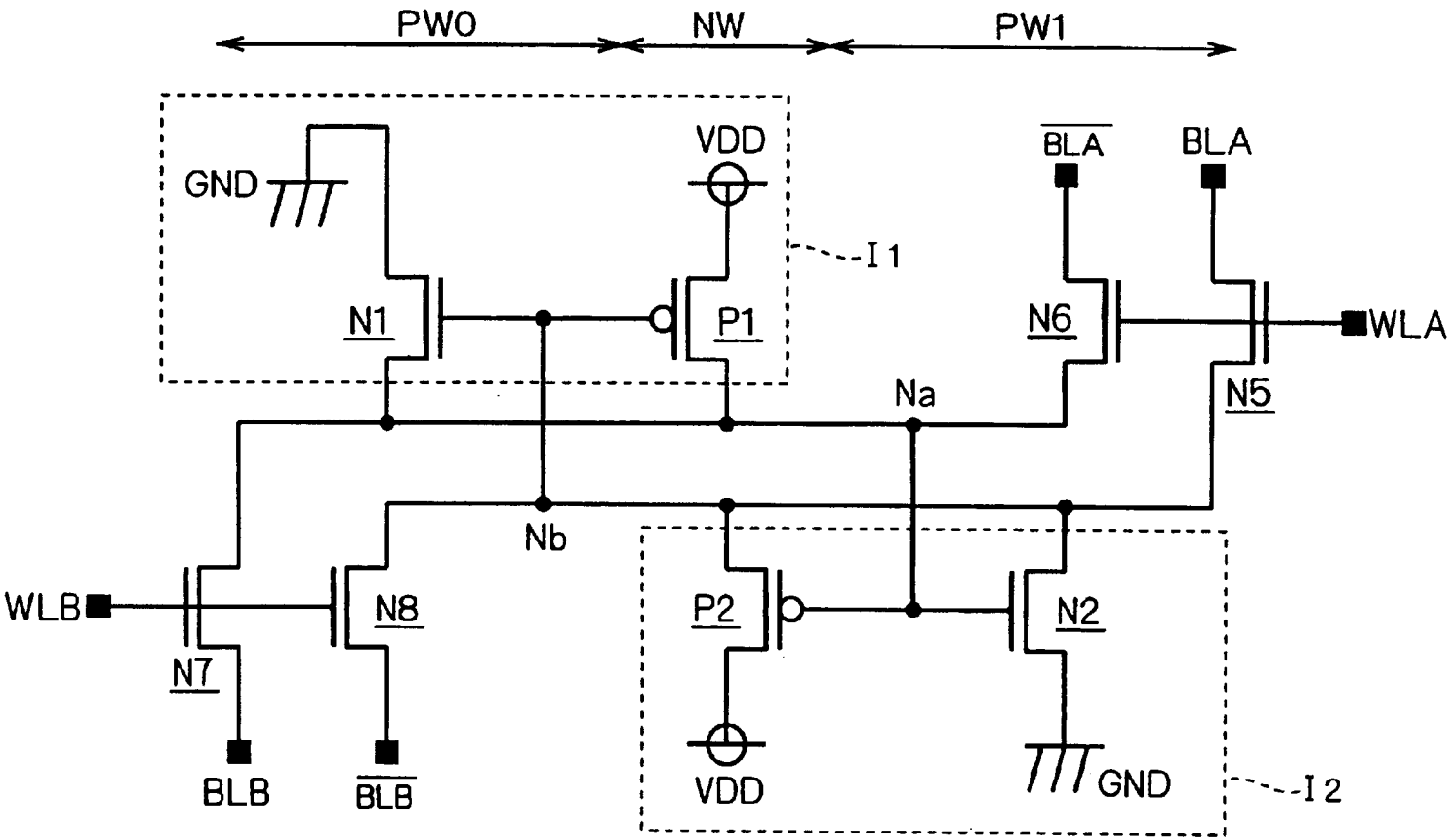
FIG. 25 is a circuit diagram illustrating an equivalent circuit of the memory cell in the eighth preferred embodiment.

FIG. 25 is a circuit diagram illustrating an equivalent circuit of the SRAM memory cell having the layout configuration shown in FIGS. 22 to 24. Referring to FIG. 25, the SRAM memory cell of the eighth preferred embodiment is made up of NMOS transistors N1, N2, N5 to N8, and PMOS transistors P1 and P2.

The NMOS transistor N5 is interposed between a bit line BLA and a storage terminal Nb. The NMOS transistor N6 is interposed between a bit line $\overline{\text{BLA}}$ and a storage terminal Na. The gates of the NMOS transistors N5 and N6 are both connected to a word line WLA.

The NMOS transistor N7 is interposed between a bit line BLB and a storage terminal Na. The NMOS transistor N8 is interposed between a bit line $\overline{\text{BLB}}$ and a storage terminal Nb. The gates of the NMOS transistors N7 and N8 are both connected to a word line WLB.

The PMOS transistors P1 and P2 that are driver transistors are disposed within an N well region NW. The NMOS transistor N1 that is a driver transistor and the NMOS transistors N7 and N8 that are access transistors are disposed within a P well region PW0. The NMOS transistor N2 that is a driver transistor and the NMOS transistors N5 and N6 that are access transistors are disposed within a P well region PW1. The P well regions PW0 and PW1 are oppositely disposed with the N well region NW interposed therebetween. Otherwise, the configuration is similar to that of the equivalent circuit of FIG. 15 described in the fifth preferred embodiment.

Referring to FIGS. 22 to 24, description will proceed to the memory cell structure of the eighth preferred embodiment.

In the N well region NW, the PMOS transistor P1 is made up of $P^+$ diffusion regions FL110, FL111 and a polysilicon wiring PL17, and the PMOS transistor P2 is made up of $P^+$ diffusion regions FL120, FL121 and a polysilicon wiring PL18.

In the P well region PW0, the NMOS transistor N1 is made up of $N^+$ diffusion regions FL212, FL213 and the polysilicon wiring PL17. The NMOS transistor N7 is made up of $N^+$ diffusion regions FL244, FL245 and a polysilicon wiring PL20. The NMOS transistor N8 is made up of $N^+$ diffusion regions FL246, FL247 and the polysilicon wiring PL20. The polysilicon wiring PL17 extends from the N well region NW to the P well region PW0, so as to be used as a gate common to the NMOS transistor N1 and PMOS transistor P1. The polysilicon wiring PL20 is common to the NMOS transistors N7 and N8.

In the P well region PW1, the NMOS transistor N2 is made up of $N^+$ diffusion regions FL222, FL223 and the polysilicon wiring PL18. The NMOS transistor N5 is made up of $N^+$ diffusion regions FL234, FL235 and a polysilicon wiring PL19. The NMOS transistor N3 is made up of $N^+$ diffusion regions FL236, FL237 and a polysilicon wiring PL19. The polysilicon wiring PL18 extends from the N well region NW to the P well region PW1, so as to be used as a gate common to the NMOS transistor N2 and PMOS transistor P2. The polysilicon wiring PL18 is common to the NMOS transistors N5 and N6. The foregoing diffusion regions are obtainable by implanting and diffusing impurity.

A ground wiring LG1 over the diffusion region FL212 is electrically connected through a diffusion contact hole 11C to the diffusion region FL212. A bit line BLB1 over the diffusion region FL245 is electrically connected through a diffusion contact hole 1C to the diffusion region FL245. A bit line $\overline{\text{BLB1}}$ over the diffusion region FL247 is electrically connected through a diffusion contact hole 1C to the diffusion region FL247.

An aluminum wiring AL15, which is a first layer aluminum wiring extending over the diffusion regions FL244, FL213, FL111 and FL237, is electrically connected through a diffusion contact hole 1C to the diffusion regions FL244, FL213, FL111 and FL237, respectively. The aluminum wiring AL15 is also disposed over part of the polysilicon wiring PL18, and is electrically connected through a gate contact hole GC to the polysilicon wiring PL18. The aluminum wiring AL15 can be electrically connected with low impedance, and it corresponds to the storage terminal Na.

A polysilicon wiring PL20 is electrically connected through a gate contact hole GC to a word line WLB1.

A power supply wiring LV1 over the diffusion region FL110 is electrically connected through a diffusion contact hole 1C to the diffusion region FL110. A power supply wiring LV1 over the diffusion region FL121 is electrically connected through a diffusion contact hole 1C to the diffusion region FL121.

The ground wiring LG1 is electrically connected through two diffusion contact holes 1C to the diffusion region FL223. A bit line BLA1 over the diffusion region FL234 is electrically connected through a diffusion contact hole 1C to the diffusion region FL234. A bit line $\overline{\text{BLA1}}$ over the diffusion region FL236 is electrically connected through a diffusion contact hole 1C to the diffusion region FL236.

An aluminum wiring AL16, which is a first layer aluminum wiring extending over the diffusion regions FL235, FL222, FL120 and FL246, is electrically connected through a diffusion contact hole 1C to the diffusion regions FL235, FL222, FL120 and FL246, respectively. The aluminum wiring AL16 is also disposed over part of the polysilicon wiring PL17, and is electrically connected through a gate contact hole GC to the polysilicon wiring PL17. The aluminum wiring AL16 can be electrically connected with low impedance, and it corresponds to the storage terminal Nb.

A word line WLA1 over a polysilicon wiring PL19 is electrically connected through a gate contact hole GC to the polysilicon wiring PL19.

A ground wiring LG1 is electrically connected through a via hole 1T to a ground wiring LG2, and the ground wiring LG2 is electrically connected through a via hole 2T to a ground wiring LG3.

The word line WLA1 is electrically connected through a via hole 1T to a word line WLA2, and the word line WLA2 is electrically connected through a via hole 2T to a word line WLA3. The word line WLA of FIG. 25 is made up of these word lines WLA1 to WLA3.

Likewise, a word line WLB1 is electrically connected through a via hole 1T to a word line WLB2, and the word line WLB2 is electrically connected through a via hole 2T to a word line WLB3. The word line WLB of FIG. 25 is made up of these word lines WLB1 to WLB3.

The word lines WLA3, WLB3, and ground wiring LG3 are disposed parallel with each other, across the P well regions PW0, PW1, and the N well region NW. Two ground wirings LG3 are disposed with the word lines WLA3 and WLB3 interposed therebetween.

A bit line BLA2 is electrically connected through a via hole 1T to a bit line BLA1, and a bit line BLB2 is electrically connected through a via hole 1T to a bit line BLB1.

Likewise, a bit line $\overline{\text{BLA2}}$ is electrically connected through a via hole 1T to a bit line $\overline{\text{BLA1}}$, and a bit line $\overline{\text{BLB2}}$ is electrically connected through a via hole 1T to a bit line $\overline{\text{BLB1}}$.

A power supply wiring LV2 is electrically connected through a via hole 1T to a power supply wiring LV1. The bit lines BLA, $\overline{BLA}$, BLB and $\overline{BLB}$, are made up of the bit lines BLA1 and BLA2; $\overline{BLA1}$ and $\overline{BLA2}$; BLB1 and BLB2; and $\overline{BLB1}$ and $\overline{BLB2}$, respectively.

The paired bit lines BLA2 and $\overline{BLA2}$, paired bit lines BLB2 and $\overline{BLB2}$, and the power supply wiring LV2 are disposed over the P well regions PW1, PW0 and N well region NW, respectively, so that these are parallel with each other in the longitudinal direction viewing the drawing.

Thus, in the memory cell structure of the SRAM of the eighth preferred embodiment, with the N well region NW interposed between the P well regions PW0 and PW1, the NMOS transistors N1, N7 and N8 are disposed in the P well region PW0, and the NMOS transistors N2, N5 and N6 are disposed in the P well region PW1. Thereby, the $N^+$ diffusion region FL213 and the $N^+$ diffusion region FL222 that are electrically connected to the storage terminals Na and Nb, respectively, can be separately formed in the different P well regions PW0 and PW1.

As a result, it is able to increase resistance to soft error, which is the first effect of the first preferred embodiment.

Since the P well regions PW0 and PW1 are separately formed in a direction vertical to the direction of formation of the paired bit lines BLA and $\overline{BLA}$, and the paired bit lines BLB and $\overline{BLB}$, the formation of the two P well regions PW0 and PW1 exerts no influence on the wiring length of the paired bit lines BLA and $\overline{BLA}$, and the paired bit lines BLB and $\overline{BLB}$. Hence, there is no possibility that the formation of the P well regions PW0 and PW1 increases the wiring length of the bit lines, thus maintaining a good access time. This corresponds to the second effect of the first preferred embodiment.

Since the NMOS transistors N1 and N2, the NMOS transistors N5 and N7, and the NMOS transistors N6 and N8, are respectively arranged so as to be point symmetry with respect to the central part of the memory cell (the central part of the N well region NW), the degree of integration can be increased when a plurality of the memory cells of the eighth preferred embodiment are disposed adjacent each other. This corresponds to the third effect of the first preferred embodiment.

The formation of the polysilicon wirings PL17 to PL20 in the same direction (the lateral direction viewing the drawing) facilitates the control of the gate dimension. Further, since the polysilicon wirings PL17 and PL19, and the polysilicon wirings PL18 and PL20, are respectively arranged in a straight line, no waste region is present and a reduction in the circuit area increases the degree of integration. This corresponds to the fourth effect of the first preferred embodiment.

By separately forming a region serving as a drain in the NMOS transistors N1, N2 and N5 to N8, resistance to soft error can be maintained at a high level. This corresponds to the fifth effect of the first preferred embodiment.

With the arrangement such that each of inverters I1 and I2 of a CMOS structure is made up of a combination of a NMOS transistor and a PMOS transistor, the memory cell can be realized by at least sufficient circuit configuration as a CMOS structure. This corresponds to the sixth effect of the first preferred embodiment.

In addition, the memory cell of the eighth preferred embodiment realizes a two-port memory cell which employs two word lines WLA and WLB, and two pairs of bit lines (the paired bit lines BLA and $\overline{BLA}$, and paired bit lines BLB and $\overline{BLB}$), as shown in FIG. 25.

Ninth Preferred Embodiment

Figure 26:
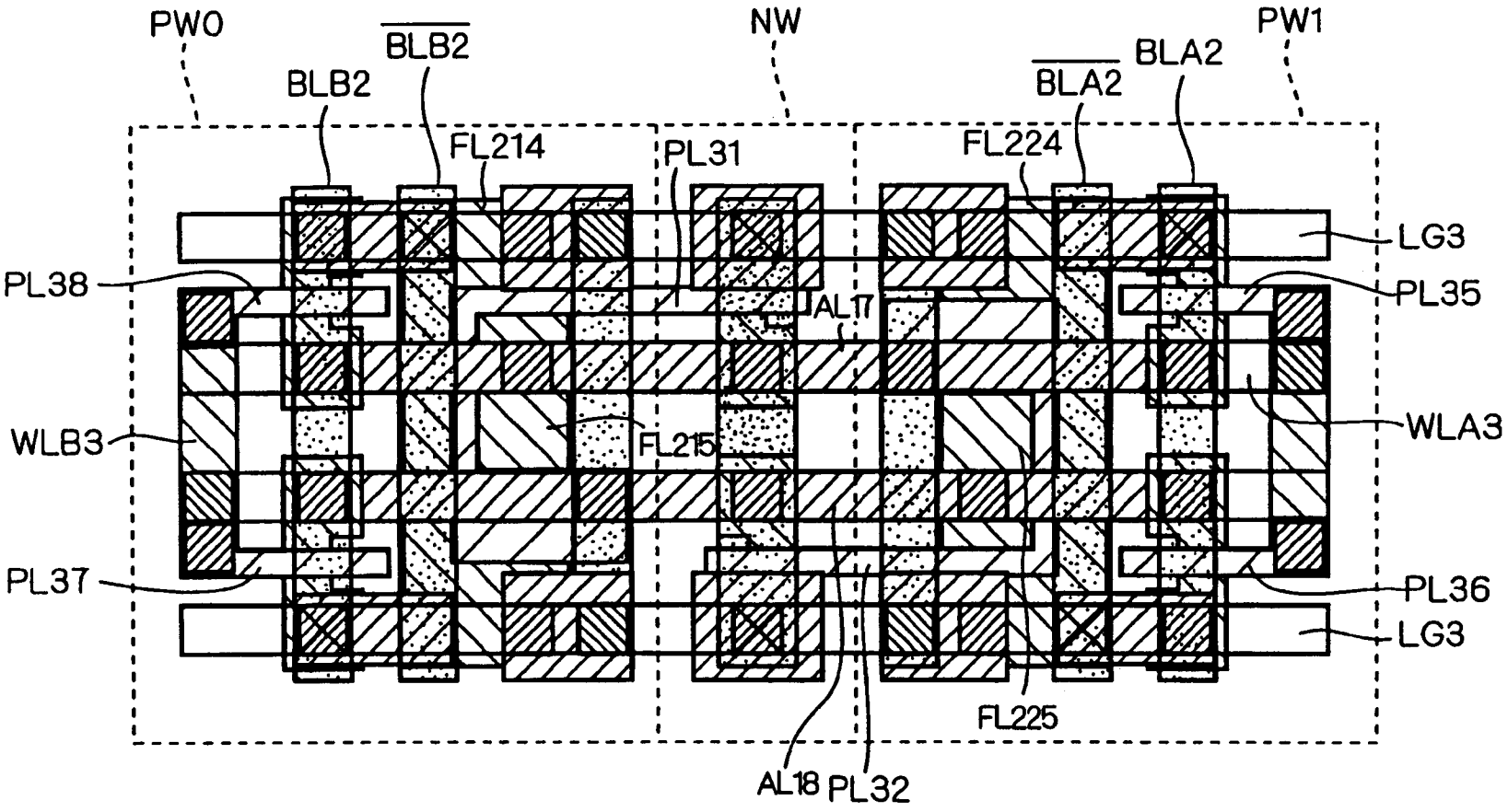
FIG. 26 is an explanatory diagram viewed from above the layout configuration in all layers of a SRAM memory cell according to a ninth preferred embodiment of the invention.
Figure 27:
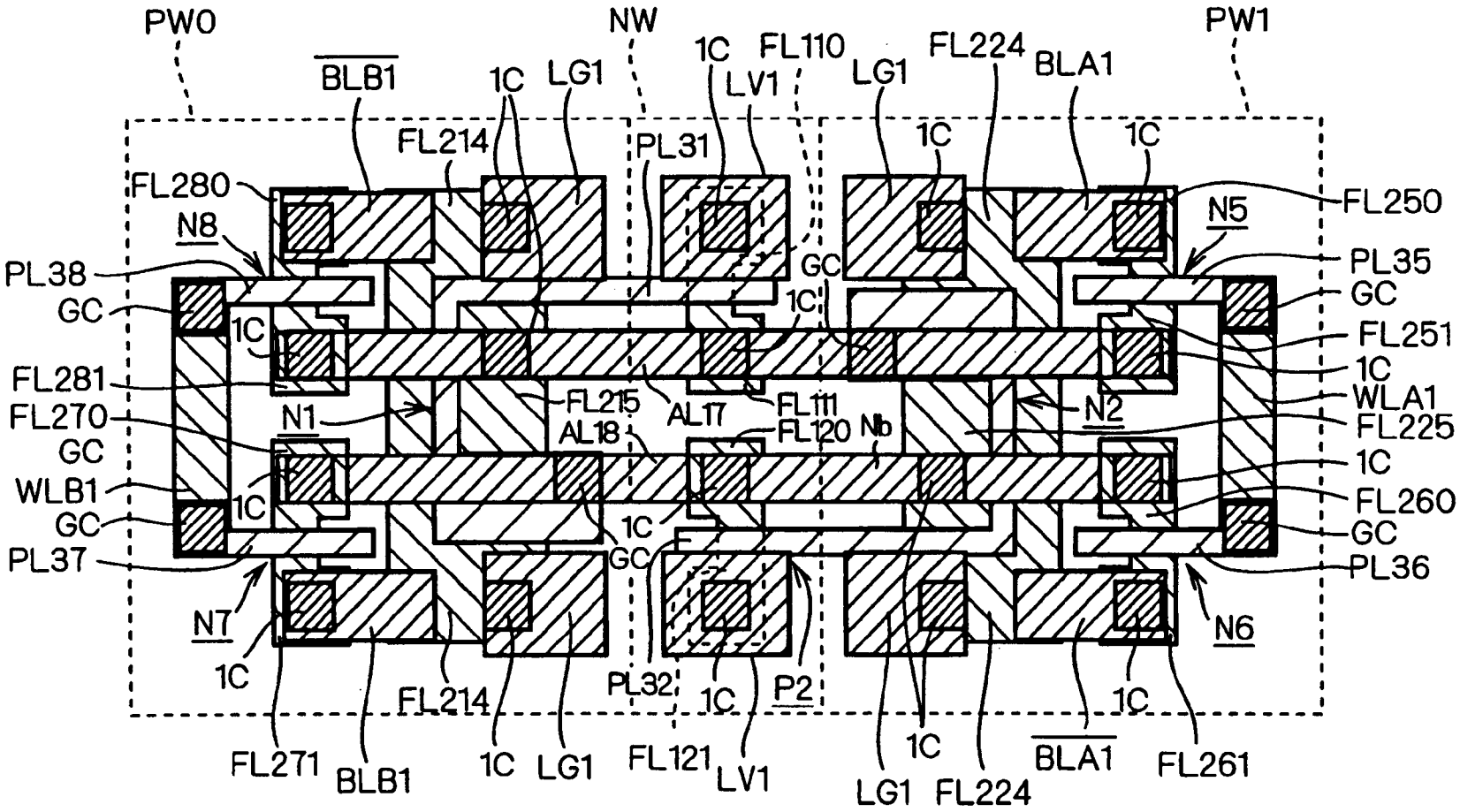
FIG. 27 is an explanatory diagram viewed from above mainly the layout configuration beneath a first aluminum wiring layer in FIG. 26.
Figure 28:
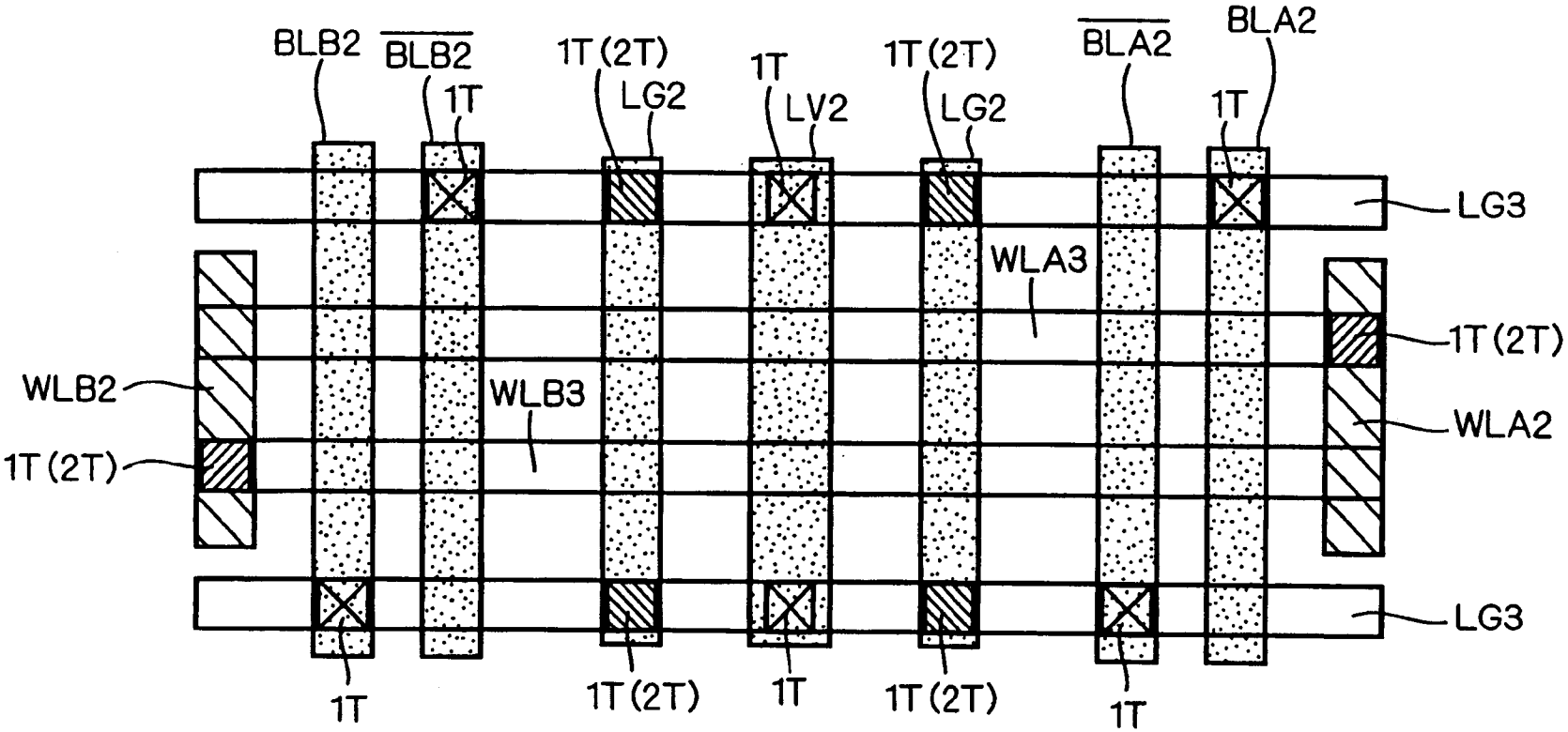
FIG. 28 is an explanatory diagram viewed from above mainly the layout configuration over a second aluminum wiring layer in FIG. 26.

FIGS. 26 to 28 are diagrams illustrating a memory cell structure of a SRAM according to a ninth preferred embodiment of the invention. FIG. 26 is an explanatory diagram viewed from above the layout configuration in all layers. FIG. 27 is an explanatory diagram viewed from above mainly the layout configuration beneath a first aluminum wiring layer in FIG. 26. FIG. 28 is an explanatory diagram viewed from above the layout configuration over a second aluminum wiring layer in FIG. 26. Some reference numerals used in FIG. 27 or 28 are omitted in FIG. 26.

An equivalent circuit of the SRAM memory cell having the layout configuration of the ninth preferred embodiment is similar to that of FIG. 25 in the eighth preferred embodiment.

Referring to FIGS. 26 to 28, the memory cell structure of the ninth preferred embodiment will be described particularly with regard to the different points from the eighth preferred embodiment.

In a P well region PW0, a NMOS transistor N1 is made up of $N^+$ diffusion regions FL214, FL215 and a polysilicon wiring PL31. Here, a considerably large gate width than that of other NMOS transistors N5 to N8 can be set by forming the polysilicon wiring PL31 by bending it 90° two times over the $N^+$ diffusion regions (FL214, FL215) for the NMOS transistor N1.

The NMOS transistor N7 is made up of $N^+$ diffusion regions FL270, FL271 and a polysilicon wiring PL37. The NMOS transistor N8 is made up of $N^+$ diffusion regions FL280, FL281 and a polysilicon wiring PL38.

The polysilicon wiring PL31 extends from an N well region NW to the P well region PW0, so as to be used as a gate common to the NMOS transistor N1 and a PMOS transistor P1.

In a P well region PW1, the NMOS transistor N2 is made up of $N^+$ diffusion regions FL224, FL225 and a polysilicon wiring PL32. Here, a considerably large gate width than that of the other NMOS transistors N5 to N8 can be set by forming the polysilicon wiring PL32 by bending it 90° two times over the $N^+$ diffusion regions (FL224, FL225) for the NMOS transistor N2.

The NMOS transistor N5 is made up of $N^+$ diffusion regions FL250, FL251 and a polysilicon wiring PL35. The NMOS transistor N6 is made up of $N^+$ diffusion regions FL260, FL261 and a polysilicon wiring PL36.

The polysilicon wiring PL32 extends from the N well region NW to the P well region PW0, so as to be used as a gate common to the NMOS transistor N2 and a PMOS transistor P2. The foregoing diffusion regions are obtainable by implanting and diffusing impurity.

Each of two ground wirings LG1 over the diffusion region FL214 is electrically connected through a diffusion contact hole 1C to the diffusion region FL214. A bit line BLB1 over the diffusion region FL271 is electrically connected through a diffusion contact hole 1C to the diffusion region FL271. A bit line $\overline{BLB1}$ over the diffusion region FL280 is electrically connected through a diffusion contact hole 1C to the diffusion region FL280.

An aluminum wiring AL17, which is a first layer aluminum wiring extending over the diffusion regions FL281, FL215, FL111, and FL251, is electrically connected through a diffusion contact hole 1C to the diffusion regions FL281, FL215, FL111 and FL251, respectively. The aluminum wiring AL17 is also disposed over part of the polysilicon wiring PL32, and is electrically connected through a gate contact hole GC to the polysilicon wiring PL32. The aluminum wiring AL17 can be electrically connected with low impedance, and it corresponds to a storage terminal Na.

The polysilicon wirings PL37 and PL38 are both electrically connected through a gate contact hole GC to a word line WLB1.

A power supply wiring LV1 over the diffusion region FL110 is electrically connected through a diffusion contact hole 1C to the diffusion region FL110. A power supply wiring LV1 over the diffusion region FL121 is electrically connected through a diffusion contact hole 1C to the diffusion region FL121.

Each of two ground wirings LG1 over the diffusion region FL224 is electrically connected through a diffusion contact hole 1C to the diffusion region FL224. A bit line BLA1 over the diffusion region FL250 is electrically connected through a diffusion contact hole 1C to the diffusion region FL250. A bit line $\overline{\text{BLA1}}$ over the diffusion region FL261 is electrically connected through a diffusion contact hole 1C to the diffusion region FL261.

An aluminum wiring AL18, which is a first layer aluminum wiring extending over the diffusion regions FL260, FL224, FL120 and FL270, is electrically connected through a diffusion contact hole 1C to the diffusion regions FL260, FL224, FL120 and FL270, respectively. The aluminum wiring AL18 is also disposed over part of the polysilicon wiring PL31, and is electrically connected through a gate contact hole GC to the polysilicon wiring PL31. The aluminum wiring AL18 can be electrically connected with low impedance, and it corresponds to a storage terminal Nb.

A word line WLA1 over the polysilicon wirings PL35 and PL36 is electrically connected through a gate contact hole GC to the polysilicon wirings PL35 and PL36, respectively.

A ground wiring LG1 is electrically connected through a via hole 1T to a ground wiring LG2, and the ground wiring LG2 is electrically connected through a via hole 2T to a ground wiring LG3.

A word line WLA1 is electrically connected through a via hole 1T to a word line WLA2, and the word line WLA2 is electrically connected through a via hole 2T to a word line WLA3. Likewise, a word line WLB1 is electrically connected through a via hole 1T to a word line WLB2, and the word line WLB2 is electrically connected through a via hole 2T to a word line WLB3.

A bit line BLA2 is electrically connected through a via hole 1T to a bit line BLA1. A bit line BLB2 is electrically connected through a via hole 1T to a bit line BLB1.

Likewise, a bit line $\overline{\text{BLA2}}$ is electrically connected through a via hole 1T to a bit line $\overline{\text{BLA1}}$, and a bit line $\overline{\text{BLB2}}$ is electrically connected through a via hole 1T to a bit line $\overline{\text{BLB1}}$. A power supply wiring LV2 is electrically connected through a via hole 1T to a power supply wiring LV1.

Thus, in the memory cell structure of the SRAM of the ninth preferred embodiment, with the N well region NW interposed between the P well regions PW0 and PW1, the NMOS transistors N1, N7 and N8 are disposed in the P well region PW0, and the NMOS transistors N2, N5 and N6 are disposed in the P well region PW1. This enables to increase resistance to soft error, which is the first effect of the first preferred embodiment.

By separately forming the P well regions PW0 and PW1 in a direction vertical to the direction of formation of the paired bit lines BLA and $\overline{\text{BLA}}$ and the paired bit lines BLB and $\overline{\text{BLB}}$, it is able to maintain a good access time, which is the second effect of the first preferred embodiment.

Further, in the ninth preferred embodiment, as in the eighth preferred embodiment, the NMOS transistors N1 and N2, the NMOS transistors N5 and N7, and the NMOS transistors N6 and N8, are respectively arranged so as to be point symmetry with respect to the central part of the memory cell. It is therefore able to increase the degree of integration when a plurality of the memory cells of the ninth preferred embodiment are disposed adjacent each other. This corresponds to the third effect of the first preferred embodiment.

Furthermore, by separately forming a region serving as a drain in the NMOS transistors N1, N2 and N5 to N8, resistance to soft error can be maintained at a high level. This corresponds to the fifth effect of the first preferred embodiment.

By arranging such that each of inverters I1 and I2 of a CMOS structure is made up of a combination of a NMOS transistor and a PMOS transistor, the memory cell can be realized by at least sufficient circuit configuration as a CMOS structure. This corresponds to the sixth effect of the first preferred embodiment.

Like the eighth preferred embodiment, the memory cell of the ninth preferred embodiment can be used as a two-port memory cell.

Additionally, as in the second preferred embodiment, it is able to increase the operation speed and the stability of the memory cell by increasing the gate width (channel width) of the NMOS transistors N1 and N2, each being a driver transistor.

Tenth Preferred Embodiment

Figure 29:
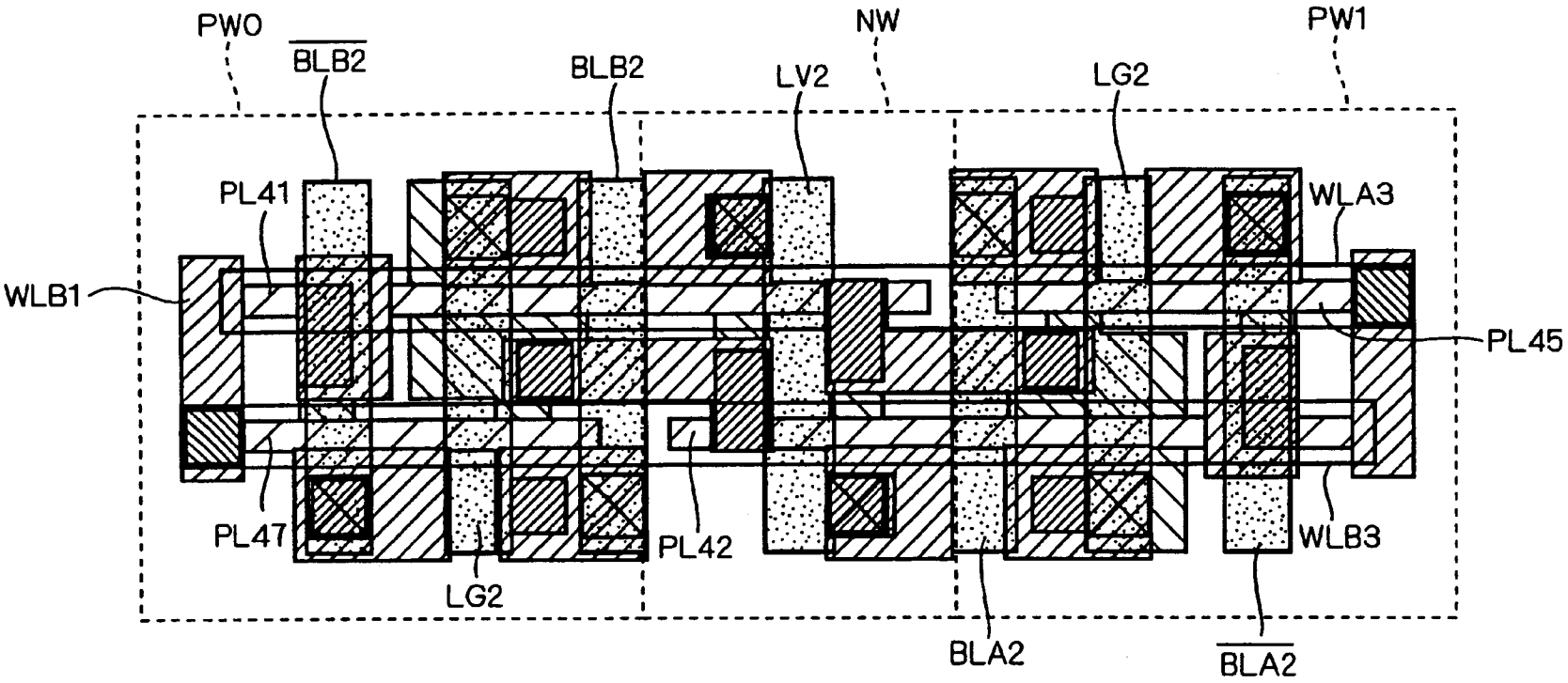
FIG. 29 is an explanatory diagram viewed from above the layout configuration in all layers of a SRAM memory cell according to a tenth preferred embodiment of the invention.
Figure 30:
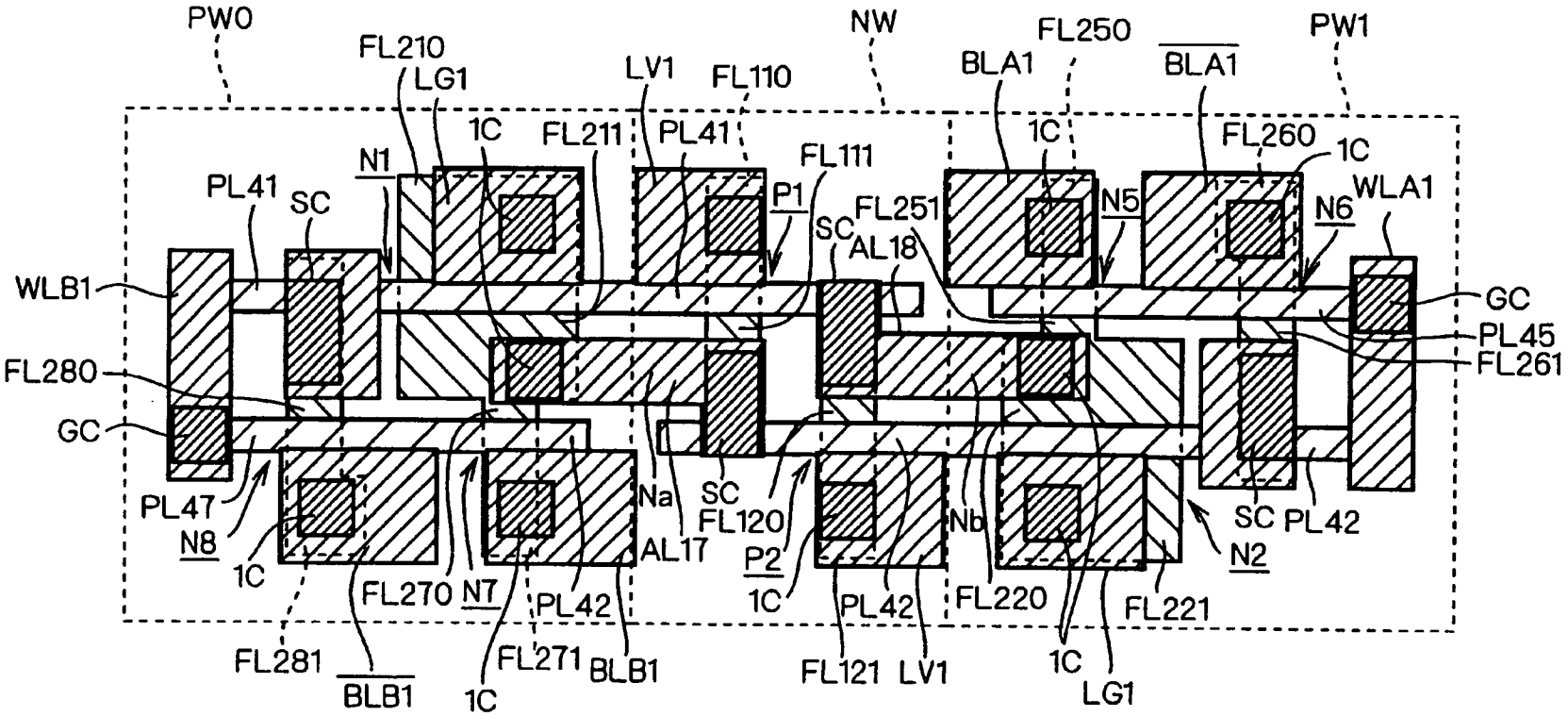
FIG. 30 is an explanatory diagram viewed from above mainly the layout configuration beneath a first aluminum wiring layer in FIG. 29.
Figure 31:
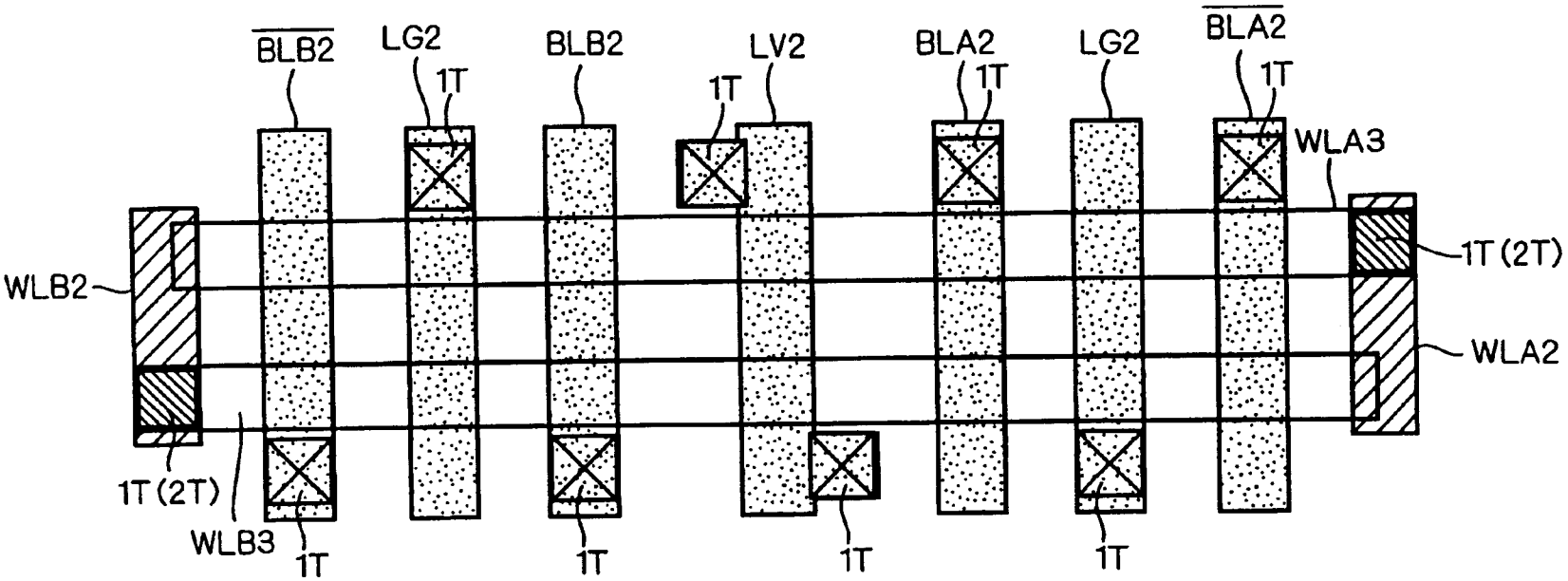
FIG. 31 is an explanatory diagram viewed from above mainly the layout configuration over a second aluminum wiring layer in FIG. 29.

FIGS. 29 to 31 are diagrams illustrating a memory cell structure of a SRAM according to a tenth preferred embodiment of the invention. FIG. 29 is an explanatory diagram viewed from above the layout configuration in all layers. FIG. 30 is an explanatory diagram viewed from above mainly the layout configuration beneath a first aluminum wiring layer in FIG. 29. FIG. 31 is an explanatory diagram viewed from above the layout configuration over a second aluminum wiring layer in FIG. 29. Some reference numerals used in FIG. 30 or 31 are omitted in FIG. 29.

An equivalent circuit of the SRAM memory cell having the layout configuration of the tenth preferred embodiment is similar to that of FIG. 25 in the eighth preferred embodiment.

Referring to FIGS. 29 to 31, description will proceed to the memory cell structure of the tenth preferred embodiment.

In an N well region NW, a PMOS transistor P1 is made up of $P^+$ diffusion regions FL110, FL111 and a polysilicon wiring PL41, and a PMOS transistor P2 is made up of $P^+$ diffusion regions FL120, FL121 and a polysilicon wiring PL42.

In a P well region PW0, a NMOS transistor N1 is made up of $N^+$ diffusion regions FL210, FL211 and the polysilicon wiring PL41, a NMOS transistor N7 is made up of $N^+$ diffusion regions FL270, FL271 and a polysilicon wiring PL47, and a NMOS transistor N8 is made up of $N^+$ diffusion regions FL280, FL281 and the polysilicon wiring PL47. The polysilicon wiring PL41 extends from the N well region NW to the P well region PW0, so as to be used as a gate common to the NMOS transistor N1 and PMOS transistor P1. The polysilicon wiring PL47 is common to the NMOS transistors N7 and N8.

In a P well region PW1, a NMOS transistor N2 is made up of $N^+$ diffusion regions FL220, FL221 and the polysilicon wiring PL42, a NMOS transistor N5 is made up of $N^+$ diffusion regions FL250, FL251 and a polysilicon wiring PL45, and a NMOS transistor N6 is made up of $N^+$ diffusion regions FL260, FL261 and the polysilicon wiring PL45. The polysilicon wiring PL42 extends from the N well region NW to the P well region PW1, so as to be used as a gate common to the NMOS transistor N2 and PMOS transistor P2. The polysilicon wiring PL42 is common to the NMOS transistors N5 and N6. The foregoing diffusion regions are obtainable by implanting and diffusing impurity.

A ground wiring LG1 over the diffusion region FL210 is electrically connected through a diffusion contact hole 1C to the diffusion region FL210. A bit line BLB1 over the diffusion region FL271 is electrically connected through a diffusion contact hole 1C to the diffusion region FL271. A bit line $\overline{BLB1}$ over the diffusion region FL281 is electrically connected through a diffusion contact hole 1C to the diffusion region FL281.

An aluminum wiring AL17, which is a first layer aluminum wiring extending over the diffusion region FL270 (FL211) and the diffusion region FL111, is electrically connected through a diffusion contact hole 1C to the diffusion regions FL270 (FL211) and FL111, respectively.

The aluminum wiring AL17 is also electrically connected to the polysilicon wiring PL42. The polysilicon wiring PL42 is electrically connected through a shared contact SC to the diffusion regions FL111 and FL261, respectively. As used herein, the term "shared contact" means a common contact electrically connecting a diffusion region and polysilicon.

The aluminum wiring AL17 can be electrically connected with low impedance. The aluminum wiring AL17, two shared contacts SC and polysilicon wiring PL42 correspond to a storage terminal Na.

The polysilicon wiring PL47 is electrically connected through a gate contact hole GC to a word line WLB1.

A power supply wiring LV1 over the diffusion region FL110 is electrically connected through a diffusion contact hole 1C to the diffusion region FL110. A power supply wiring LV1 over the diffusion region FL121 is electrically connected through a diffusion contact hole 1C to the diffusion region FL121.

A ground wiring LG1 is electrically connected through a diffusion contact hole 1C to the diffusion region FL221. A bit line BLA1 over the diffusion region FL250 is electrically connected through a diffusion contact hole 1C to the diffusion region FL250. A bit line $\overline{BLA1}$ over the diffusion region FL260 is electrically connected through a diffusion contact hole 1C to the diffusion region FL260.

An aluminum wiring AL18, which is a first layer aluminum wiring extending over the diffusion region FL251 (FL220) and the diffusion region FL120, is electrically connected through a diffusion contact hole 1C to the diffusion regions FL251 (FL220).

The aluminum wiring AL18 is also electrically connected to the polysilicon wiring PL41. The polysilicon wiring PL41 is electrically connected through a shared contact SC to the diffusion regions FL120 and FL280, respectively.

The aluminum wiring AL18 can be electrically connected with low impedance. The aluminum wiring AL18, two shared contacts SC and polysilicon wiring PL41 correspond to a storage terminal Nb.

A word line WLA1 over the polysilicon wiring PL45 is electrically connected through a gate contact hole GC to the polysilicon wiring PL45.

A word line WLA1 is electrically connected through a via hole 1T to a word line WLA2, and the word line WLA2 is electrically connected through a via hole 2T to a word line WLA3. Likewise, a word line WLB1 is electrically connected through a via hole 1T to a word line WLB2, and the word line WLB2 is electrically connected through a via hole 2T to a word line WLB3.

The word lines WLA3 and WLB3 are disposed parallel with each other, across the P well regions PW0, PW1, and the N well region NW.

A bit line BLA2 is electrically connected through a via hole 1T to a bit line BLA1. A bit line BLB2 is electrically connected through a via hole 1T to a bit line BLB1.

Likewise, a bit line $\overline{BLA2}$ is electrically connected through a via hole 1T to a bit line $\overline{BLA1}$. A bit line $\overline{BLB2}$ is electrically connected through a via hole 1T to a bit line $\overline{BLB1}$.

A power supply wiring LV2 is electrically connected through a via hole 1T to a power supply wiring LV1. A ground wiring LG1 is electrically connected through a via hole 1T to a ground wiring LG2.

The paired bit lines BLA2 and $\overline{BLA2}$, paired bit lines BLB2 and $\overline{BLB2}$, ground wiring LG2 and power supply wiring LV2 are disposed parallel with each other in the longitudinal direction viewing the drawing.

The paired bit lines BLA2 and $\overline{BLA2}$ and the ground wiring LG2 are disposed over the P well region PW1. The paired bit lines BLB2 and $\overline{BLB2}$ and the ground wiring LG2 are disposed over the P well region PW0. The power supply wiring LV2 is disposed over the N well region NW.

Thus, in the memory cell structure of the SRAM of the tenth preferred embodiment, with the N well region NW interposed between the P well regions PW0 and PW1, the NMOS transistors N1, N7 and N8 are disposed in the P well region PW0, and the NMOS transistors N2, N5 and N6 are disposed in the P well region PW1. This enables to increase resistance to soft error, which is the first effect of the first preferred embodiment.

By separately forming the P well regions PW0 and PW1 in a direction vertical to the direction of formation of the paired bit lines BLA and $\overline{BLA}$ and the paired bit lines BLB and $\overline{BLB}$, it is able to maintain a good access time, which is the second effect of the first preferred embodiment.

Further, in the tenth preferred embodiment as in the eighth preferred embodiment, the NMOS transistors N1 and N2, the NMOS transistors N5 and N7, and the NMOS transistors N6 and N8, are respectively arranged so as to be point symmetry with respect to the central part of the memory cell. It is therefore able to increase the degree of integration when a plurality of the memory cells of the tenth preferred embodiment are disposed adjacent each other. This corresponds to the third effect of the first preferred embodiment.

The memory cell of the tenth preferred embodiment realizes a two-port memory cell, as in the eighth preferred embodiment.

The formation of the polysilicon wirings PL41, PL42, PL47 and PL48 in approximately the same direction (the lateral direction viewing the drawing) facilitates the control of the gate dimension. Further, because the polysilicon wirings PL41 and PL45, and the polysilicon wirings PL42 and PL47, are respectively disposed in a straight line, no waste region is present and a reduction in the circuit area increases the degree of integration. This corresponds to the fourth effect of the first preferred embodiment.

By arranging such that each of inverters I1 and I2 of a CMOS structure is made up of a combination of a NMOS transistor and a PMOS transistor, the memory cell can be realized by at least sufficient circuit configuration as a CMOS structure. This corresponds to the sixth effect of the first preferred embodiment.

In addition, with the arrangement that the storage terminal Na is made up of the aluminum wiring AL17, shared contacts SC and polysilicon wiring PL42, and the storage terminal Nb is made up of the aluminum wiring AL18, shared contacts SC and polysilicon wiring PL41, it is able to increase the degree of integration by the amount that the well forming width in the longitudinal direction viewing the drawing can be formed by a two-transistor pitch.

Eleventh Preferred Embodiment

Figure 32:
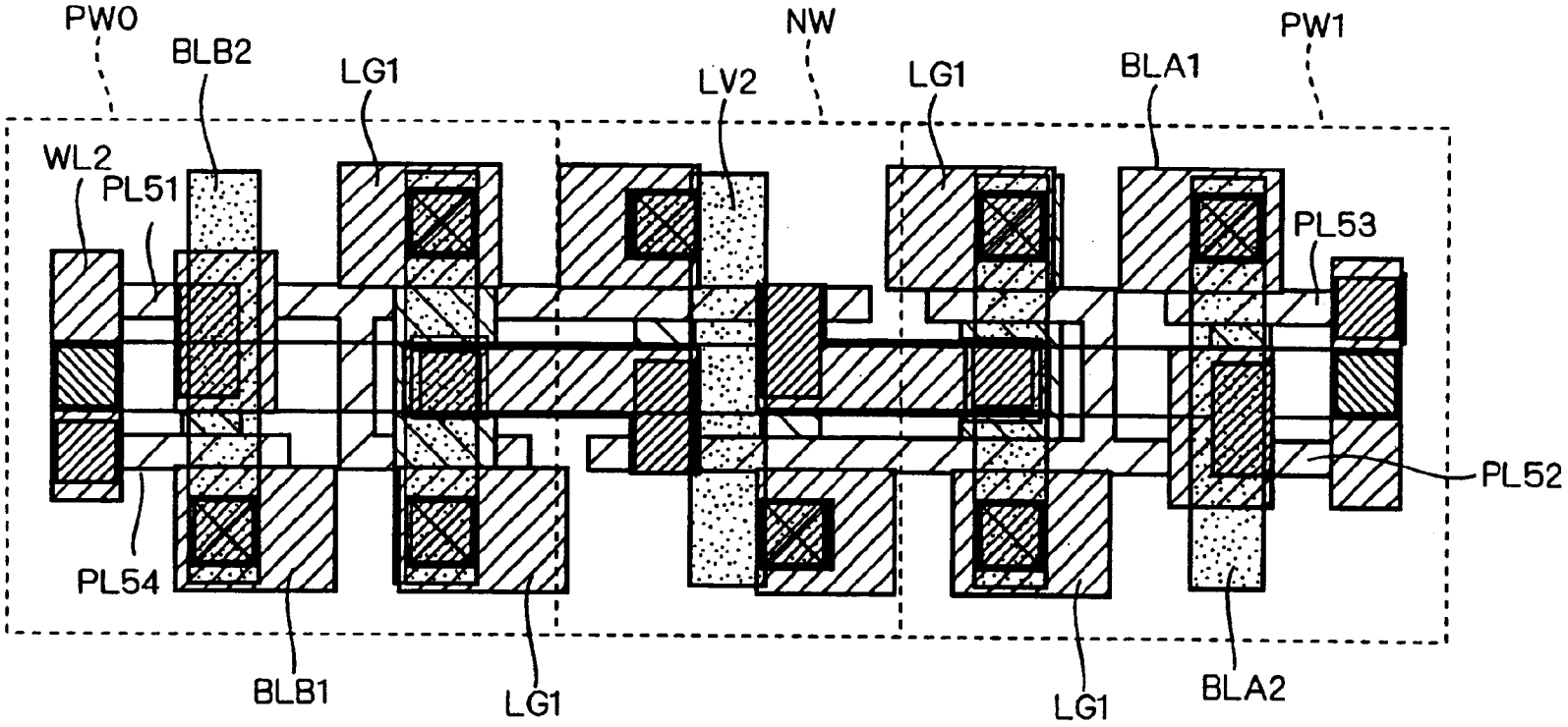
FIG. 32 is an explanatory diagram viewed from above the layout configuration in all layers of a SRAM memory cell according to an eleventh preferred embodiment of the invention.
Figure 33:
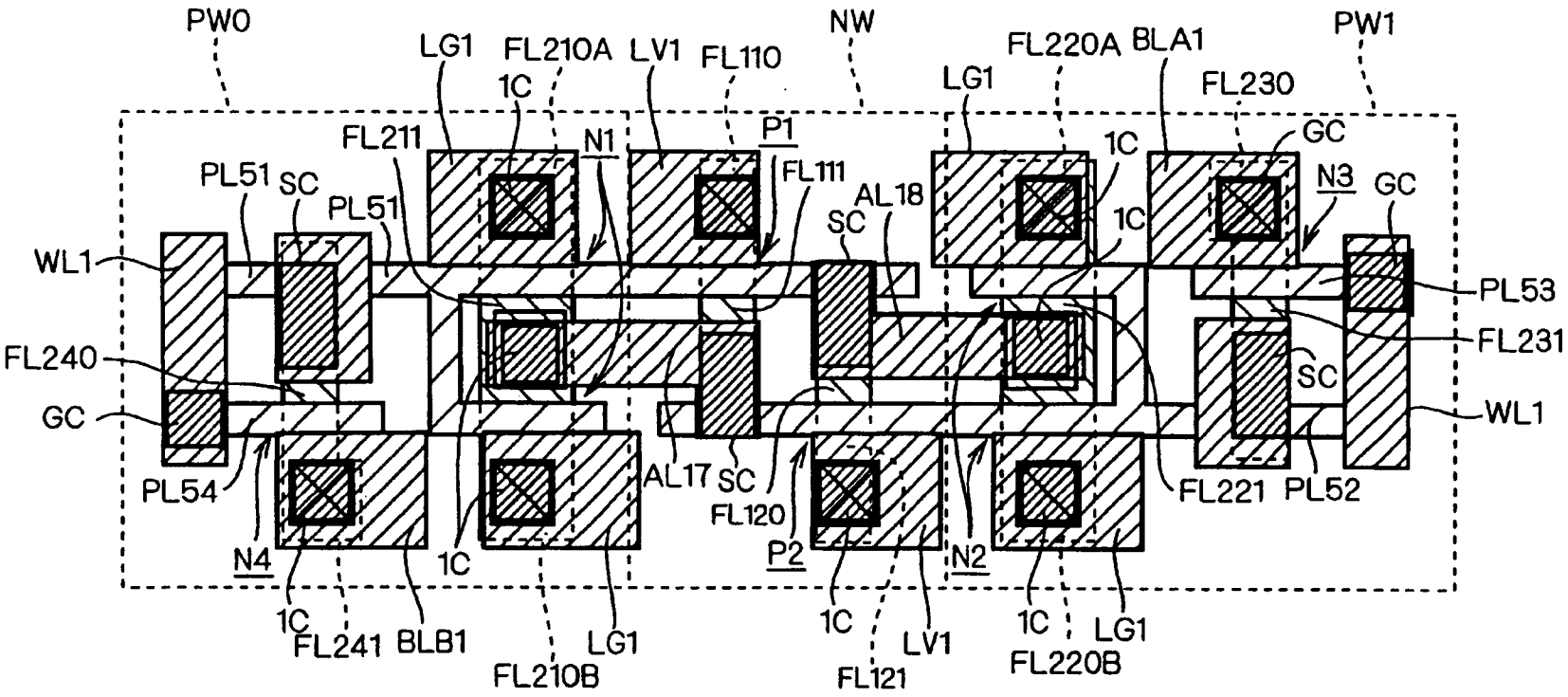
FIG. 33 is an explanatory diagram viewed from above mainly the layout configuration beneath a first aluminum wiring layer in FIG. 32.
Figure 34:
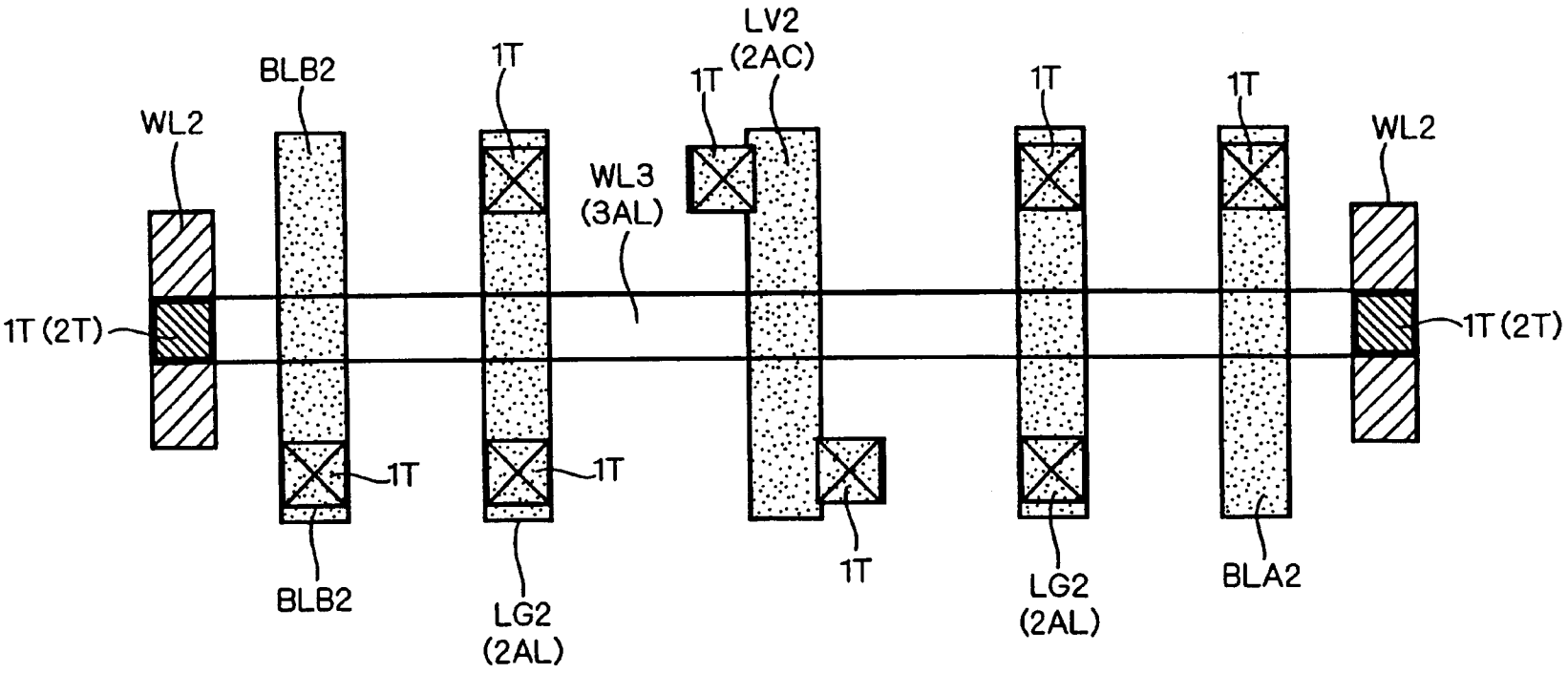
FIG. 34 is an explanatory diagram viewed from above mainly the layout configuration over a second aluminum wiring layer in FIG. 32.

FIGS. 32 to 34 are diagrams illustrating a memory cell structure of a SRAM according to an eleventh preferred embodiment of the invention. FIG. 32 is an explanatory diagram viewed from above the layout configuration in all layers. FIG. 33 is an explanatory diagram viewed from above mainly the layout configuration beneath a first aluminum wiring layer in FIG. 32. FIG. 34 is an explanatory diagram viewed from above the layout configuration over a second aluminum wiring layer in FIG. 32. Some reference numerals used in FIG. 33 or 34 are omitted in FIG. 32.

An equivalent circuit of the SRAM memory cell having the layout configuration of the eleventh preferred embodiment is similar to that of FIG. 4 in the first preferred embodiment.

Referring to FIGS. 32 to 34, description will proceed to the memory cell structure of the eleventh preferred embodiment.

In an N well region NW, a PMOS transistor P1 is made up of $P^+$ diffusion regions FL110, FL111 and a polysilicon wiring PL51, and a PMOS transistor P2 is made up of $P^+$ diffusion regions FL120, FL121 and a polysilicon wiring PL52.

In a P well region PW0, a NMOS transistor N1 is made up of $N^+$ diffusion regions FL210 (FL210A, FL210B), FL211 and the polysilicon wiring PL51, and a NMOS transistor N4 is made up of $N^+$ diffusion regions FL240, FL241 and a polysilicon wiring PL54. The polysilicon wiring PL51 extends from the N well region NW to the P well region PW0, so as to be used as a gate common to the NMOS transistor N1 and PMOS transistor P1.

In a P well region PW1, a NMOS transistor N2 is made up of $N^+$ diffusion regions FL220 (FL220A, FL220B), FL221 and the polysilicon wiring PL52, and a NMOS transistor N3 is made up of $N^+$ diffusion regions FL230, FL231 and a polysilicon wiring PL53. The polysilicon wiring PL52 extends from the N well region NW to the P well region PW1, so as to be used as a gate common to the NMOS transistor N2 and PMOS transistor P2. The foregoing diffusion regions are obtainable by implanting and diffusing impurity.

A ground wiring LG1 over the diffusion region FL210A and FL210B is electrically connected through a diffusion contact hole 1C to the diffusion region FL210A and FL210B, respectively. A bit line BLB1 over the diffusion region FL241 is electrically connected through a diffusion contact hole 1C to the diffusion region FL241.

An aluminum wiring AL17, which is a first layer aluminum wiring extending over the diffusion region FL211 and the diffusion region FL111, is electrically connected through a diffusion contact hole 1C to the diffusion region FL211.

The aluminum wiring AL17 is also electrically connected to the polysilicon wiring PL52. The polysilicon wiring PL52 is electrically connected through a shared contact SC to the diffusion regions FL111 and FL231, respectively.

The aluminum wiring AL17 can be electrically connected with low impedance. The aluminum wiring AL17, two shared contacts SC and polysilicon wiring PL52 correspond to a storage terminal Na.

The polysilicon wiring PL54 is electrically connected through a gate contact hole GC to a word line WL1.

A power supply wiring LV1 over the diffusion region FL110 is electrically connected through a diffusion contact hole 1C to the diffusion region FL110. A power supply wiring LV1 over the diffusion region FL121 is electrically connected through a diffusion contact hole 1C to the diffusion region FL121.

A ground wiring LG1 is electrically connected through a diffusion contact hole 1C to the diffusion region FL221. A bit line BLA1 over the diffusion region FL230 is electrically connected through a diffusion contact hole 1C to the diffusion region FL230.

An aluminum wiring AL18, which is a first layer aluminum wiring extending over the diffusion region FL220 and the diffusion region FL120, is electrically connected through a diffusion contact hole 1C to the diffusion region FL220.

The aluminum wiring AL18 is also electrically connected to the polysilicon wiring PL51. The polysilicon wiring PL51 is electrically connected through a shared contact SC to the diffusion regions FL120 and FL240, respectively.

The aluminum wiring AL18 can be electrically connected with low impedance. The aluminum wiring AL18, two shared contacts SC and polysilicon wiring PL51 correspond to a storage terminal Nb.

A word line WL1 over the polysilicon wiring PL53 is electrically connected through a gate contact hole GC to the polysilicon wiring PL53.

A word line WL1 is electrically connected through a via hole 1T to a word line WL2, and the word line WL2 is electrically connected through a via hole 2T to a word line WL3. The word line WL3 is disposed across the P well regions PW0, PW1 and the N well region NW.

A bit line BLA2 is electrically connected through a via hole 1T to a bit line BLA1. A bit line BLB2 is electrically connected through a via hole 1T to a bit line BLB1.

A power supply wiring LV2 is electrically connected through a via hole 1T to a power supply wiring LV1. A ground wiring LG1 is electrically connected through a via hole 1T to a ground wiring LG2.

The bit lines BLA2, BLB2, ground wiring LG2 and power supply wiring LV2 are disposed parallel with each other in the longitudinal direction viewing the drawing.

The bit lines BLA2 and ground wiring LG2 are disposed over the P well region PW1. The bit lines BLB2 and ground wiring LG2 are disposed over the P well region PW0. The power supply wiring LV2 is disposed over the N well region NW.

Thus, in the memory cell structure of the SRAM of the eleventh preferred embodiment, with the N well region NW interposed between the P well regions PW0 and PW1, the NMOS transistors N1 and N4 are disposed in the P well region PW0, and the NMOS transistors N2 and N3 are disposed in the P well region PW1. This enables to increase resistance to soft error, which is the first effect of the first preferred embodiment.

By separately forming the P well regions PW0 and PW1 in a direction vertical to the direction of formation of the bit lines BLA and BLB, it is able to maintain a good access time, which is the second effect of the first preferred embodiment.

Further, in the eleventh preferred embodiment, as in the first preferred embodiment, the NMOS transistors N1 and N2, and the NMOS transistors N3 and N4, are respectively arranged so as to be point symmetry with respect to the central part of the memory cell. It is therefore able to increase the degree of integration when a plurality of the memory cells of the eleventh preferred embodiment are disposed adjacent each other. This corresponds to the third effect of the first preferred embodiment.

The formation of the polysilicon wirings PL51 to PL54 in approximately the same direction (the lateral direction viewing the drawing) facilitates the control of the gate dimension. Further, because the polysilicon wirings PL51 and PL53, and the polysilicon wirings PL52 and PL54, are respectively disposed in a straight line, no waste region is present and a reduction in the circuit area increases the degree of integration. This corresponds to the fourth effect of the first preferred embodiment.

By separately forming a region serving as a drain in the NMOS transistors N1 to N4, resistance to soft error can be maintained at a high level. This corresponds to the fifth effect of the first preferred embodiment.

With the arrangement such that each of inverters I1 and I2 of a CMOS structure is made up of a combination of a NMOS transistor and a PMOS transistor, the memory cell can be realized by at least sufficient circuit configuration as a CMOS structure. This corresponds to the sixth effect of the first preferred embodiment.

In addition, with the arrangement that the storage terminal Na is made up of the aluminum wiring AL17, shared contacts SC and polysilicon wiring PL52, and the storage terminal Nb is made up of the aluminum wiring AL18, shared contacts SC and polysilicon wiring PL51, it is able to increase the degree of integration by the amount that the well forming width in the longitudinal direction viewing the drawing can be formed by a two-transistor pitch.

Twelfth Preferred Embodiment

Figure 35:
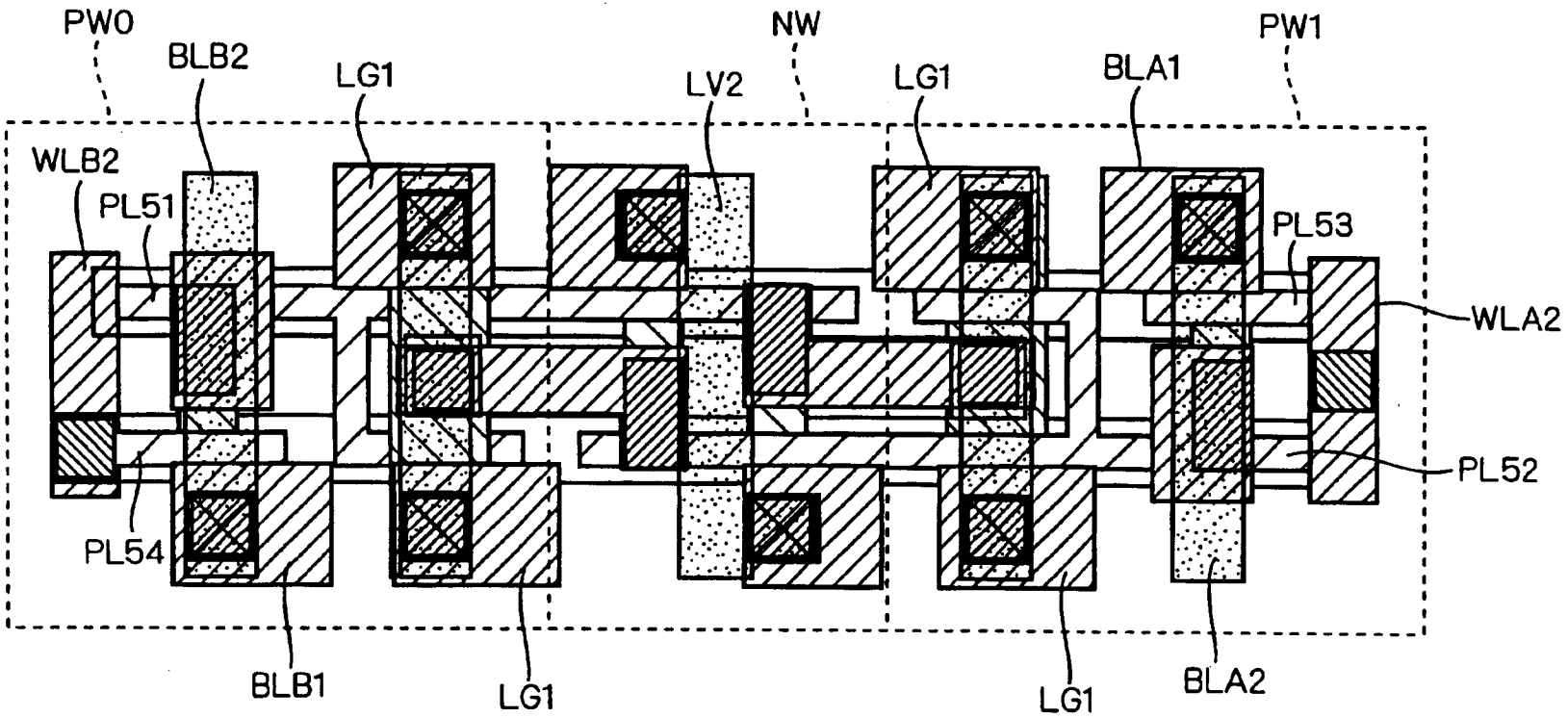
FIG. 35 is an explanatory diagram viewed from above the layout configuration in all layers of a SRAM memory cell according to a twelfth preferred embodiment of the invention.
Figure 36:
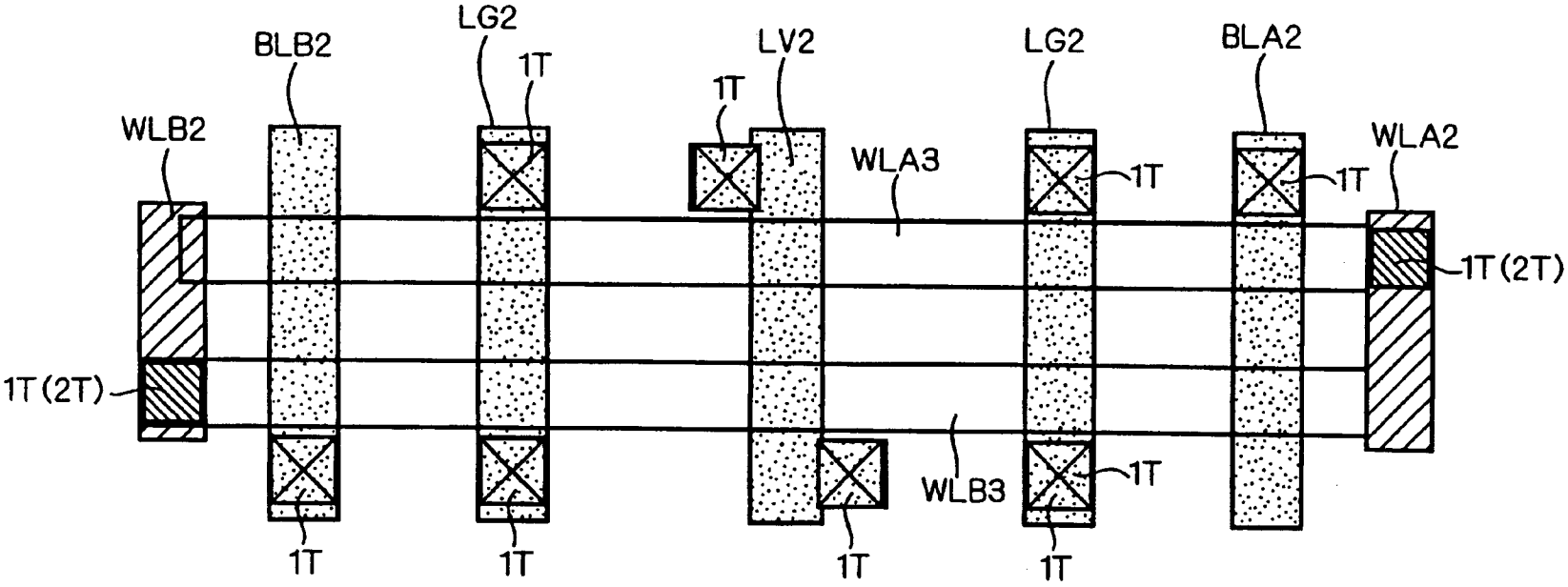
FIG. 36 is an explanatory diagram viewed from above mainly the layout configuration over a second aluminum wiring layer in FIG. 35.

FIGS. 35 and 36 are diagrams illustrating a memory cell structure of a SRAM according to a twelfth preferred embodiment of the invention. FIG. 35 is an explanatory diagram viewed from above the layout configuration in all layers. FIG. 36 is an explanatory diagram viewed from above mainly the layout configuration over a second aluminum wiring layer in FIG. 35. An explanatory diagram viewed from above the layout configuration beneath a first aluminum wiring layer in FIG. 35 is similar to that of FIG. 33 described in the eleventh preferred embodiment, except that the word line WL2 is divided into word lines WLA2 and WLB2. Some reference numerals used in FIG. 36 or 33 are omitted in FIG. 35. An equivalent circuit of the SRAM memory cell having the layout configuration of the twelfth preferred embodiment is similar to that of FIG. 15 in the fifth preferred embodiment.

Referring to FIGS. 35, 36 and 33, description will proceed to the memory cell structure of the twelfth preferred embodiment.

A polysilicon wiring PL53 is electrically connected through a gate contact hole GC to a word line WLA1 (corresponding to the word line WL1 at the right end in FIG. 33). The word line WLA1 is electrically connected through a via hole 1T to the word line WLA2. The word line WLA2 is electrically connected through a via hole 2T to a word line WLA3. The word line WLA of FIG. 15 is made up of these word lines WLA1 to WLA3.

Likewise, a polysilicon wiring PL54 is electrically connected through a gate contact hole GC to a word line WLB1 (corresponding to the word line WL1 at the left end in FIG. 33). The word line WLB1 is electrically connected through a via hole 1T to a word line WLB2. The word line WLB2 is electrically connected through a via hole 2T to a word line WLB3. The word line WLB of FIG. 15 is made up of these word lines WLB1 to WLB3.

The word lines WLA3 and WLB3 are disposed parallel with each other, across P well regions PW0, PW1 and an N well region NW. Otherwise, the layout configuration is similar to that of the eleventh preferred embodiment, and the description thereof is thus omitted.

The twelfth preferred embodiment having the foregoing memory cell structure produces the effects of the eleventh preferred embodiment, and also realizes a memory cell structure usable in FIFO memory, as in the fifth preferred embodiment.

Other Embodiments

If every conductivity type is reversed in the foregoing first to twelfth preferred embodiments, the same effects are obtainable. Further, these embodiments are applicable with the same effects to field effect transistors such as MIS transistors, without limiting to MOS transistors.

While the invention has been shown and described in detail, the foregoing description is in all aspects illustrative and not restrictive. It is therefore understood that numerous modifications and variations can be devised without departing from the scope of the invention.

What is claimed is:

[1. A semiconductor memory comprising:

a memory cell having first and second storage terminals storing information of logic levels complementary to each other;

a power supply wiring supplying a predetermined power supply voltage to said memory cell;

first and second pairs of bit lines each electrically connected to said first and second storage terminals of said memory cell, when selected; and first and second word lines connected to said memory cell, said first pair of bit lines connected to said memory cell and at least reading out data stored at said first and second storage terminals from said memory cell in response to a signal on said first word line, and said second pair of bit lines connected to said memory cell and at least reading out data stored at said first and second storage terminals from said memory cell in response to a signal on said second word line, wherein said first and second pairs of bit lines and said power supply wiring are provided in parallel to each other, with said power supply wiring interposed between said first and second pairs of bit lines.]

[2. The semiconductor memory according to claim 1, further comprising:

first and second ground wirings each supplying a predetermined ground potential to said memory cell, wherein said first pair of bit lines and said first ground wiring are provided in parallel to each other, with said first ground wiring interposed between said first pair of bit lines, and said second pair of bit lines and said second ground wiring are provided in parallel to each other, with said second ground wiring interposed between said second pair of bit lines.]

[3. The semiconductor memory according to claim 1, wherein said memory cell is formed on first and second P wells and an N well interposed between said first and second P wells in a first direction, and said power supply wiring extending along a second direction vertical to said first direction is formed on said N well.]

*4. A semiconductor device having a memory cell of a static random access memory, which includes first to eighth transistors, the device comprising:*

*a first pair of impurity regions of a first conductivity type functioning as two electrodes of the first transistor;*

*a second pair of impurity regions of the first conductivity type functioning as two electrodes of the second transistor;*

*a third pair of impurity regions of a second conductivity type functioning as two electrodes of the third transistor;*

*a fourth pair of impurity regions of the second conductivity type functioning as two electrodes of the fourth transistor;*

*a fifth pair of impurity regions of the second conductivity type functioning as two electrodes of the fifth transistor;*

*a sixth pair of impurity regions of the second conductivity type functioning as two electrodes of the sixth transistor;*

*a seventh pair of impurity regions of the second conductivity type functioning as two electrodes of the seventh transistor;*

*an eighth pair of impurity regions of the second conductivity type functioning as two electrodes of the eighth transistor;*

*a first conductive layer functioning as a gate electrode common to the first and third transistors;*

*a second conductive layer functioning as a gate electrode common to the second and sixth transistors;*

*a third conductive layer functioning as a gate electrode common to the fourth and fifth transistors;*

*a fourth conductive layer functioning as a gate electrode common to the seventh and eighth transistors;*

*a fifth conductive layer electrically connected to the second conductive layer, one of the first pair of impurity regions, one of the third pair of impurity regions, one of the fourth pair of impurity regions and one of the eighth pair of impurity regions, and configuring a first storage terminal of the memory cell;*

*a sixth conductive layer electrically connected to the first conductive layer, one of the second pair of impurity regions, one of the sixth pair of impurity regions, one of the seventh pair of impurity regions and one of the fifth pair of impurity regions, and configuring a second storage terminal of the memory cell;*

*a first word line electrically connected to the third conductive layer;*

*a second word line electrically connected to the fourth conductive layer;*

*a first bit line electrically connected to the other of the fourth pair of impurity regions;*

*a second bit line electrically connected to the other of the fifth pair of impurity regions;*

*a third bit line electrically connected to the other of the seventh pair of impurity regions; and*

*a fourth bit line electrically connected to the other of the eighth pair of impurity regions.*

*5. The semiconductor device according to claim 4, wherein*

*the ones of the third and fourth pairs of impurity regions are a common impurity region, and*

*the ones of the sixth and seventh pairs of impurity regions are a common region.*

*6. The semiconductor device according to claim 4, wherein*

*the one of the first pair of impurity regions is electrically connected to the fifth conductive layer via a first contact hole disposed between overlapped portions of the fifth conductive layer and the one of the first pair of impurity regions in a plane view,*

*the one of the third pair of impurity regions is electrically connected to the fifth conductive layer via a second contact hole disposed between overlapped portions of the fifth conductive layer and the one of the third pair of impurity regions in the plane view,*

*the one of the eighth pair of impurity regions is electrically connected to the fifth conductive layer via a third contact hole disposed between overlapped portions of the fifth conductive layer and the one of the eighth pair of impurity regions in the plane view,*

*the one of the second pair of impurity regions is electrically connected to the sixth conductive layer via a fourth contact hole disposed between overlapped portions of the sixth conductive layer and the one of the second pair of impurity regions in the plane view,*

*the one of the sixth pair of impurity regions is electrically connected to the sixth conductive layer via a fifth contact hole disposed between overlapped portions of the sixth conductive layer and the one of the sixth pair of impurity regions in the plane view, and*

*the one of the fifth pair of impurity regions is electrically connected to the sixth conductive layer via a sixth contact hole disposed between overlapped portions of the sixth conductive layer and the one of the fifth pair of impurity regions in the plane view.*

*7. The semiconductor device according to claim 6, wherein*

*the second conductive layer is electrically connected to the fifth conductive layer via a seventh contact hole disposed between overlapped portions of the second and fifth conductive layers in the plane view, and*

*the first conductive layer is electrically connected to the sixth conductive layer via an eighth contact hole disposed between overlapped portions of the first and sixth conductive layers in the plane view.*

*8. The semiconductor device according to claim 4, wherein*

*the one of the first pair of impurity regions and the second conductive layer are electrically connected to the fifth conductive layer via a first shared contact disposed between overlapped portions of the fifth conductive layer and the one of the first pair of impurity regions in a plane view,*

*the one of the third pair of impurity regions is an impurity region common to the one of the fourth pair of impurity regions, and is electrically connected to the fifth conductive layer via a first contact hole disposed between overlapped portions of the fifth conductive layer and the one of the third pair of impurity regions in the plane view,*

*the one of the eighth pair of impurity regions is electrically connected to the second conductive layer via a second shared contact,*

*the one of the second pair of impurity regions and the first conductive layer are electrically connected to the sixth conductive layer via a third shared contact disposed between overlapped portions of the sixth conductive layer and the one of the second pair of impurity regions in the plane view,*

*the one of the sixth pair of impurity regions is an impurity region common to the one of the seventh pair of impurity regions, and is electrically connected to the sixth conductive layer via a second contact hole disposed between overlapped portions of the sixth conductive layer and the one of the sixth pair of impurity regions in the plane view, and*

*the one of the fifth pair of impurity regions is electrically connected to the first conductive layer via a fourth shared contact.*

*9. The semiconductor device according to claim 4, wherein,*

*the one of the fifth pair of impurity regions is electrically connected to the sixth conductive layer via the first conductive layer, and*

*the one of the eighth pair of impurity regions is electrically connected to the fifth conductive layer via the second conductive layer.*

*10. The semiconductor device according to claim 4, wherein*

*the first conductive layer has a portion extending along a first direction,*

*the second conductive layer has a portion extending along the first direction,*

*the third conductive layer has a portion extending along the first direction and disposed opposite to the portion of the first conductive layer along a second direction in a plane view, and*

*the fourth conductive layer has a portion extending along the first direction and disposed opposite to the portion of the second conductive layer along the second direction in the plane view.*

*11. The semiconductor device according to claim 10, wherein*

*the first and second word lines each extend along the first direction, and*

*the first to fourth bit lines each extend along the second direction.*

*12. The semiconductor device according to claim 10, wherein*

*the one of the third pair of impurity regions, the one of the fourth pair of impurity regions and the one of the fifth pair of impurity regions are disposed between the first and third conductive layers in the plane view, and*

*the one of the sixth pair of impurity regions, the one of the seventh pair of impurity regions and the one of the eighth pair of impurity regions are disposed between the second and fourth conductive layers in the plane view.*

*13. The semiconductor device according to claim 12, wherein*

*the first and second word lines each extend along the first direction, and*

*the first to fourth bit lines each extend along the second direction.*

*14. The semiconductor device according to claim 4, wherein*

*the first conductive layer has first and second portions,*

*the second conductive layer has third and fourth portions with the third portion arranged to overlap with the first portion of the first conductive layer in a first direction,*

*the third conductive layer has a fifth portion arranged to overlap with the second portion of the first conductive layer in the first direction,*

*the fourth conductive layer has a sixth portion arranged to overlap with the fourth portion of the second conductive layer in the first direction, and*

*the first, second, third and fourth bit lines each extend along the first direction.*

*15. The semiconductor device according to claim 14, wherein*

*the first, second and sixth portions are arranged on a first straight line, and*

*the second, fourth and fifth portions are arranged on a second straight line parallel with the first straight line.*

* * * * *